(12) United States Patent
Yamazaki et al.

(10) Patent No.: US 9,236,402 B2
(45) Date of Patent: *Jan. 12, 2016

(54) VOLTAGE REGULATOR CIRCUIT

(71) Applicant: Semiconductor Energy Laboratory Co., Ltd., Atsugi-shi, Kanagawa-ken (JP)

(72) Inventors: Shunpei Yamazaki, Tokyo (JP); Jun Koyama, Kanagawa (JP); Kei Takahashi, Kanagawa (JP); Masashi Tsubuku, Kanagawa (JP); Kosei Noda, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/294,209

(22) Filed: Jun. 3, 2014

(65) Prior Publication Data

US 2014/0266115 A1 Sep. 18, 2014

Related U.S. Application Data

(63) Continuation of application No. 12/909,629, filed on Oct. 21, 2010, now Pat. No. 8,766,608.

(30) Foreign Application Priority Data

Oct. 30, 2009 (JP) .................................. 2009-250396
Jan. 22, 2010 (JP) .................................. 2010-012618

(51) Int. Cl.
*H01L 27/12* (2006.01)
*H02M 3/158* (2006.01)
(Continued)

(52) U.S. Cl.
CPC ........ *H01L 27/1225* (2013.01); *H01L 27/1255* (2013.01); *H01L 29/7869* (2013.01); *H02M 3/07* (2013.01); *H02M 3/158* (2013.01)

(58) Field of Classification Search
CPC .......................... H01L 27/1225; H02M 3/158
USPC ............................................. 323/282; 257/43
See application file for complete search history.

(56) References Cited

U.S. PATENT DOCUMENTS

| 3,790,935 A | 2/1974 | Luff |
| 5,731,856 A | 3/1998 | Kim et al. |

(Continued)

FOREIGN PATENT DOCUMENTS

| EP | 1737044 A | 12/2006 |
| EP | 2226847 A | 9/2010 |

(Continued)

OTHER PUBLICATIONS

International Search Report (Application No. PCT/JP2010/067809) Dated Jan. 18, 2011.

(Continued)

*Primary Examiner* — Emily P Pham
(74) *Attorney, Agent, or Firm* — Fish & Richardson P.C.

(57) ABSTRACT

A voltage regulator circuit includes a transistor and a capacitor. The transistor includes a gate, a source, and a drain, a first signal is inputted to one of the source and the drain, a second signal which is a clock signal is inputted to the gate, an oxide semiconductor layer is used for a channel formation layer, and an off-state current is less than or equal to 10 aA/μm. The capacitor includes a first electrode and a second electrode, the first electrode is electrically connected to the other of the source and the drain of the transistor, and a high power source voltage and a low power source voltage are alternately applied to the second electrode.

19 Claims, 28 Drawing Sheets

(51) Int. Cl.
*H01L 29/786* (2006.01)
*H02M 3/07* (2006.01)

(56) References Cited

U.S. PATENT DOCUMENTS

| | | |
|---|---|---|
| 5,744,864 A | 4/1998 | Cillessen et al. |
| 6,294,274 B1 | 9/2001 | Kawazoe et al. |
| 6,400,211 B1 | 6/2002 | Yokomizo et al. |
| 6,563,174 B2 | 5/2003 | Kawasaki et al. |
| 6,727,522 B1 | 4/2004 | Kawasaki et al. |
| 6,744,224 B2 | 6/2004 | Ishii |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,394,673 B2 | 7/2008 | Oyama et al. |
| 7,402,506 B2 | 7/2008 | Levy et al. |
| 7,411,209 B2 | 8/2008 | Endo et al. |
| 7,443,202 B2 | 10/2008 | Kimura et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 8,158,974 B2 | 4/2012 | Yano et al. |
| 8,238,152 B2 | 8/2012 | Asami et al. |
| 8,395,716 B2 | 3/2013 | Ishitani et al. |
| 8,441,425 B2 | 5/2013 | Ishitani et al. |
| 8,502,225 B2 | 8/2013 | Yamazaki et al. |
| 8,542,169 B2 | 9/2013 | Senda |
| 8,749,021 B2 | 6/2014 | Lin et al. |
| 8,779,419 B2 | 7/2014 | Yano et al. |
| 2001/0046027 A1 | 11/2001 | Tai et al. |
| 2002/0034082 A1 | 3/2002 | Yokomizo et al. |
| 2002/0056838 A1 | 5/2002 | Ogawa |
| 2002/0132454 A1 | 9/2002 | Ohtsu et al. |
| 2003/0001206 A1* | 1/2003 | Negoro et al. ............... 257/336 |
| 2003/0189401 A1 | 10/2003 | Kido et al. |
| 2003/0218222 A1 | 11/2003 | Wager et al. |
| 2004/0016947 A1* | 1/2004 | Choi ............................ 257/296 |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0211502 A1 | 9/2007 | Komiya |
| 2007/0241333 A1* | 10/2007 | Park et al. .................... 257/61 |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0157198 A1* | 7/2008 | Kim et al. .................... 257/339 |
| 2008/0166834 A1 | 7/2008 | Kim et al. |
| 2008/0174360 A1 | 7/2008 | Hsu |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0086511 A1 | 4/2009 | Lin |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0001259 A1 | 1/2010 | Saitho et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0140609 A1 | 6/2010 | Yano et al. |
| 2011/0037747 A1 | 2/2011 | Lee |
| 2011/0101351 A1 | 5/2011 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-171748 A | 6/2002 |
| JP | 2002-289859 A | 10/2002 |
| JP | 2003-086000 A | 3/2003 |
| JP | 2003-086808 A | 3/2003 |
| JP | 2003-235244 A | 8/2003 |
| JP | 2004-103957 A | 4/2004 |
| JP | 2004-273614 A | 9/2004 |
| JP | 2004-273732 A | 9/2004 |
| JP | 2006-165527 A | 6/2006 |
| JP | 2006-165528 A | 6/2006 |
| JP | 2006-165529 A | 6/2006 |
| JP | 2007-074797 A | 3/2007 |

(56) References Cited

FOREIGN PATENT DOCUMENTS

| | | |
|---|---|---|
| JP | 2007-173582 A | 7/2007 |
| JP | 2007-244051 A | 9/2007 |
| JP | 2008-148474 A | 6/2008 |
| JP | 2008/117739 | 10/2008 |
| JP | 2009-060702 A | 3/2009 |
| JP | 2009-177149 A | 8/2009 |
| JP | 2009-224479 A | 10/2009 |
| JP | 2009-252821 A | 10/2009 |
| JP | 2009-253204 A | 10/2009 |
| TW | 200843033 | 11/2008 |
| TW | 200915708 | 4/2009 |
| WO | WO-2004/114391 | 12/2004 |
| WO | WO-2007/148653 | 12/2007 |
| WO | WO-2008/117739 | 10/2008 |
| WO | WO-2009/028394 | 3/2009 |

OTHER PUBLICATIONS

Written Opinion (Application No. PCT/JP2010/067809) Dated Jan. 18, 2011.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Kimizuka.N. et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Kitzerow.H et al., "Observation of Blue Phases in Chiral Networks", Liquid Crystals, 1993, vol. 14, No. 3, pp. 911-916.
Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Chern,H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Kikuchi.H et al., "Polymer-Stabilized Liquid Crystal Blue Phases", Nature Materials, Sep. 2, 2002, vol. 1, pp. 64-68.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Nomura.K et al., "Thin-Film Transistor Fabricated in Single-Crystalline Transparent Oxide Semiconductor", Science, May 23, 2003, vol. 300, No. 5623, pp. 1269-1272.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.
Lee.H et al., "Current Status of, Challenges to, and Perspective View of AM-OLED", IDW '06 : Proceedings of the 13th International Display Workshops, Dec. 7, 2006, pp. 663-666.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZnO TFTs) for AMLCDS", Journal of the SID, 2007, vol. 15, No. 1, pp. 17-22.
Park.S et al., "Challenge to Future Displays: Transparent AM-OLED Driven by PEALD Grown ZnO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1673-1676.
Miyasaka.M, "SUFTLA Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits , 2008, vol. 43, No. 1, pp. 292-299.
Jeong.J et al., "3.1: Distinguished Paper: 12.1-Inch WXGA AMOLED Display Driven by Indium—Gallium—Zinc Oxide TFTs Array", SID Digest'08 : SID International Symposium Digest of Technical Papers, May 20, 2008, vol. 39, No. 1, pp. 1-4.
Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-in. AMOLED Display With Driver Circuit Using Amorphous In—Ga—Zn—Oxide TFTs", IDW '09 : Proceedings of the 16th International Display Workshops, 2009, pp. 689-692.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.
Lee.M et al., "15.4:Excellent Performance of Indium—Oxide-Based Thin-Film Transistors by DC Sputtering", SID International Symposium Digest of Technical Papers, May 31, 2009, pp. 191-193.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Compsites for Display Applications", SID Digest '09 : SID International Symposium Digest of Technical Papers, May 31, 2009, pp. 578-581.

(56) References Cited

OTHER PUBLICATIONS

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Ohara.H et al., "21.3:4.0 in. QVGA AMOLED Display Using In—Ga—Zn—Oxide TFTs With a Novel Passivation Layer", SID Digest '09 : SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09 : Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 56, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 96, pp. 045501-1-045501-4.

Park.J et al., "Improvements in the Device Characteristics of Amorphous Indium Gallium Zinc Oxide Thin-Film Transistors By Ar Plasma Treatment", Appl. Phys. Lett. (Applied Physical Letters) , Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N. et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Taiwanese Office Action (Application No. 099136419) Dated Dec. 10, 2014.

* cited by examiner

VOLTAGE REGULATOR CIRCUIT

CROSS-REFERENCE TO RELATED APPLICATIONS

This application is a continuation of U.S. application Ser. No. 12/909,629, filed Oct. 21, 2010, now allowed, which claims the benefit of a foreign priority applications filed in Japan as Serial No. 2009-250396 on Oct. 30, 2009, and Serial No. 2010-012618 on Jan. 22, 2010, all of which are incorporated by reference.

TECHNICAL FIELD

An embodiment of the present invention relates to a voltage regulator circuit including a transistor including an oxide semiconductor.

BACKGROUND ART

A technique for forming a thin film transistor (TFT) by using a thin semiconductor film formed over a substrate having an insulating surface has attracted attention. A thin film transistor is used for a display device typified by a liquid crystal television. A silicon-based semiconductor material is known as a material for a thin semiconductor film which can be applied to a thin film transistor. Other than a silicon-based semiconductor material, an oxide semiconductor has attracted attention.

As a material for the oxide semiconductor, zinc oxide and a material containing zinc oxide as its component are known. Further, a thin film transistor formed using an amorphous oxide (oxide semiconductor) having an electron carrier concentration of less than $10^{18}$ /cm$^3$ is disclosed (Patent Documents 1 to 3).

REFERENCE

Patent Document

[Patent Document 1] Japanese Published Patent Application No. 2006-165527
[Patent Document 2] Japanese Published Patent Application No. 2006-165528
[Patent Document 3] Japanese Published Patent Application No. 2006-165529

DISCLOSURE OF INVENTION

However, a difference from the stoichiometric composition in the oxide semiconductor arises in a thin film formation process. For example, electrical conductivity of the oxide semiconductor changes due to the excess or deficiency of oxygen. Further, hydrogen that enters the thin oxide semiconductor film during the formation of the thin oxide semiconductor film forms an oxygen (O)-hydrogen (H) bond and serves as an electron donor, which is a factor of changing electrical conductivity. Furthermore, since the O—H bond is a polar molecule, it serves as a factor of varying the characteristics of an active device such as a thin film transistor manufactured using an oxide semiconductor.

Even when having an electron carrier concentration of less than $10^{18}$ /cm$^3$, an oxide semiconductor is a substantially n-type oxide semiconductor. Therefore, the on-off ratio of the thin film transistors disclosed in Patent Documents 1 to 3 is only about $10^3$. Such a low on-off ratio of the thin film transistor is due to large off-state current.

In addition, when a voltage regulator circuit such as a step-up circuit is formed with the use of a transistor whose off-state current is large, leakage current flows through the transistor even when the transistor is off; thus, conversion efficiency to obtain a desired voltage could be lowered, for example.

In view of the above, it is an object of an embodiment of the present invention to provide a thin film transistor whose electric characteristics are stable (for example, a thin film transistor whose off-state current is significantly reduced). In addition, it is another object to improve conversion efficiency to obtain a desired voltage in a voltage regulator circuit.

According to an embodiment of the present invention, a voltage regulator circuit such as a step-up circuit or a step-down circuit is formed with the use of a transistor including an oxide semiconductor in a channel formation layer. The oxide semiconductor used in this embodiment has a lager energy gap than a silicon semiconductor and is an intrinsic or a substantially intrinsic semiconductor that is highly purified through removal of an impurity serving as an electron donor. With this structure, in the transistor, leakage current in an off state (off-state current) can be reduced. Further, with the reduction in off-state current of the transistor, conversion efficiency to obtain a desired voltage can be improved.

The concentration of hydrogen contained in the oxide semiconductor is less than or equal to $5\times10^{19}$ /cm$^3$, preferably, less than or equal to $5\times10^{18}$ /cm$^3$, more preferably, less than or equal to $5\times10^{17}$ /cm$^3$. In addition, hydrogen or an OH group contained in the oxide semiconductor is removed. Further, the carrier concentration is less than or equal to $5\times10^{14}$ /cm$^3$, preferably, less than or equal to $5\times10^{12}$ /cm$^3$.

The energy gap of the oxide semiconductor is set to greater than or equal to 2 eV, preferably, greater than or equal to 2.5 eV, more preferably, greater than or equal to 3 eV. Further, impurities (e.g., hydrogen) which form donors is reduce as much as possible, and the carrier concentration is set to less than or equal to $1\times10^{14}$ /cm$^3$, preferably, less than or equal to $1\times10^{12}$ /cm$^3$.

In a transistor including the above oxide semiconductor, an off-state current for a channel width of 1 μm can be very small compared to a conventional transistor including silicon; for example, the off-state current can be less than or equal to 10 aA/μm ($1\times10^{-17}$ A/μm), preferably, less than or equal to 1 aA/μm ($1\times10^{-18}$ A/μm), more preferably, less than or equal to 10 zA/μm ($1\times10^{-20}$ A/μm), still more preferably, less than or equal to 1 zA/μm ($1\times10^{-21}$ A/μm). Further, even when the temperature of the transistor is 85° C., the off-state current for a channel width of 1 μm can be very small compared to a conventional transistor including silicon; for example, the off-state current can be less than or equal to 100 zA/μm ($1\times10^{-19}$ A/μm), preferably, less than or equal to 10 zA/μm ($1\times10^{-20}$ A/μm).

With the use of a transistor including an oxide semiconductor layer which is highly purified by sufficiently reducing the hydrogen concentration in such a manner, a voltage regulator circuit can be achieved in which power consumption due to leakage current is low compared to the case where a conventional transistor including silicon is used.

An embodiment of the present invention is a voltage regulator circuit including a transistor and a capacitor. The transistor includes a gate, a source, and a drain, a first signal is inputted to one of the source and the drain, a second signal which is a clock signal is inputted to the gate, an oxide semiconductor layer is used for a channel formation layer, and an off-state current is less than or equal to 10 aA/μm. The capacitor includes a first electrode and a second electrode, the first electrode is electrically connected to the other of the source and the drain of the transistor, and a high power source voltage and a low power source voltage are alternately applied to the second electrode. A voltage of the first signal is stepped up or down to obtain a third signal, and the third signal which has a voltage obtained by stepping up or down the voltage of the first signal is outputted as an output signal through the other of the source and the drain of the transistor.

Another embodiment of the present invention is a voltage regulator circuit including n-step (n is a natural number of any one of 2 or more) unit step-up circuits, which are electrically connected in series to each other, and an output circuit for outputting a voltage which is stepped up by the n-step unit step-up circuits as an output signal. The n-step unit step-up circuits each include a first transistor including a gate, a source, and a drain, in which a first signal is inputted to one of the source and the drain; a first capacitor including a first electrode and a second electrode, in which the first electrode is electrically connected to the other of the source and the drain of the first transistor; a second transistor including a gate, a source, and a drain, in which the other of the source and the drain is electrically connected to the second electrode of the first capacitor; and a third transistor including a gate, a source, and a drain, in which one of the source and the drain is electrically connected to the second electrode of the first capacitor. The output circuit includes a fourth transistor including a gate, a source, and a drain, in which one of the source and the drain is electrically connected to the other of the source and the drain of the first transistor in the n-th step unit step-up circuit; and a second capacitor including a first electrode and a second electrode, in which the first electrode is electrically connected to the other of the source and the drain of the fourth transistor. Each of the first transistor to the fourth transistor is provided with an oxide semiconductor layer as a channel formation layer, where an off-state current is less than or equal to 10 aA/μm. The voltage regulator circuit further includes a first clock signal line for inputting a clock signal which is electrically connected to the gate of the first transistor and the gate of the third transistor in a (2K−1)-th step (K is 1 to n/2, and K is a natural number) unit step-up circuit and the gate of the second transistor in a 2K-th step unit step-up circuit; and a second clock signal line for inputting an inverted clock signal of the clock signal which is electrically connected to the gate of the third transistor in the (2K−1)-th step unit step-up circuit and the gate of the first transistor and the gate of the third transistor in the 2K-th step unit step-up circuit.

Another embodiment of the present invention is a voltage regulator circuit including n-step (n is a natural number of any one of 2 or more) unit step-down circuits, which are electrically connected in series to each other, and an output circuit for outputting a voltage which is stepped down by the n-step unit step-down circuits as an output signal. The n-step unit step-down circuits each include a first transistor including a gate, a source, and a drain, in which a first signal is inputted to one of the source and the drain; a first capacitor including a first electrode and a second electrode, in which the first electrode is electrically connected to the other of the source and the drain of the first transistor; a second transistor including a gate, a source, and a drain, in which the other of the source and the drain is electrically connected to the second electrode of the first capacitor; and a third transistor including a gate, a source, and a drain, in which one of the source and the drain is electrically connected to the second electrode of the first capacitor. The output circuit includes a fourth transistor including a gate, a source, and a drain, in which one of the source and the drain is electrically connected to the other of the source and the drain of the first transistor in the n-th step unit step-down circuit; and a second capacitor including a first electrode and a second electrode, in which the first electrode is electrically connected to the other of the source and the drain of the fourth transistor. Each of the first transistor to the fourth transistor is provided with an oxide semiconductor layer as a channel formation layer, where an off-state current is less than or equal to 10 aA/μm. The voltage regulator circuit further includes a first clock signal line for inputting a clock signal which is electrically connected to the gate of the first transistor and the gate of the second transistor in a (2K−1)-th step (K is 1 to n/2, and K is a natural number) unit step-down circuit and the gate of the second transistor in a 2K-th step unit step-down circuit; and a second clock signal line for inputting an inverted clock signal of the clock signal which is electrically connected to the gate of the third transistor in the (2K−1)-th step unit step-down circuit and the gate of the first transistor and the gate of the third transistor in the 2K-th step unit step-down circuit.

In accordance with an embodiment of the present invention, leakage current of a transistor can be reduced, and an unnecessary drop or rise in voltage of an output signal can be reduced, whereby conversion efficiency to obtain a desired voltage can be improved.

BEST MODE FOR CARRYING OUT THE INVENTION

Embodiments of the present invention will be described below with reference to accompanying drawings. Note that the invention is not limited to the following description, and it will be easily understood by those skilled in the art that various changes and modifications can be made without departing from the spirit and scope of the present invention. Thus, the present invention should not be interpreted as being limited to the following description of the embodiments.

Embodiment 1

In this embodiment, a voltage regulator circuit which is an embodiment of the present invention will be described.

Figure 1:
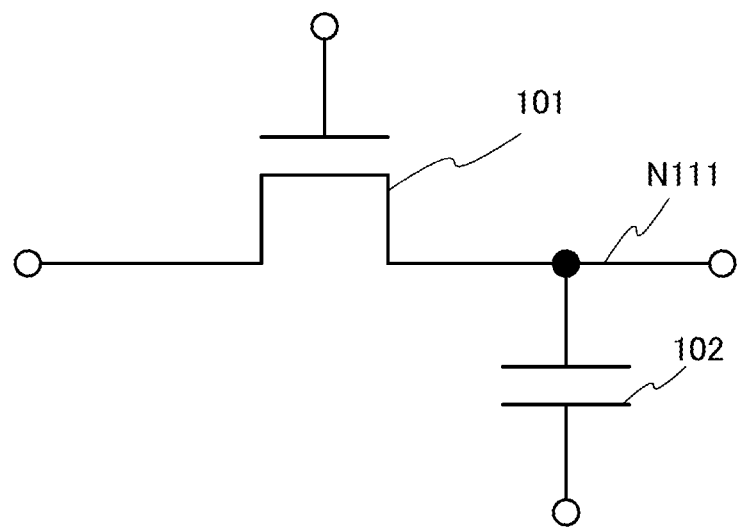
FIG. 1 is a circuit diagram illustrating an example of a configuration of a voltage regulator circuit.

An example of a configuration of a voltage regulator circuit described in this embodiment has a function of inputting a signal S1 and a signal S2 as input signals, stepping up or stepping down the voltage of the inputted signal S1, and thereby outputting as an output signal a signal S3 which has a voltage obtained by stepping up or stepping down the voltage of the signal S1. An example of the configuration of the voltage regulator circuit in this embodiment is further described with reference to FIG. 1. FIG. 1 is a circuit diagram illustrating an example of the configuration of the voltage regulator circuit of this embodiment.

The voltage regulator circuit illustrated in FIG. 1 includes a transistor 101 and a capacitor 102.

In this specification, for example, a field-effect transistor can be used as the transistor.

In this specification, a field-effect transistor has at least a gate, a source, and a drain. As the field-effect transistor, a thin film transistor (also referred to as a TFT) can be used, for example. Moreover, the field-effect transistor can have a top-gate structure or a bottom-gate structure, for example.

The source is the entire source electrode and source wiring or part thereof. A conductive layer having a function of both a source electrode and a source wiring is referred to as a source in some cases without distinction between a source electrode and a source wiring.

The drain is the entire drain electrode and drain wiring or part thereof. A conductive layer having a function of both a drain electrode and a drain wiring is referred to as a drain in some cases without distinction between a drain electrode and a drain wiring.

The gate is the entire gate electrode and gate wiring or part thereof. A conductive layer having a function of both a gate electrode and a gate wiring is referred to as a gate in some cases without distinction between a gate electrode and a gate wiring.

Further, in this specification, a source and a drain of a transistor may interchange depending on the structure, the operating condition, or the like of the transistor; therefore, it is difficult to define which is a source or a drain. Therefore, in this document (the specification, the claims, the drawings, or the like), one of them is referred to as one of the source and the drain, and the other is referred to as the other of the source and the drain.

In addition, the field-effect transistor in this specification is a transistor which includes an oxide semiconductor layer having a function as a channel formation layer. Note that the hydrogen concentration in the channel formation layer is less than or equal to $5\times10^{19}$ atoms/cm$^3$, preferably, less than or equal to $5\times10^{18}$ atoms/cm$^3$, more preferably, less than or equal to $5\times10^{17}$ atoms/cm$^3$. The hydrogen concentration is measured using secondary ion mass spectrometry (SIMS), for example. The carrier concentration of the transistor is less than or equal to $1\times10^{14}$ /cm$^3$, preferably, less than or equal to $1\times10^{12}$ /cm$^3$.

In this specification, as the capacitor, a capacitor which includes a first electrode, a second electrode, and a dielectric can be used, for example.

The signal S1 is inputted to one of a source and a drain of the transistor 101. The signal S2 is inputted to a gate of the transistor 101. The voltage of the other of the source and the drain of the transistor 101 is equal to the voltage of the signal S3. The voltage regulator circuit illustrated in FIG. 1 outputs the signal S3 through the other of the source and the drain of the transistor 101.

Note that in general, a voltage refers to a difference between potentials of two points (also referred to as a potential difference). However, both the level of voltage and the value of a potential are represented by volts (V) in a circuit diagram or the like in some cases; therefore, it is difficult to distinguish them. Therefore, in this specification, a potential difference between a potential at one point and a reference potential is sometimes used as a voltage at the point unless otherwise specified.

Note that as a signal in this specification, an analog signal or a digital signal which uses voltage or the like can be used, for example. Specifically, as a signal with voltage (also referred to as a voltage signal), it is preferable to use a signal having at least a first voltage state and a second voltage state. A digital signal which has a High-level voltage state as the first voltage state and a Low-level voltage state as the second voltage state can be used, for example. Note that a High-level voltage is also referred to as a voltage $V_H$ or simply as $V_H$ and a Low-level voltage is also referred to as a voltage $V_L$ or simply as $V_L$. In addition, the voltage in the first voltage state and the voltage in the second voltage state have variation in some cases, which depends on signals. Moreover, since there is an influence of noise or the like, the voltage in the first voltage state and the voltage in the second voltage state do not necessarily have a fixed level and may have a level within a predetermined range.

A first electrode of the capacitor 102 is electrically connected to the other of the source and the drain of the transistor 101, and a high power source voltage (also referred to as a voltage VDD or simply as VDD) or a low power source voltage (also referred to as a voltage VSS or simply as VSS) is applied to a second electrode of the capacitor 102. Note that a connection portion of the first electrode of the capacitor 102 and the other of the source and the drain of the transistor 101 is also referred to as a node N111.

The signal S1 serves as a first input signal (also referred to as a signal $IN_{VC1}$) of the voltage regulator circuit.

The signal S2 serves as a second input signal (also referred to as a signal $IN_{VC2}$) of the voltage regulator circuit. A clock signal can be used as the signal S2, for example. The clock signal is a signal in which the first voltage state and the second voltage state are periodically repeated. Levels of the first voltage state and the second voltage state of the clock signal can be set as appropriate.

The signal S3 serves as an output signal (also referred to as a signal $OUT_{VC}$) of the voltage regulator circuit.

Figure 2:
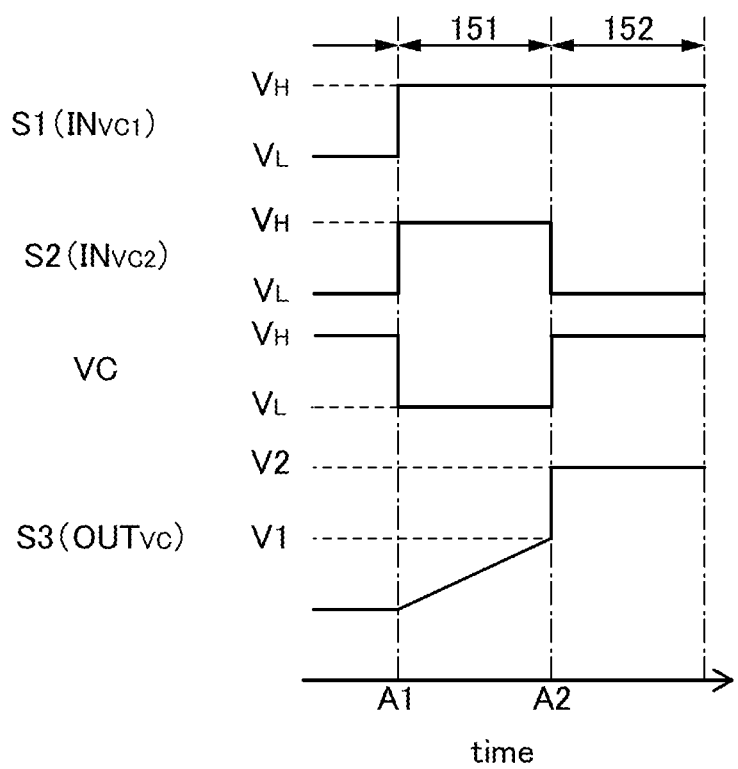
FIG. 2 is a timing chart for explaining an example of an operation of a voltage regulator circuit illustrated in FIG. 1.

Next, an example of an operation (also referred to as a driving method) of the voltage regulator circuit illustrated in FIG. 1 is described with reference to FIG. 2. FIG. 2 is a timing chart for explaining an example of the operation of the voltage regulator circuit illustrated in FIG. 1, and illustrates the waveforms of the voltages of the signal S1, the signal S2, the signal S3, and a voltage (also referred to as a voltage VC) of the second electrode of the capacitor 102. In the example of the operation of the voltage regulator circuit illustrated in FIG. 1, which is described with reference to FIG. 2, the signal S1 is a binary digital signal having High level and Low level, the transistor 101 is an n-channel transistor, and the signal S2 is a clock signal in which High level and Low level are periodically repeated.

The operation of the voltage regulator circuit illustrated in FIG. 1 can be described by being divided into a plurality of periods. The operation in each period is described below.

In a period 151, at a time A1, the signal S1 is set to High level, the signal S2 is set to High level, a low power source voltage is applied to the second electrode of the capacitor 102, and thus the voltage VC of the second electrode of the capacitor 102 becomes $V_L$.

At this time, the source and the drain of the transistor 101 are placed in a conduction state (also referred to an on state), so that the voltage at the node N111 begins to increase. The voltage at the node N111 is increased to V1. V1 is $V_H$. At this time, a voltage V1-$V_L$ is applied between the first electrode and the second electrode of the capacitor 102, and the voltage of the signal S3 becomes V1.

Next, in a period 152, at a time A2, the signal S1 is kept at High level, the signal S2 is set to Low level, and a high power source voltage is applied to the second electrode of the capacitor 102.

At this time, the transistor 101 is in a non-conduction state (also referred to as an off state). Since the voltage (voltage VC) applied to the second electrode of the capacitor 102 is changed from the voltage $V_L$ to the voltage $V_H$, also the voltage of the first electrode of the capacitor 102 begins to change, in accordance with the voltage of the second electrode of the capacitor 102. The voltage at the node N111 is increased to a level which is higher than the voltage V1, that is, V2. The voltage V2 is $2V_H$. At this time, a voltage V2-$V_H$ is applied between the first electrode and the second electrode of the capacitor 102, and the voltage of the signal S3 is V2. In this manner, in the period 152, the voltage of the signal S3 which is an output signal of the voltage regulator circuit corresponds to a level obtained by stepping up the voltage of the signal S1 that is inputted to the voltage regulator circuit.

As described above, in the voltage regulator circuit according to this embodiment, a voltage signal which is inputted is changed and a signal with a voltage that is higher or lower than that of the inputted voltage signal can be outputted.

In addition, in the voltage regulator circuit according to this embodiment, the transistor includes an oxide semiconductor layer serving as a channel formation layer. In the channel formation layer, the hydrogen concentration is less than or equal to $5\times10^{19}$ atoms/cm$^3$, preferably, less than or equal to $5\times10^{18}$ atoms/cm$^3$, more preferably, less than or equal to $5\times10^{17}$ atoms/cm$^3$, and the carrier concentration is less than or equal to $1\times10^{14}$ /cm$^3$, preferably, less than or equal to $1\times10^{12}$ /cm$^3$. With the use of the transistor, breakdown voltage of the voltage regulator circuit can be improved. Since leakage current is small in the transistor including the above oxide semiconductor layer, leakage of electric charge stored in a capacitor can be reduced compared to a conventional transistor; thus, power consumption can be reduced, an unnecessary drop or rise in voltage of an output signal can be reduced, and a desired voltage can be achieved more rapidly than before, whereby conversion efficiency to obtain a desired voltage can be improved.

In addition, in the voltage regulator circuit according to this embodiment, the capacitor and the transistor can be formed through the same steps, which can suppress an increase in the number of steps.

Embodiment 2

In this embodiment, a voltage regulator circuit which is an embodiment of the present invention will be described.

Figure 3:
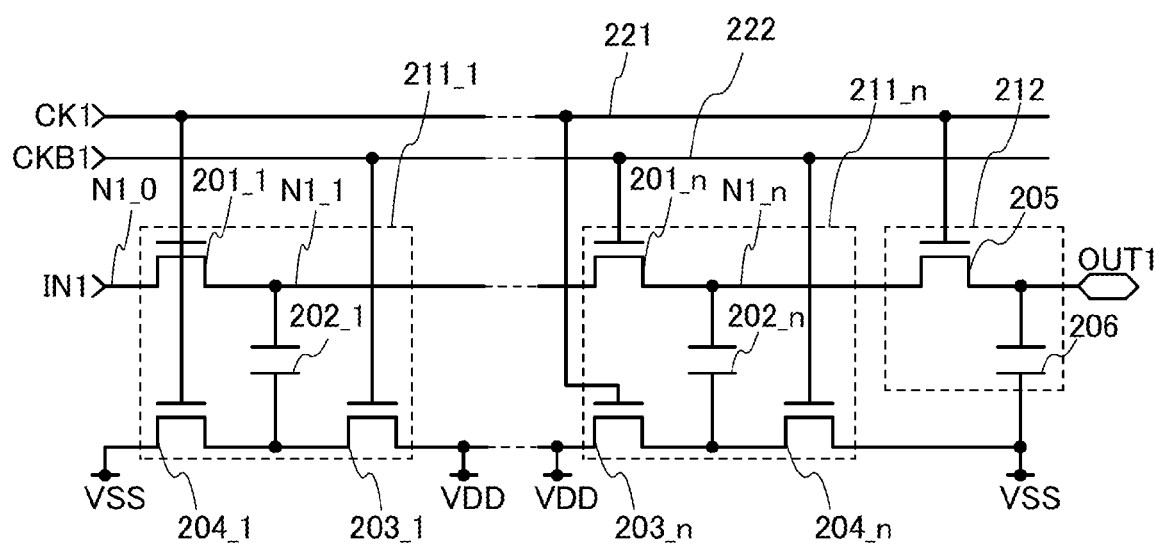
FIG. 3 is a circuit diagram illustrating an example of a configuration of a voltage regulator circuit.

An example of a circuit configuration of the voltage regulator circuit in this embodiment will be described with reference to FIG. 3. FIG. 3 is a circuit diagram illustrating an example of the circuit configuration of the voltage regulator circuit in this embodiment.

A voltage regulator circuit illustrated in FIG. 3 can be regarded as a configuration including unit step-up circuits 211_1 to 211_n (n is a natural number of any one of 2 or more) which are n-step unit step-up circuits and an output circuit 212. The configuration of each circuit is described below. Note that although the case where n is an even number is shown as an example in FIG. 3, n may be an odd number without limitation thereto.

The n-step unit step-up circuits illustrated in FIG. 3 are formed using n unit step-up circuits, that is, the unit step-up circuits 211_1 to 211_n, and a M-th step (M is a natural number of any one of 2 to n) unit step-up circuit 211_M is electrically connected to a (M−1)-th step unit step-up circuit 211_M−1.

Each of the unit step-up circuits 211_1 to 211_n, that is, a k-th step (k is a natural number of any one of 2 to n) unit step-up circuit 211_k includes a transistor 201_k, a capacitor 202_k, a transistor 203_k, and a transistor 204_k.

One of a source and a drain of a transistor 201_M in the M-th step unit step-up circuit 211_M is electrically connected to the other of a source and a drain of a transistor 201_M−1 in the (M−1)-th step unit step-up circuit 211_M−1. Note that a connection portion of one of the source and the drain of the transistor 201_M in the M-th step unit step-up circuit 211_M and the other of the source and the drain of the transistor 201_M−1 in the (M−1)-th step unit step-up circuit 211_M−1 is also referred to as a node N1_M−1, and one of a source and a drain of a transistor 201_1 in the first step unit step-up circuit 211_1 is also referred to as a node N1_0.

A first electrode of the capacitor 202_k is electrically connected to the other of a source and a drain of the transistor 201_k.

A high power source voltage is applied to one of a source and a drain of the transistor 203_k, and the other of the source and the drain of the transistor 203_k is electrically connected to a second electrode of the capacitor 202_k.

One of a source and a drain of the transistor 204_k is electrically connected to the second electrode of the capacitor 202_k, and a low power source voltage is applied to the other of the source and the drain of the transistor 204_k.

Further, in a (2K−1)-th step (K is any one of 1 to n/2, and K is a natural number) unit step-up circuit 211_2K−1, a gate of a transistor 201_2K−1 is electrically connected to a clock signal line 221, a gate of a transistor 203_2K−1 is electrically connected to a clock signal line 222, and a gate of a transistor 204_2K−1 is electrically connected to the clock signal line 221.

Moreover, in a 2K-th step unit step-up circuit 211_2K, a gate of a transistor 201_2K is electrically connected to the clock signal line 222, a gate of a transistor 203_2K is electrically connected to the clock signal line 221, and a gate of a transistor 204_2K is electrically connected to the clock signal line 222.

A clock signal CK1 is inputted to the clock signal line 221, and a clock signal CKB1 is inputted to the clock signal line 222.

Further, in the first step unit step-up circuit 211_1, a signal IN1 is inputted to one of the source and the drain of the transistor 201_1.

The output circuit 212 is electrically connected to the n-th step unit step-up circuit 211_n.

Further, one of a source and a drain of a transistor 205 is electrically connected to the other of a source and a drain of a transistor 201_n in the n-th step unit step-up circuit 211_n. Moreover, the voltage of the other of the source and the drain of the transistor 205 becomes the voltage of a signal OUT1 which is an output signal of the voltage regulator circuit.

Furthermore, in the case where n is an odd number, the clock signal CKB1 is inputted to a gate of the transistor 205, and in the case where n is an even number, the clock signal CK1 is inputted to the gate of the transistor 205.

In a capacitor 206, a first electrode is electrically connected to the other of the source and the drain of the transistor 205, and low power source voltage is applied to a second electrode. In addition, the capacitance of the capacitor 206 is preferably made larger than the capacitance of the capacitor 202_k in the other unit step-up circuit 211_k. Accordingly, the voltage state of the output signal of the voltage regulator circuit, that is, the signal OUT1 can be made more stable.

As each of the transistors 201_k, 203_k, 204_k, and 205, a transistor including an oxide semiconductor layer serving as a channel formation layer can be used. Note that the hydrogen concentration in the channel formation layer is less than or equal to $5 \times 10^{19}$ atoms/cm$^3$, preferably, less than or equal to $5 \times 10^{18}$ atoms/cm$^3$, more preferably, less than or equal to $5 \times 10^{17}$ atoms/cm$^3$. The hydrogen concentration is measured using secondary ion mass spectrometry (SIMS), for example. In addition, the carrier concentration of each of the transistors 201_k, 203_k, 204_k, and 205 is less than or equal to $1 \times 10^{14}$ /cm$^3$, preferably, less than or equal to $1 \times 10^{12}$ /cm$^3$.

A timing at which a voltage state changes in the clock signal CK1 is different from that in the clock signal CKB1. For example, when the clock signal CK1 is set to High level, the clock signal CKB1 is preferably set to Low level; and when the clock signal CKB1 is set to High level, the clock signal CK1 is preferably set to Low level. As the clock signal CKB1, for example, a signal obtained by inversion of the clock signal CK1 can be used. The clock signal CKB1 can be generated by inversion of the voltage state of the clock signal CK1 with a NOT circuit such as an inverter, for example. In the clock signal CK1 and the clock signal CKB1, levels of a voltage such as High level and Low level can be determined as appropriate. In addition, the clock signal CK1 can be generated with the use of a buffer circuit and an oscillator circuit such as a ring oscillator, for example. In addition, although, in the voltage regulator circuit in FIG. 3, only the clock signal CK1 and the clock signal CKB1 are used, without limitation thereto, the voltage regulator circuit in this embodiment can use a clock signal having three or more phases.

As described above, an example of the voltage regulator circuit in this embodiment includes n-step unit step-up circuits and an output circuit which is electrically connected to an n-th step unit step-up circuit. Each of the unit step-up circuits includes a capacitor and a plurality of transistors which each function as a switching element. The plurality of transistors are each selectively turned on or off, whereby a voltage of a signal inputted to the voltage regulator circuit is stepped up, and the voltage which is stepped up is outputted by the output circuit as an output signal of the voltage regulator circuit. In the example of the voltage regulator circuit in this embodiment, as a transistor, a transistor including a highly purified oxide semiconductor layer serving as a channel formation layer is used. Thus, the voltage of each node can be held for a longer time, it takes a shorter time to obtain a desired voltage, and voltage conversion efficiency can be improved.

Next, one example of the operation of the voltage regulator circuit illustrated in FIG. 3 is described. Note that in the example of the operation of the voltage regulator circuit illustrated in FIG. 3, which is described here, the signal IN1 is a binary digital signal having High level and Low level, the transistors 201_k, 203_k, 204_k, and 205 are each an n-channel transistor, and the clock signal CK1 and the clock signal CKB1 are each a clock signal in which High level and Low level are periodically repeated.

The operation of the voltage regulator circuit illustrated in FIG. 3 can be described by being divided into a plurality of periods. The operation in each period is described below.

First, in a first period, the clock signal CK1 is set to High level, and the clock signal CKB1 is set to Low level.

At this time, in the (2K−1)-th step unit step-up circuit 211_2K−1, the transistor 201_2K−1 and the transistor 204_2K−1 are turned on, and the transistor 203_2K−1 is turned off. When the transistor 201_2K−1 is turned on, a node N1_2K−1 and a node N1_2K−2 have the same voltage. At this time, the voltage of the node N1_2K−1 is set to V_2K−1. In addition, when the transistor 204_2K−1 is turned on, a low power source voltage is applied to a second electrode of a capacitor 202_2K−1. Moreover, a voltage of (V_2K−1)−VSS is applied to the capacitor 202_2K−1.

Next, in a second period, the clock signal CK1 is set to Low level, and the clock signal CKB1 is set to High level.

At this time, in the (2K−1)-th step unit step-up circuit 211_2K−1, the transistor 201_2K−1 and the transistor 204_2K−1 are turned off, and the transistor 203_2K−1 is turned on. Accordingly, the voltage of the second electrode of the capacitor 202_2K−1 rises to $V_H$; therefore, a voltage of a first electrode of the capacitor 202_2K−1 begins to rise in accordance with the voltage rise of the second electrode of the capacitor 202_2K−1. In addition, in the 2K-th step unit step-up circuit 211_2K in the second period, the transistor 201_2K and the transistor 204_2K are turned on, and the transistor 203_2K is turned off. When the transistor 201_2K is turned on, a node N1_2K and the node N1_2K−1 have the same voltage. At this time, the voltage of the node N1_2K is set to V_2K. In addition, when the transistor 204_2K is turned on, a low power source voltage is applied to a second electrode of a capacitor 202_2K. Moreover, a voltage of V_2K-VSS is applied to the capacitor 202_2K. In this manner, in the second period, the voltage of the node N1_2K-1 is voltage obtained by stepping up the voltage of the node N1_2K-1 in the first period.

Next, in a third period, in a manner similar to that of the first period, the clock signal CK1 is set to High level, and the clock signal CKB1 is set to Low level.

At this time, in the 2K-th step unit step-up circuit 211_2K, the transistor 201_2K and the transistor 204_2K are turned off, and the transistor 203_2K is turned on. Accordingly, the voltage of the second electrode of the capacitor 202_2K rises to $V_H$; therefore, a voltage of a first electrode of the capacitor 202_2K begins to rise in accordance with the voltage rise of the second electrode of the capacitor 202_2K. In addition, in the (2K-1)-th step unit step-up circuit 211_2K-1 in the third period, the transistor 201_2K-1 and the transistor 204_2K-1 are turned on, and the transistor 203_2K-1 is turned off. When the transistor 201_2K-1 is turned on, the node N1_2K-1 and the node N1_2K-2 have the same voltage. In addition, when the transistor 204_2K-1 is turned on, the low power source voltage is applied to the second electrode of the capacitor 202_2K-1. Moreover, a voltage of (V_2K-1)-VSS is applied to the capacitor 202_2K-1. In this manner, in the third period, the voltage of the node N1_2K is voltage obtained by stepping up the voltage of the node N1_2K in the second period.

A step-up operation is performed also in the following operations by repeating the operations of the first period to the third period described above. At this time, the transistor 205 is turned on and the voltage of the first electrode of the capacitor 206 begins to rise in the second period in the case where n is an odd number, and in the first and third periods in the case where n is an even number. A voltage applied between the first electrode and the second electrode of the capacitor 206 can be obtained by $((Ca1 \times Va1)+(Cb1 \times Vb1))/(Ca1+Cb1)$ with the following assumption: the capacitance of a capacitor 202_n in the n-th step unit step-up circuit 211_n is Ca1; the capacitance of the capacitor 206 is Cb1; the voltage of a node N1_n when the transistor 205 is turned off is Va1; the voltage of the signal OUT1 when the transistor 205 is turned off is Vb1; and current consumption due to the load in the case where a load is electrically connected to the capacitor 206 is as small as to be able to be ignored. Accordingly, in the voltage regulator circuit illustrated in FIG. 3, the voltage of the signal IN1 is stepped up, and the signal OUT1 having the stepped up voltage of a voltage $V_{IN1}$ is outputted as an output signal.

As described above, in an example of the voltage regulator circuit in this embodiment, when step-up operation is performed in each unit step-up circuit, a signal whose voltage is higher than the voltage of an inputted signal can be outputted as an output signal.

Further, in an example of the voltage regulator circuit in this embodiment, a transistor including a highly purified oxide semiconductor layer as a channel formation layer is applied to the transistors of the n-step unit step-up circuits and the output circuit. Thus, the leakage current of the transistor in the voltage regulator circuit can be reduced, an unnecessary drop or rise in voltage of the output signal can be reduced, it takes a shorter time to obtain a desired voltage by step-up operation, and conversion efficiency to obtain a desired voltage can be improved.

Note that this embodiment can be combined as appropriate with any of the other embodiments.

Embodiment 3

In this embodiment, a step-down circuit will be described as another example of a voltage regulator circuit which is an embodiment of the present invention.

Figure 4:
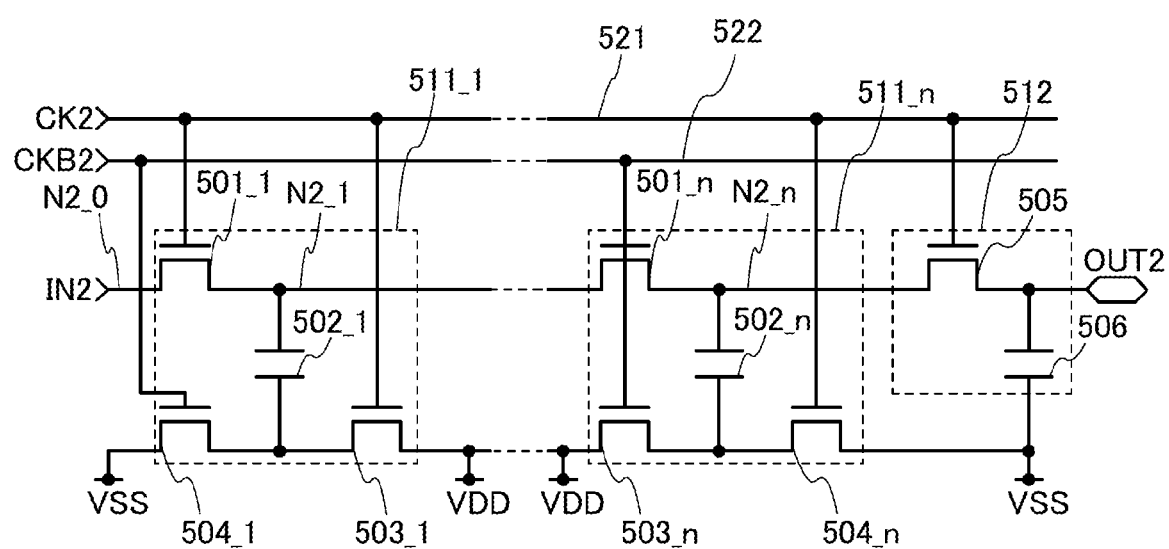
FIG. 4 is a circuit diagram illustrating an example of a configuration of a voltage regulator circuit.

An example of a circuit configuration of the voltage regulator circuit in this embodiment will be described with reference to FIG. 4. FIG. 4 is a circuit diagram illustrating an example of the circuit configuration of the voltage regulator circuit in this embodiment.

A voltage regulator circuit illustrated in FIG. 4 includes unit step-down circuits 511_1 to 511_n (n is a natural number of any one of 2 or more) which are n-step unit step-down circuits and an output circuit 512. Note that although the case where n is an even number is shown as an example in FIG. 4, n may be an odd number without limitation thereto.

The n-step unit step-down circuits in FIG. 4 are formed using n unit step-down circuits, that is, the unit step-down circuits 511_1 to 511_n, and a m-th step (m is a natural number of any one of 2 to n) unit step-down circuit 511_m is electrically connected to a (m-1)-th step unit step-down circuit 511_m-1.

Each of the unit step-down circuits 511_1 to 511_n, that is, a m-th step unit step-down circuit 511_m includes a transistor 501_m, a capacitor 502_m, a transistor 503_m, and a transistor 504_m.

One of a source and a drain of a transistor 501_m in the m-th step unit step-down circuit 511_m is electrically connected to the other of a source and a drain of a transistor 501_m-1 in the (m-1)-th step unit step-down circuit 511_m-1. A connection portion of one of the source and the drain of the transistor 501_m in the m-th step unit step-down circuit 511_m and the other of the source and the drain of the transistor 501_m-1 in the (m-1)-th step unit step-down circuit 511_m-1 is also referred to as a node N2_m-1, and one of a source and a drain of a transistor 501_1 in the first step unit step-down circuit 511_1 is also referred to as a node N2_0.

A first electrode of the capacitor 502_m is electrically connected to the other of a source and a drain of the transistor 501_m.

A high power source voltage is applied to one of a source and a drain of the transistor 503_m, and the other of the source and the drain of the transistor 503_m is electrically connected to a second electrode of the capacitor 502_m.

One of a source and a drain of the transistor 504_m is electrically connected to the second electrode of the capacitor 502_m, and a low power source voltage is applied to the other of the source and the drain of the transistor 504_m.

Further, in a (2K-1)-th step unit step-down circuit 511_2K-1, a clock signal CK2 is inputted to a gate of a transistor 501_2K-1, the clock signal CK2 is inputted to a gate of a transistor 503_2K-1, and a clock signal CKB2 is inputted to a gate of a transistor 504_2K-1

Moreover, in a 2K-th step unit step-down circuit 511_2K, a gate of a transistor 501_2K is electrically connected to a clock signal line 522, a gate of a transistor 503_2K is electrically connected to the clock signal line 522, and a gate of a transistor 504_2K is electrically connected to a clock signal line 521.

The clock signal CK2 is inputted to the clock signal line 521, and the clock signal CKB2 is inputted to the clock signal line 522.

Further, in the first step unit step-down circuit 511_1, a signal IN2 is inputted to one of the source and the drain of the transistor 501_1.

The output circuit 512 is electrically connected to the n-th step unit step-down circuit 511_n.

Further, one of a source and a drain of a transistor 505 is electrically connected to the other of a source and a drain of a transistor 501_n in the n-th step unit step-down circuit 511_n. Moreover, the voltage of the other of the source and the drain of the transistor 505 becomes the voltage of a signal OUT2 which is an output signal of the voltage regulator circuit.

Furthermore, in the case where n is an odd number, the clock signal CKB2 is inputted to a gate of the transistor 505, and in the case where n is an even number, the clock signal CK2 is inputted to the gate of the transistor 505.

In a capacitor 506, a first electrode is electrically connected to the other of the source and the drain of the transistor 505, and low power source voltage is applied to a second electrode. In addition, the capacitance of the capacitor 506 is preferably made larger than the capacitance of the capacitor 502_m in the other unit step-down circuit 511_m. Accordingly, the voltage state of the output signal of the voltage regulator circuit, that is, the signal OUT2 can be made more stable.

As each of the transistors 501_m, 503_m, 504_m, and 505, a transistor including an oxide semiconductor layer serving as a channel formation layer can be used. Note that the hydrogen concentration in the channel formation layer is less than or equal to $5\times10^{19}$ atoms/cm$^3$, preferably, less than or equal to $5\times10^{18}$ atoms/cm$^3$, more preferably, less than or equal to $5\times10^{17}$ atoms/cm$^3$. The hydrogen concentration is measured using secondary ion mass spectrometry (SIMS), for example. In addition, the carrier concentration of each of the transistors 501_m, 503_m, 504_m, and 505 is less than or equal to $1\times10^{14}$ /cm$^3$, preferably, less than or equal to $1\times10^{12}$ /cm$^3$.

A timing at which a voltage state changes in the clock signal CK2 is different from that in the clock signal CKB2. For example, when the clock signal CK2 is set to High level, the clock signal CKB2 is preferably set to Low level; and when the clock signal CKB2 is set to High level, the clock signal CK2 is preferably set to Low level. As the clock signal CKB2, for example, a signal obtained by inversion of the clock signal CK2 can be used. The clock signal CKB2 can be generated by inversion of the voltage state of the clock signal CK2 with a NOT circuit such as an inverter, for example. In the clock signal CK2 and the clock signal CKB2, levels of a voltage such as High level and Low level can be determined as appropriate. In addition, the clock signal CK2 can be generated with the use of a buffer circuit and an oscillator circuit such as a ring oscillator, for example. In addition, although in the voltage regulator circuit in FIG. 4, only the clock signal CK2 and the clock signal CKB2 are used, without limitation thereto, the voltage regulator circuit in this embodiment can use a clock signal having three or more phases.

As described above, an example of the voltage regulator circuit in this embodiment includes n-step unit step-down circuits and an output circuit which is electrically connected to an n-th step unit step-down circuit. Each of the unit step-down circuits includes a capacitor and a plurality of transistors which each function as a switching element. The plurality of transistors are selectively turned on or off, whereby a voltage of the signal inputted to the voltage regulator circuit is stepped down, and the voltage which is stepped down is outputted by the output circuit as an output signal of the voltage regulator circuit. In the example of the voltage regulator circuit in this embodiment, as a transistor, a transistor including a highly purified oxide semiconductor layer serving as a channel formation layer is used. Thus, the voltage of each node can be held for a longer time, it takes a shorter time to obtain a desired voltage, and voltage conversion efficiency can be improved.

Next, one example of the operation of the voltage regulator circuit in FIG. 4 is described. Note that in the example of the operation of the voltage regulator circuit illustrated in FIG. 4, which is described here, the signal IN2 is a binary digital signal having High level and Low level, the transistors 501_m, 503_m, 504_m, and 505 are each an n-channel transistor, and the clock signal CK2 and the clock signal CKB2 are each a clock signal in which High level and Low level are periodically repeated.

The operation of the voltage regulator circuit illustrated in FIG. 4 can be described by being divided into a plurality of periods. The operation in each period is described below. First, in a first period, the clock signal CK2 is set to High level, and the clock signal CKB2 is set to Low level.

At this time, in the (2K-1)-th step unit step-down circuit 511_2K-1, the transistor 501_2K-1 and the transistor 503_2K-1 are turned on, and the transistor 504_2K-1 is turned off. When the transistor 501_2K-1 is turned on, a node N2_2K-1 and a node N2_2K-2 have the same voltage. At this time, the voltage of the node N2_2K-1 is set to V_2K-1. In addition, when the transistor 503_2K-1 is turned on, a high power source voltage is applied to a second electrode of a capacitor 502_2K-1. Moreover, a voltage of (V_2K-1)-VDD is applied to the capacitor 502_2K-1.

Next, in a second period, the clock signal CK2 is set to Low level, and the clock signal CKB2 is set to High level.

At this time, in the (2K-1)-th step unit step-down circuit 511_2K-1, the transistor 501_2K-1 and the transistor 503_2K-1 are turned off, and the transistor 504_2K-1 is turned on. Accordingly, the voltage of the second electrode of the capacitor 502_2K-1 drops to $V_L$; therefore, a voltage of a first electrode of the capacitor 502_2K-1 begins to drop in accordance with the voltage drop of the second electrode of the capacitor 502_2K-1. In addition, in the 2K-th step unit step-down circuit 511_2K in the second period, the transistor 501_2K and the transistor 503_2K are turned on. When the transistor 501_2K is turned on, a node N2_2K and the node N2_2K-1 have the same voltage. At this time, the voltage of the node N2_2K is set to V_2K. In addition, when the transistor 503_2K is turned on, a high power source voltage is applied to a second electrode of a capacitor 502_2K. Moreover, a voltage of V_2K-VDD is applied to the capacitor 502_2K. In this manner, in the second period, the voltage of the node N2_2K-1 is voltage obtained by stepping down the voltage of the node N2_2K-1 in the first period.

Next, in a third period, the clock signal CK2 is set to High level, and the clock signal CKB2 is set to Low level.

At this time, in the 2K-th step unit step-down circuit 511_2K, the transistor 501_2K and the transistor 503_2K are turned off, and the transistor 504_2K is turned on. Accordingly, the voltage of the second electrode of the capacitor 502_2K drops to $V_L$; therefore, a voltage of a first electrode of the capacitor 502_2K begins to drop in accordance with the voltage drop of the second electrode of the capacitor 502_2K. In addition, in the (2K-1)-th step unit step-down circuit 511_2K-1 in the third period, the transistor 501_2K-1 and the transistor 503_2K-1 are turned on, and the transistor 504_2K-1 is turned off. When the transistor 501_2K-1 is turned on, the node N2_2K-1 and the node N2_2K have the same voltage. In addition, when the transistor 503_2K-1 is turned on, a high power source voltage is applied to the second electrode of the capacitor 502_2K-1. Moreover, a voltage of (V_2K-1)-VDD is applied to the capacitor 502_2K-1. In this manner, in the third period, the voltage of the node N2_2K is voltage obtained by stepping down the voltage of the node N2_2K in the second period.

A step-down operation is performed also in the following operations by repeating the operations of the first period to the third period described above. At this time, the transistor 505 is turned on and the voltage of the first electrode of the capacitor 506 begins to drop in the second period in the case where n is an odd number, and in the first and third periods in the case where n is an even number. A voltage applied between the first electrode and the second electrode of the capacitor 506 can be obtained by ((Ca2×Va2)+(Cb2×Vb2))/(Ca2+Cb2) with the following assumption: the capacitance of a capacitor 502_n in the n-th step unit step-down circuit 511_n is Ca2; the capacitance of the capacitor 506 is Cb2; the voltage of a node N2_n when the transistor 505 is turned off is Va2; the voltage of the signal OUT2 when the transistor 505 is turned off is Vb2; and current consumption due to the load in the case where a load is electrically connected to the capacitor 506 is as small as to be able to be ignored. Accordingly, in the voltage regulator circuit illustrated in FIG. 4, the voltage of the signal IN2 is stepped down, and the signal OUT2 having the stepped up voltage of a voltage $V_{IN2}$ is outputted as an output signal As described above, in an example of the voltage regulator circuit in this embodiment, when step-down operation is performed in each unit step-up circuit, a signal whose voltage is lower than the voltage of an inputted signal can be outputted as an output signal.

Further, in an example of the voltage regulator circuit in this embodiment, a transistor including a highly purified oxide semiconductor layer as a channel formation layer is applied to the transistors of the n-step unit step-down circuits and the output circuit. Thus, the leakage current of the transistor in the voltage regulator circuit can be reduced, an unnecessary drop or rise in voltage of the output signal can be reduced, it takes a shorter time to obtain a desired voltage by step-down operation, and conversion efficiency to obtain a desired voltage can be improved.

Note that this embodiment can be combined as appropriate with any of the other embodiments.

Embodiment 4

In this embodiment, an example of a thin film transistor which can be used as a transistor included in the voltage regulator circuit disclosed in this specification will be described.

In this embodiment, an embodiment of a transistor and a manufacturing method of the transistor will be described with reference to FIGS. 5A and 5B and FIGS. 6A to 6E.

Figure 5A:
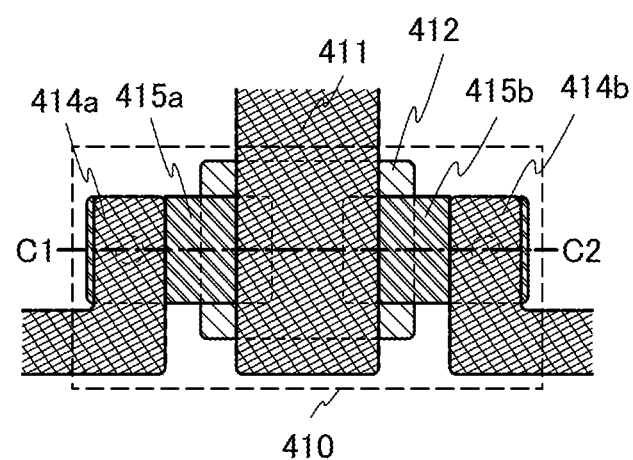
FIGS. 5A and 5B are a top view and a cross-sectional view illustrating a transistor.
Figure 5B:
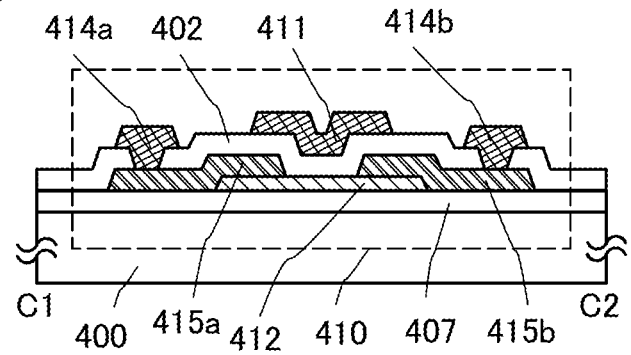

FIGS. 5A and 5B illustrate an example of a planar structure and an example of a cross-sectional structure of a transistor. A transistor 410 illustrated in FIGS. 5A and 5B is one of top gate thin film transistors.

FIG. 5A is a plan view of the transistor 410 having a top-gate structure and FIG. 5B is a cross-sectional view taken along C1-C2 in FIG. 5A.

The transistor 410 includes, over a substrate 400 having an insulating surface, an insulating layer 407, an oxide semiconductor layer 412, a source or drain electrode layer 415a, a source or drain electrode layer 415b, a gate insulating layer 402, and a gate electrode layer 411. A wiring layer 414a and a wiring layer 414b are provided so as to be in contact with and electrically connected to the source or drain electrode layer 415a and the source or drain electrode layer 415b, respectively.

Although the transistor 410 is a single-gate transistor, a multi-gate transistor including a plurality of channel formation regions may be formed as the transistor of this embodiment.

A manufacturing process of the transistor 410 over the substrate 400 having an insulating surface is described below with reference to FIGS. 6A to 6E.

Although there is no particular limitation on a substrate which can be used for the substrate 400 having an insulating surface, it is necessary that the substrate have at least enough heat resistance to heat treatment in a subsequent step. For example, as the substrate 400, a glass substrate of barium borosilicate glass, aluminoborosilicate glass, or the like can be used.

As the glass substrate, a substrate having a strain point of 730° C. or higher may be used when the temperature of heat treatment in a subsequent step is high. As a material of the glass substrate, a glass material such as aluminosilicate glass, aluminoborosilicate glass, or barium borosilicate glass can be used, for example. Note that by containing a larger amount of barium oxide (BaO) than boron oxide ($B_2O_3$), a glass substrate is heat-resistant and of more practical use. Therefore, a glass substrate containing a larger amount of BaO than $B_2O_3$ is preferably used.

Note that a substrate formed using an insulator, such as a ceramic substrate, a quartz substrate, or a sapphire substrate, may be used as the substrate 400 instead of the glass substrate. Crystallized glass or the like may be used as well. Alternatively, a plastic substrate or the like can be used as appropriate. Further alternatively, as the substrate, a semiconductor substrate of silicon or the like can be used.

First, the insulating layer 407 which serves as a base film is formed over the substrate 400 having an insulating surface. As the insulating layer 407 in contact with the oxide semiconductor layer 412, an oxide insulating layer such as a silicon oxide layer, a silicon oxynitride layer (also referred to as $SiO_xN_y$, where x>y>0), an aluminum oxide layer, or an aluminum oxynitride layer is preferably used. Although a plasma CVD method, a sputtering method, or the like can be employed as a method for forming the insulating layer 407, the insulating layer 407 is preferably formed with a sputtering method so that hydrogen is contained in the insulating layer 407 as little as possible.

In this embodiment, a silicon oxide layer is formed as the insulating layer 407 with a sputtering method. The substrate 400 is transferred to a treatment chamber and a high-purity sputtering gas from which hydrogen and moisture are removed and which contains oxygen is introduced, and a silicon oxide layer is formed as the insulating layer 407 over the substrate 400 with the use of a silicon semiconductor target. The substrate 400 may be at room temperature or may be heated.

For example, a silicon oxide film is formed with an RF sputtering method, in which quartz (preferably, synthetic quartz) is used, the substrate temperature is 108° C., the distance between the target and the substrate (T-S distance) is 60 mm, the pressure is 0.4 Pa, the high-frequency power source is 1.5 kW, and an oxygen and argon atmosphere (the flow ratio of oxygen to argon is 1:1 (each flow rate is 25 sccm)) is used. The film thickness thereof is 100 nm. Note that instead of quartz (preferably, synthetic quartz), a silicon target can be used as the target for forming the silicon oxide film. As the sputtering gas, oxygen or a mixed gas of oxygen and argon is used.

In that case, it is preferable that the insulating layer 407 be formed while moisture remaining in the treatment chamber is removed. This is for preventing hydrogen, a hydroxyl group, or moisture from being contained in the insulating layer 407.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In a film formation chamber which is evacuated with the cryopump, for example, a hydrogen atom, a compound containing a hydrogen atom, such as water ($H_2O$), or the like is removed, whereby the concentration of an impurity contained in the insulating layer 407 formed in the film formation chamber can be reduced.

It is preferable to use a high-purity gas from which an impurity such as hydrogen, water, a hydroxyl group, or hydride is removed to a concentration of several ppm or a concentration of several ppb, as a sputtering gas when the insulating layer 407 is formed.

Examples of the sputtering method include an RF sputtering method in which a high-frequency power source is used as a sputtering power source, a DC sputtering method using a DC power source, and a pulsed DC sputtering method in which a bias is applied in a pulsed manner. An RF sputtering method is mainly used in the case where an insulating film is formed, and a DC sputtering method is mainly used in the case where a metal film is formed.

Moreover, there is a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside a chamber and used for a magnetron sputtering method, and a sputtering apparatus used for an ECR sputtering method in which plasma generated with the use of microwaves is used without using glow discharge.

Furthermore, as a film formation method using a sputtering method, there are also a reactive sputtering method in which a target substance and a sputtering gas component are chemically reacted with each other during film formation to form a thin compound film thereof, and a bias sputtering method in which a voltage is also applied to a substrate during film formation.

Further, the insulating layer 407 may have a stacked structure in which for example, a nitride insulating layer such as a silicon nitride layer, a silicon nitride oxide layer (also referred also referred to as $SiN_xO_y$, where x>y>0), an aluminum nitride layer, or an aluminum nitride oxide layer and the oxide insulating layer are stacked in this order from the substrate 400 side.

For example, a high-purity sputtering gas from which hydrogen and moisture are removed and which contains nitrogen is introduced and a silicon target is used, whereby a silicon nitride layer is formed between a silicon oxide layer and a substrate. Also in this case, the silicon nitride layer is preferably formed removing moisture remaining in a treatment chamber, similarly to the silicon oxide layer.

The substrate may be heated also at the time of the film formation of the silicon nitride layer.

In the case where the silicon nitride layer and the silicon oxide layer are stacked as the insulating layer 407, the silicon nitride layer and the silicon oxide layer can be formed in the same treatment chamber using a common silicon target. First, a sputtering gas containing nitrogen is introduced and a silicon nitride layer is formed using a silicon target placed inside the treatment chamber, and then the sputtering gas is switched to a sputtering gas containing oxygen and a silicon oxide layer is formed using the same silicon target. Since the silicon nitride layer and the silicon oxide layer can be formed in succession without exposure to the air, an impurity such as hydrogen or moisture can be prevented from being adsorbed on a surface of the silicon nitride layer. [0134]

Next, an oxide semiconductor film having a thickness of 2 nm to 200 nm inclusive is formed over the insulating layer 407.

In order for the oxide semiconductor film not to contain an impurity such as hydrogen, a hydroxyl group, or moisture as much as possible, it is preferable to preheat the substrate 400 provided with the insulating layer 407 in a preheating chamber of the sputtering apparatus before the film formation so that an impurity such as hydrogen or moisture adsorbed on the substrate 400 is eliminated, and perform exhaustion. As an exhaustion unit provided in the preheating chamber, a cryopump is preferable. This preheating step is not necessarily performed. Further, this preheating may be similarly performed on the substrate 400 over which the gate insulating layer 402 which is formed in a later step has not been formed or the substrate 400 over which layers up to the source or drain electrode layer 415a and the source or drain electrode layer 415b which are formed in a later step have been formed.

Note that before the oxide semiconductor film is formed with a sputtering method, dust on a surface of the insulating layer 407 is preferably removed by reverse sputtering in which an argon gas is introduced and plasma is generated. The reverse sputtering refers to a method in which, without application of voltage to a target side, a high-frequency power source is used for application of voltage to a substrate side under an argon atmosphere to generate plasma in the vicinity of the substrate so that a surface is modified. Note that instead of an argon atmosphere, a nitrogen atmosphere, a helium atmosphere, an oxygen atmosphere, or the like may be used.

The oxide semiconductor film is formed with a sputtering method. As the oxide semiconductor film, any of the following oxide semiconductor films can be applied: an In—Ga—Zn—O-based oxide semiconductor film; an In—Sn—Zn—O-based oxide semiconductor film; an In—Al—Zn—O-based oxide semiconductor film; a Sn—Ga—Zn—O-based oxide semiconductor film; an Al—Ga—Zn—O-based oxide semiconductor film; an Sn—Al—Zn—O-based oxide semiconductor film; an In—Zn—O-based oxide semiconductor film; a Sn—Zn—O-based oxide semiconductor film; an Al—Zn—O-based oxide semiconductor film; an In—O-based oxide semiconductor film; an In—Sn—O-based oxide semiconductor film; a Sn—O-based oxide semiconductor film; and a Zn—O-based oxide semiconductor film. In this embodiment, the oxide semiconductor film is formed with a sputtering method with the use of an In—Ga—Zn—O based metal oxide target. Then, the oxide semiconductor film can be formed with a sputtering method under a rare gas (typically, argon) atmosphere, an oxygen atmosphere, or an atmosphere of a rare gas (typically, argon) and oxygen. In the case where a sputtering method is employed, a film may be formed with a target including $SiO_2$ at 2 wt % to 10 wt % inclusive.

It is preferable to use a high-purity gas from which an impurity such as hydrogen, water, a hydroxyl group, or hydride is removed to a concentration of several ppm or a concentration of several ppb, as a sputtering gas when the oxide semiconductor film is formed.

As a target for forming the oxide semiconductor film with a sputtering method, a metal oxide target containing zinc oxide as its main component can be used. As another example of the metal oxide target, for example, a metal oxide target with a composition ratio of $In_2O_3:Ga_2O_3:ZnO=1:1:1$ (molar ratio) can be used. Without limitation to the above target, for example, a metal oxide target with a composition ratio of $In_2O_3:Ga_2O_3:ZnO=1:1:2$ (molar ratio) may be used. The proportion of the volume of a portion except for an area occupied by a space and the like with respect to the total volume of the metal oxide target to be manufactured (also referred to as the fill rate of the metal oxide target) is 90% to 100% inclusive, preferably, 95% to 99.9% inclusive. With the use of a metal oxide target with high filling factor, the formed oxide semiconductor film has high density.

The substrate is held in a treatment chamber kept under reduced pressure, a sputtering gas from which hydrogen and moisture are removed is introduced into the treatment chamber from which remaining moisture is being removed, and the oxide semiconductor film is formed over the substrate 400 with the use of a metal oxide as a target. In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the film formation chamber which is evacuated with the cryopump, for example, a hydrogen atom, a compound containing a hydrogen atom, such as water ($H_2O$), (more preferably, also a compound containing a carbon atom), and the like are removed, whereby the concentration of an impurity in the oxide semiconductor film formed in the film formation chamber can be reduced. The substrate may be heated when the oxide semiconductor film is formed.

As an example of film formation conditions, the following conditions are employed: the substrate temperature is room temperature; the distance between the substrate and the target is 60 mm, the pressure is 0.4 Pa, the direct current (DC) power source is 0.5 kW, and an atmosphere of oxygen and argon (the flow rate of oxygen to argon is 15 sccm:30 sccm=1:2) is used. It is preferable that a pulsed direct-current (DC) power source be used because powder substances (also referred to as particles or dust) generated in film formation can be reduced and the film thickness can be uniform. The oxide semiconductor film preferably has a thickness of 5 nm to 30 nm inclusive. Note that there is a difference in an appropriate thickness, which depends on an oxide semiconductor material, and the thickness may be set as appropriate in a manner which depends on the material.

Figure 6A:
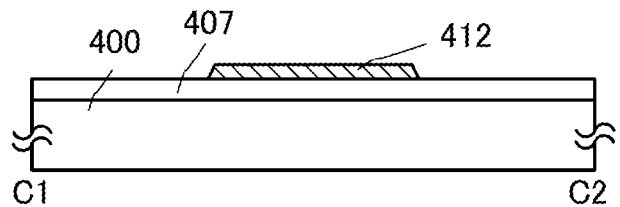
FIGS. 6A to 6E are cross-sectional views illustrating a method for manufacturing a transistor.
Figure 6B:
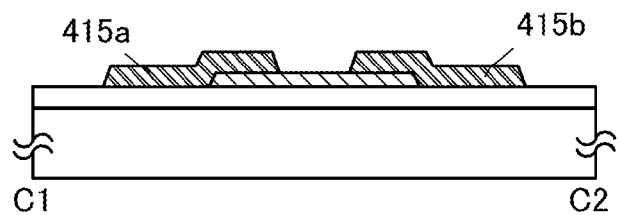

Next, the oxide semiconductor film is processed into the island-shaped oxide semiconductor layer 412 through a first photolithography step (see FIG. 6A). Further, a resist mask for forming the island-shaped oxide semiconductor layer 412 may be formed with an ink-jet method. A photomask is not used when the resist mask is formed with an ink-jet method, which results in reducing manufacturing costs.

For the etching of the oxide semiconductor film, wet etching, dry etching, or both of them may be employed.

As the etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the film into a desired shape, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a mixed solution of phosphoric acid, acetic acid, and nitric acid, or the like can be used. In addition, ITO07N (produced by Kanto Chemical Co., Inc.) may also be used.

Furthermore, the etchant after the wet etching is removed together with the etched material by cleaning. The waste liquid of the etchant including the material etched off may be purified and the material may be reused. When a material such as indium included in the oxide semiconductor layer is collected from the waste liquid after the etching and reused, the resources can be efficiently used and the cost can be reduced.

The etching conditions (such as an etchant, etching time, and temperature), which depend on the material, are adjusted as appropriate so that the material can be etched into a desired shape.

In this embodiment, the oxide semiconductor film is processed into the island-shaped oxide semiconductor layer 412 with a wet etching method with a mixed solution of phosphoric acid, acetic acid, and nitric acid as an etchant.

In this embodiment, the oxide semiconductor layer 412 is subjected to first heat treatment. The temperature of the first heat treatment is higher than or equal to 400° C. and lower than or equal to 750° C., preferably, higher than or equal to 400° C. and lower than the strain point of the substrate. Here, the substrate is introduced in an electric furnace which is a kind of heat treatment apparatus and heat treatment is performed on the oxide semiconductor layer under a nitrogen atmosphere at 450° C. for one hour, and then water and hydrogen are prevented from entering the oxide semiconductor layer. In this manner, the oxide semiconductor layer in which hydrogen concentration is reduced is obtained. Through the first heat treatment, dehydration or dehydrogenation of the oxide semiconductor layer 412 can be performed.

Note that the heat treatment apparatus is not limited to an electric furnace, and may have a device for heating an object to be processed by heat conduction or heat radiation from a heater such as a resistance heater. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus with which heat treatment is performed using a high-temperature gas. As the gas, an inert gas which does not react with an object to be processed by heat treatment, like nitrogen or a rare gas such as argon is used.

For example, as the first heat treatment, GRTA may be performed as follows. The substrate is transferred and put in an inert gas which has been heated to a high temperature of 650° C. to 700° C., heated for several minutes, and transferred and taken out of the inert gas which has been heated to a high temperature. GRTA enables a high-temperature heat treatment for a short time.

Note that in the first heat treatment, it is preferable that water, hydrogen, and the like be not contained in nitrogen or a rare gas such as helium, neon, or argon. For example, the purity of nitrogen or a rare gas such as helium, neon, or argon, which is introduced into the heat treatment apparatus, is preferably 6N (99.9999%) or more, more preferably, 7N (99.99999%) or more (i.e., impurity concentration is preferably 1 ppm or lower, more preferably, 0.1 ppm or lower).

The oxide semiconductor layer 412 becomes a microcrystalline layer or a polycrystalline layer by crystallization in some cases in a manner which depends on a condition of the first heat treatment or a material of the oxide semiconductor film. For example, the oxide semiconductor layer may be crystallized to become microcrystalline semiconductor layer having a degree of crystallization of 90% or more, or 80% or more. Further, in accordance with conditions of the first heat treatment or a material of the oxide semiconductor layer, the oxide semiconductor layer may be an amorphous oxide semiconductor layer which does not contain crystalline components. The oxide semiconductor layer may become an oxide semiconductor layer in which a microcrystalline portion (with a grain diameter of 1 nm to 20 nm inclusive, typically 2 nm to 4 nm inclusive) is mixed into an amorphous oxide semiconductor.

In addition, the first heat treatment can also be performed on the oxide semiconductor film before being processed into the island-shaped oxide semiconductor layer. In that case, the substrate is taken out from the heat apparatus after the first heat treatment, and then a photolithography step is performed.

The heat treatment having an effect of dehydration or dehydrogenation with respect to the oxide semiconductor layer may be performed at any of the following timings: after the oxide semiconductor layer is formed; after a source electrode and a drain electrode are formed over the oxide semiconductor layer; and after a gate insulating layer is formed over the source electrode and the drain electrode.

Next, a conductive film is formed over the insulating layer 407 and the oxide semiconductor layer 412. For example, the conductive film may be formed with a sputtering method or a vacuum evaporation method. As a material of the conductive film, there are an element selected from Al, Cr, Cu, Ta, Ti, Mo, and W, an alloy including any of the above elements as its component, an alloy film including a combination of any of the above elements, and the like. Alternatively, one or more materials selected from manganese, magnesium, zirconium, beryllium, and yttrium may be used. The conductive film may have a single-layer structure or a stacked structure of two or more layers. For example, a single-layer structure of an aluminum film including silicon, a two-layer structure in which a titanium film is stacked over an aluminum film, a three-layer structure in which a titanium film, an aluminum film, and a titanium film are stacked in this order, and the like can be given. Alternatively, a film of one or a plurality of elements selected from titanium (Ti), tantalum (Ta), tungsten (W), molybdenum (Mo), chromium (Cr), neodymium (Nd), and scandium (Sc) combined with Al, an alloy film containing a plurality of the above elements, or a nitride film thereof may be used.

A resist mask is formed over the conductive film through a second photolithography step. The conductive film is selectively etched, so that the source or drain electrode layer 415a and the source or drain electrode layer 415b are formed. Then, the resist mask is removed (see FIG. 6B). It is preferable that an end portion of the formed source electrode layer and drain electrode layer be tapered because coverage with the gate insulating layer stacked thereover is improved.

In this embodiment, as the source or drain electrode layer 415a and the source or drain electrode layer 415b, a titanium film having a thickness of 150 nm is formed with a sputtering method.

Note that materials and etching conditions of the oxide semiconductor film and the insulating film are adjusted as appropriate so that the oxide semiconductor layer 412 is not removed and the insulating layer 407 under the oxide semiconductor layer 412 is not exposed when the conductive film is etched.

In this embodiment, a titanium film is used as the conductive film, an In—Ga—Zn—O-based oxide semiconductor is used as the oxide semiconductor layer 412, and an ammonia hydrogen peroxide solution (a mixture of ammonia, water, and a hydrogen peroxide solution) is used as an etchant.

In the second photolithography step, only part of the oxide semiconductor layer 412 may be etched off, whereby an oxide semiconductor layer having a groove (a depressed portion) might be formed. In addition, the resist mask for forming the source or drain electrode layer 415a and the source or drain electrode layer 415b may be formed with an ink-jet method. A photomask is not used when the resist mask is formed with an ink-jet method, which results in reducing manufacturing costs.

Ultraviolet, a KrF laser beam, or an ArF laser beam is used for light exposure for forming the resist mask in the second photolithography step. A channel length L of the thin film transistor to be formed later depends on a width of a distance between a bottom portion of the source electrode layer and a bottom portion of the drain electrode layer which are adjacent to each other over the oxide semiconductor layer 412. Note that when light exposure is performed in the case where the channel length L is shorter than 25 nm, extreme ultraviolet with extremely short wavelengths of several nanometers to several tens of nanometers is used for light exposure for forming the resist mask in the second photolithography step. Light exposure with extreme ultraviolet leads to a high resolution and a large depth of focus. Accordingly, the channel length L of the thin film transistor to be formed later can be set to 10 nm to 1000 nm inclusive. Thus, the operation speed of a circuit can be increased, and further, an off-state current can be significantly small so that low power consumption can be achieved.

Figure 6C:
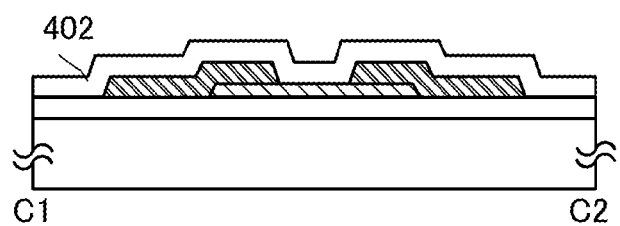
Figure 6D:
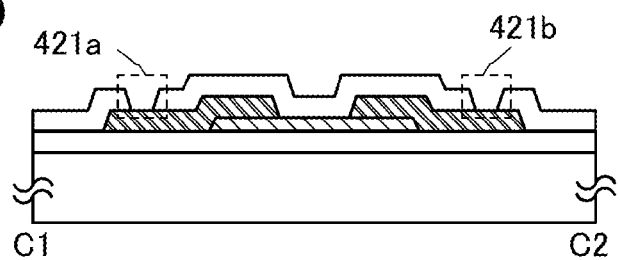

Next, the gate insulating layer 402 is formed over the insulating layer 407, the oxide semiconductor layer 412, the source or drain electrode layer 415a, and the source or drain electrode layer 415b (see FIG. 6C).

The gate insulating layer 402 can be formed with a single-layer structure or a stacked structure using one or more of a silicon oxide layer, a silicon nitride layer, a silicon oxynitride layer, a silicon nitride oxide layer, or an aluminum oxide layer with a plasma CVD method, a sputtering method, or the like. Note that the gate insulating layer 402 is preferably formed with a sputtering method so that the gate insulating layer 402 contains hydrogen as little as possible. In the case where a silicon oxide film is formed with a sputtering method, a silicon target or a quartz target is used as the target, and oxygen or a mixed gas of oxygen and argon is used as the sputtering gas.

In addition, as the gate insulating layer 402, $HfO_x$ ($x>0$) or the like can also be used, for example. With the use of $HfO_x$ or the like as the gate insulating layer 402, leakage current that flows from the oxide semiconductor layer side toward the gate electrode can be reduced.

Alternatively, the gate insulating layer 402 can have a structure in which a silicon oxide layer and a silicon nitride layer are stacked from the side of the source or drain electrode layer 415a and the source or drain electrode layer 415b. For example, a gate insulating layer having a thickness of 100 nm is formed in such a manner that a silicon oxide layer ($SiO_x$ ($x>0$)) having a thickness of 5 nm to 300 nm inclusive is formed as a first gate insulating layer and then a silicon nitride layer ($SiN_y$ ($y>0$)) having a thickness of 50 nm to 200 nm inclusive is stacked with a sputtering method as a second gate insulating layer over the first gate insulating layer. In this embodiment, a silicon oxide layer having a thickness of 100 nm is formed with an RF sputtering method, in which the pressure is 0.4 Pa, the high-frequency power source is 1.5 kW, and an oxygen and argon atmosphere (the flow ratio of oxygen to argon is 1:1 (each flow rate is 25 sccm)) is used.

Next, a resist mask is formed through a third photolithography step. The resist mask is selectively etched, so that an opening 421a and an opening 421b which reach the source or drain electrode layer 415a and the source or drain electrode layer 415b, respectively, are formed by removing part of the gate insulating layer 402 (see FIG. 6D).

Next, after a conductive film is formed over the gate insulating layer 402 and the openings 421a and 421b, the gate electrode layer 411 and the wiring layers 414a and 414b are formed through a fourth photolithography step. Note that a resist mask may be formed with an ink-jet method. A photomask is not used when the resist mask is formed with an ink-jet method, which results in reducing manufacturing costs.

A conductive film for forming the gate electrode layer 411, and the wiring layers 414a and 414b can be formed to have a single-layer or a stacked structure using a metal material such as molybdenum, titanium, chromium, tantalum, tungsten, aluminum, copper, neodymium, or scandium, or an alloy material including any of these materials as its main component.

For example, as a two-layer structure of each of the gate electrode layer 411, and the wiring layers 414a and 414b, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. As a three-layer structure, a stacked structure of a tungsten layer or a tungsten nitride layer, a layer of an alloy of aluminum and silicon or an alloy of aluminum and titanium, and a titanium nitride layer or a titanium layer is preferable. Note that the gate electrode layer can also be formed using a light-transmitting conductive film. As an example of a material of the light-transmitting conductive film, a light-transmitting conductive oxide or the like can be given.

In this embodiment, as the gate electrode layer 411, and the wiring layers 414a and 414b, a titanium film having a thickness of 150 nm is formed with a sputtering method.

Next, second heat treatment (preferably at 200° C. to 400° C. inclusive, e.g., 250° C. to 350° C. inclusive) is performed under an inert gas atmosphere or an oxygen gas atmosphere. In this embodiment, the second heat treatment is performed at 250° C. for one hour under a nitrogen atmosphere. The second heat treatment may be performed after a protective insulating layer or a planarization insulating layer is formed over the transistor 410.

Furthermore, heat treatment at 100° C. to 200° C. inclusive for one hour to 30 hours inclusive in an air atmosphere may be performed. This heat treatment may be performed at a fixed heating temperature. Alternatively, the following change in the heating temperature may be performed plural times repeatedly: the heating temperature is increased from room temperature to a temperature of 100° C. to 200° C. inclusive and then decreased to room temperature. This heat treatment may be performed before the formation of the oxide insulating layer under a reduced pressure. Under the reduced pressure, the heat treatment time can be shortened.

Figure 6E:
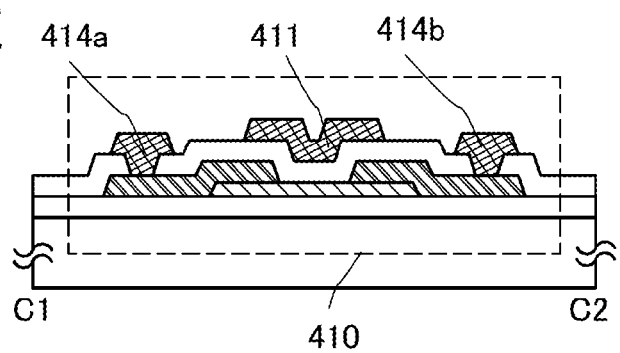

Through the above-described process, the transistor 410 including the oxide semiconductor layer 412 in which the concentration of hydrogen, moisture, hydride, or hydroxide is reduced can be formed (see FIG. 6E).

In addition, a protective insulating layer or planarizing insulating layer for planarization may be provided over the transistor 410. For example, the protective insulating layer can be formed with a single-layer structure or a stacked structure using one or more of a silicon oxide layer, a silicon nitride layer, a silicon oxynitride layer, a silicon nitride oxide layer, and an aluminum oxide layer.

Further, the planarizing insulating layer can be formed using an organic material having heat resistance, such as polyimide, acrylic resin, benzocyclobutene resin, polyamide, or epoxy resin. Other than such organic materials, it is also possible to use a low-dielectric constant material (a low-k material), a siloxane-based resin, PSG (phosphosilicate glass), BPSG (borophosphosilicate glass), or the like. The planarizing insulating layer may be formed by stacking a plurality of insulating films formed of these materials.

Note that the siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. Moreover, the organic group may include a fluoro group.

There is no particular limitation on the method for forming the planarizing insulating layer, and any of the following can be used, which depends on a material thereof: a method such as a sputtering method, an SOG method, spin coating, dipping, spray coating, or a droplet discharging method (e.g., an ink-jet method, screen printing, or offset printing); a tool such as doctor knife, roll coater, curtain coater, or knife coater; or the like.

When residual moisture in the atmosphere is removed as described above at the time of the formation of the oxide semiconductor film, the concentration of hydrogen or hydride in the oxide semiconductor film can be reduced. Thus, the oxide semiconductor film can be stabilized.

The capacitor in the voltage regulator circuit according to an embodiment of the present invention can be formed through the same steps as the transistor in this embodiment. When the transistor and the capacitor are formed through the same steps, the number of steps can be reduced.

With the above structure, the transistor can have stable electric characteristics and high reliability. Since leakage current is small in the transistor, by forming the voltage regulator circuit according to an embodiment of the present invention with the use of the transistor, a desired voltage can be achieved more rapidly than before.

Note that this embodiment can be combined as appropriate with any of the other embodiments.

Embodiment 5

In this embodiment, another example of a thin film transistor which can be used as a transistor included in the voltage regulator circuit disclosed in this specification will be described. The same portions as those in Embodiment 4 and portions having functions similar to those of the portions in Embodiment 4 and steps similar to those in Embodiment 4 may be handled as in Embodiment 4, and repeated description is omitted. In addition, detailed description of the same portions is also omitted.

In this embodiment, an embodiment of a transistor and a manufacturing method of the transistor will be described with reference to FIGS. 7A and 7B and FIGS. 8A to 8E.

Figure 7A:
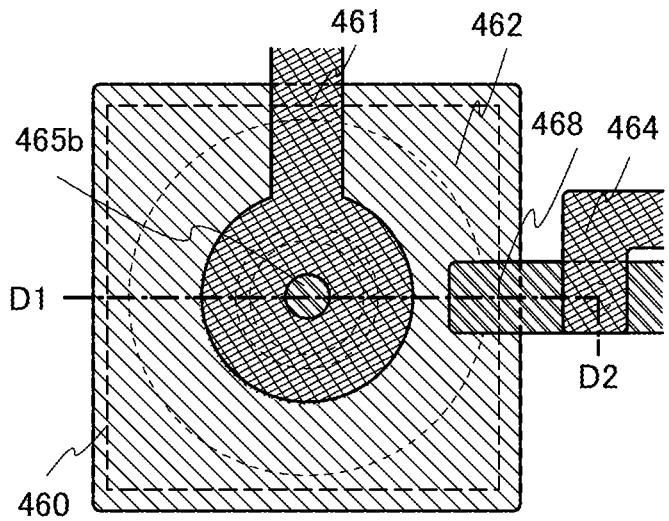
FIGS. 7A and 7B are a top view and a cross-sectional view illustrating a transistor.
Figure 7B:
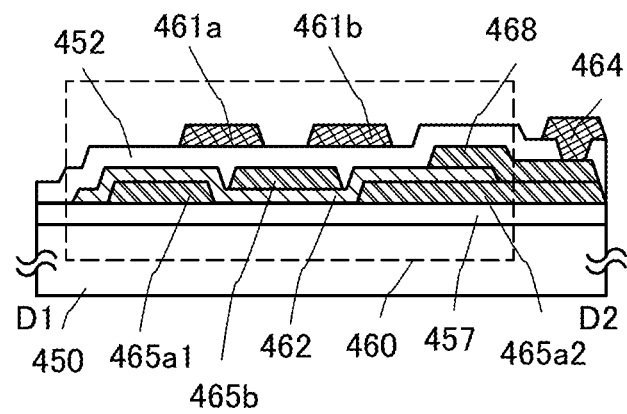

FIGS. 7A and 7B illustrate an example of a planar structure and an example of a cross-sectional structure of a transistor. A transistor 460 illustrated in FIGS. 7A and 7B is one of top gate thin film transistors.

FIG. 7A is a plan view of the transistor 460 having a top-gate structure and FIG. 7B is a cross-sectional view taken along D1-D2 in FIG. 7A.

The transistor 460 includes, over a substrate 450 having an insulating surface, an insulating layer 457, a source or drain electrode layer 465a (465a1 and 465a2), an oxide semiconductor layer 462, a source or drain electrode layer 465b, a wiring layer 468, a gate insulating layer 452, and a gate electrode layer 461 (461a and 461b). The source or drain electrode layer 465a (465a1 and 465a2) is electrically connected to a wiring layer 464 through the wiring layer 468. Although not illustrated, the source or drain electrode layer 465b is electrically connected to a different wiring layer through an opening formed in the gate insulating layer 452.

A manufacturing process of the transistor 460 over the substrate 450 having an insulating surface is described below with reference to FIGS. 8A to 8E.

First, the insulating layer 457 which serves as a base film is formed over the substrate 450 having an insulating surface.

In this embodiment, a silicon oxide layer is formed as the insulating layer 457 with a sputtering method. The substrate 450 is transferred to a treatment chamber and a high-purity sputtering gas from which hydrogen and moisture are removed and which contains oxygen is introduced, and a silicon oxide layer is formed as the insulating layer 457 over the substrate 450 with the use of a silicon target or a quartz (preferably synthetic quartz). As a sputtering gas, oxygen or a mixed gas of oxygen and argon is used.

For example, a silicon oxide film is formed with an RF sputtering method under the following conditions: quartz (preferably, synthetic quartz) with a purity of 6N is used as a target; the substrate temperature is 108° C.; the distance between the target and the substrate (T-S distance) is 60 mm; the pressure is 0.4 Pa; the high-frequency power source is 1.5 kW; and an oxygen and argon atmosphere (the flow ratio of oxygen to argon is 1:1 (each flow rate is 25 sccm)) is used. The film thickness thereof is 100 nm. Note that instead of quartz (preferably, synthetic quartz), a silicon target can be used as the target for forming the silicon oxide film.

In that case, the insulating layer 457 is preferably formed removing moisture remaining in the treatment chamber. This is for preventing hydrogen, a hydroxyl group, or moisture from being contained in the insulating layer 457. In the film formation chamber which is evacuated with a cryopump, for example, a hydrogen atom, a compound containing a hydrogen atom, such as water ($H_2O$), or the like is removed, whereby the concentration of an impurity contained in the insulating layer 457 formed in the film formation chamber can be reduced.

It is preferable to use a high-purity gas from which an impurity such as hydrogen, water, a hydroxyl group, or hydride is removed to a concentration of several ppm or a concentration of several ppb, as a sputtering gas when the insulating layer 457 is formed.

Further, the insulating layer 457 may have a stacked structure in which for example, a nitride insulating layer such as a silicon nitride layer, a silicon nitride oxide layer, an aluminum nitride layer, or an aluminum nitride oxide layer and the oxide insulating layer are stacked in this order from the substrate 450 side.

For example, a high-purity sputtering gas from which hydrogen and moisture are removed and which contains nitrogen is introduced and a silicon target is used, whereby a silicon nitride layer is formed over a substrate, and after that, a silicon oxide layer is deposited. Also in this case, the silicon nitride layer is preferably formed removing moisture remaining in a treatment chamber, similarly to the silicon oxide layer.

Next, a conductive film is formed over the insulating layer 457. A resist mask is formed over the conductive film through a first photolithography step. The conductive film is selectively etched, so that the source or drain electrode layer 465a1 and the source or drain electrode layer 465a2 are formed. Then, the resist mask is removed (see FIG. 8A). It seems in cross section as if the source or drain electrode layers 465a1 and 465a2 are divided; however, the source or drain electrode layers 465a1 and 465a2 are a continuous layer. Note that it is preferable that an end portion of the formed source electrode layer and drain electrode layer be tapered because coverage with the gate insulating layer stacked thereover is improved.

As a material of the source or drain electrode layer 465a1 and the source or drain electrode layer 465a2, there are an element selected from Al, Cr, Cu, Ta, Ti, Mo, and W, an alloy including any of the above elements as its component, an alloy film including a combination of any of the above elements, and the like. Alternatively, one or more materials selected from manganese, magnesium, zirconium, beryllium, and yttrium may be used. The conductive film may have a single-layer structure or a stacked structure of two or more layers. For example, a single-layer structure of an aluminum film including silicon, a two-layer structure in which a titanium film is stacked over an aluminum film, a three-layer structure in which a titanium film, an aluminum film, and a titanium film are stacked in this order, and the like can be given. Alternatively, a film, an alloy film, or a nitride film which contains aluminum (Al) and one or a plurality of elements selected from titanium (Ti), tantalum (Ta), tungsten (W), molybdenum (Mo), chromium (Cr), neodymium (Nd), and scandium (Sc) may be used.

In this embodiment, as the source or drain electrode layer 465a1 and the source or drain electrode layer 465a2, a titanium film having a thickness of 150 nm is formed with a sputtering method.

Next, an oxide semiconductor film having a thickness of 2 nm to 200 nm inclusive is formed over the insulating layer 457.

Figure 8A:
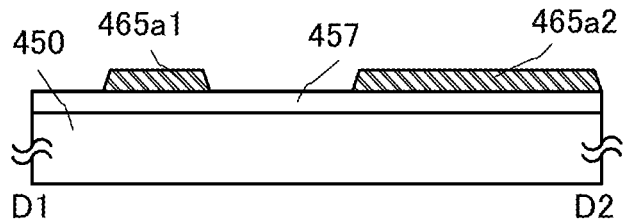
FIGS. 8A to 8E are cross-sectional views illustrating a method for manufacturing a transistor.
Figure 8B:
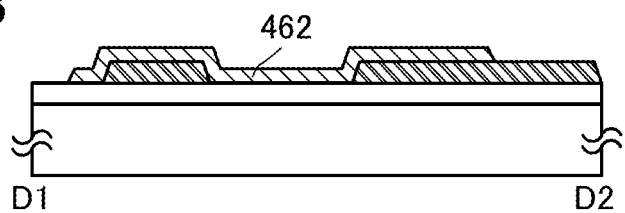
Figure 8C:
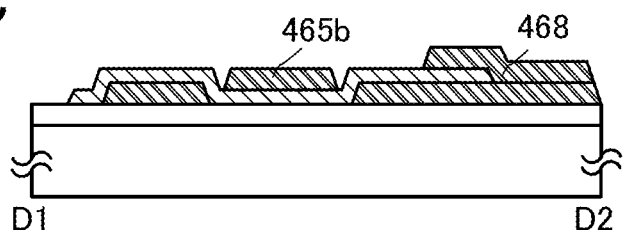
Figure 8D:
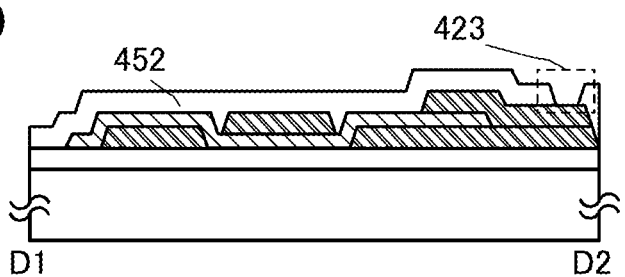

Next, the oxide semiconductor film is processed into the island-shaped oxide semiconductor layer 462 through a second photolithography step (see FIG. 8B). In this embodiment, the oxide semiconductor film is formed with a sputtering method with the use of an In—Ga—Zn—O based metal oxide target.

The substrate is held in a treatment chamber kept under reduced pressure, a sputtering gas from which hydrogen and moisture are removed is introduced into the treatment chamber from which remaining moisture is being removed, and the oxide semiconductor film is formed over the substrate 450 with the use of a metal oxide as a target. In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the film formation chamber which is evacuated with the cryopump, for example, a hydrogen atom, a compound containing a hydrogen atom, such as water ($H_2O$), (more preferably, also a compound containing a carbon atom), and the like are removed, whereby the concentration of an impurity contained in the oxide semiconductor film formed in the film formation chamber can be reduced. The substrate may be heated when the oxide semiconductor film is formed.

It is preferable to use a high-purity gas from which an impurity such as hydrogen, water, a hydroxyl group, or hydride is removed to a concentration of several ppm or a concentration of several ppb, as a sputtering gas when the oxide semiconductor film is formed.

As an example of film formation conditions, the following conditions are employed: the substrate temperature is room temperature; the distance between the substrate and the target is 60 mm, the pressure is 0.4 Pa, the direct current (DC) power source is 0.5 kW, and an oxygen and argon atmosphere (the flow ratio of oxygen to argon is 15 sccm:30 sccm=1:2) is used. It is preferable that a pulsed direct-current (DC) power source be used because powder substances generated in film formation can be reduced and the film thickness can be uniform. The oxide semiconductor film preferably has a thickness of 5 nm to 30 nm inclusive. Note that there is a difference in an appropriate thickness, which depends on an oxide semiconductor material, and the thickness may be set as appropriate in a manner which depends on the material.

In this embodiment, the oxide semiconductor film is processed into the island-shaped oxide semiconductor layer 462 with a wet etching method with a mixed solution of phosphoric acid, acetic acid, and nitric acid as an etchant.

In this embodiment, the oxide semiconductor layer 462 is subjected to first heat treatment. The temperature of the first heat treatment is higher than or equal to 400° C. and lower than or equal to 750° C., preferably, higher than or equal to 400° C. and lower than the strain point of the substrate. Here, the substrate is introduced in an electric furnace which is a kind of heat treatment apparatus and heat treatment is performed on the oxide semiconductor layer under a nitrogen atmosphere at 450° C. for one hour, and then water and hydrogen are prevented from entering the oxide semiconductor layer. In this manner, the oxide semiconductor layer is obtained. Through the first heat treatment, dehydration or dehydrogenation of the oxide semiconductor layer 462 can be performed.

Note that the heat treatment apparatus is not limited to an electric furnace, and may have a device for heating an object to be processed by heat conduction or heat radiation from a heater such as a resistance heater. For example, an RTA (rapid thermal anneal) apparatus such as a GRTA (gas rapid thermal anneal) apparatus or an LRTA (lamp rapid thermal anneal) apparatus can be used. For example, as the first heat treatment, GRTA may be performed as follows. The substrate is transferred and put in an inert gas which has been heated to a high temperature of 650° C. to 700° C., heated for several minutes, and transferred and taken out of the inert gas which has been heated to a high temperature. GRTA enables a high-temperature heat treatment for a short time.

Note that in the first heat treatment, it is preferable that water, hydrogen, and the like be not contained in nitrogen or a rare gas such as helium, neon, or argon. In addition, the purity of nitrogen or a rare gas such as helium, neon, or argon, which is introduced into the heat treatment apparatus, is preferably 6N (99.9999%) or more, more preferably, 7N (99.99999%) or more (i.e., impurity concentration is preferably 1 ppm or lower, more preferably, 0.1 ppm or lower).

The oxide semiconductor layer 462 becomes a microcrystalline layer or a polycrystalline layer by crystallization in some cases in a manner which depends on a condition of the first heat treatment or a material of the oxide semiconductor film.

In addition, the first heat treatment can also be performed on the oxide semiconductor film before being processed into the island-shaped oxide semiconductor layer. In that case, the substrate is taken out from the heat apparatus after the first heat treatment, and then a photolithography step is performed.

The heat treatment having an effect of dehydration or dehydrogenation with respect to the oxide semiconductor layer may be performed at any of the following timings: after the oxide semiconductor layer is formed; after a source electrode and a drain electrode are formed over the oxide semiconductor layer; and after a gate insulating layer is formed over the source electrode and the drain electrode.

Next, a conductive film is formed over the insulating layer 457 and the oxide semiconductor layer 462. A resist mask is formed over the conductive film through a third photolithography step. The conductive film is selectively etched, so that the source or drain electrode layer 465b and the wiring layer 468 are formed. Then, the resist mask is removed (see FIG. 8C). The source or drain electrode layer 456b and the wiring layer 468 may be formed using a material and a process similar to those of the source or drain electrode layers 465a1 and 465a2.

In this embodiment, as a conductive film for forming the source or drain electrode layer 465b and the wiring layer 468, a titanium film having a thickness of 150 nm is formed with a sputtering method. In this embodiment, the same titanium film is used for the source or drain electrode layers 465a1 and 465a2 and the source or drain electrode layer 465b, so that the etching rate of the source or drain electrode layers 465a1 and 465a2 is the same or substantially the same as that of the source or drain electrode layer 465b. Therefore, the wiring layer 468 is provided over a portion of the source or drain electrode layer 465a2, which is not covered with the oxide semiconductor layer 462, to prevent the source or drain electrode layers 465a1 and 465a2 from being etched when the source or drain electrode layer 465b is etched. In the case where different materials are used which provide high selectivity ratio of the source or drain electrode layer 465b to the source or drain electrode layers 465a1 and 465a2 in the etching step, the wiring layer 468 which protects the source or drain electrode layer 465a2 in etching is not necessarily provided.

Note that materials and etching conditions of the conductive film and the oxide semiconductor film are adjusted as appropriate so that the oxide semiconductor layer 462 is not removed when the conductive film is etched.

In this embodiment, a titanium film is used as the conductive film, an In—Ga—Zn—O-based oxide semiconductor is used as the oxide semiconductor layer 462, and an ammonia hydrogen peroxide solution (a mixture of ammonia, water, and a hydrogen peroxide solution) is used as an etchant.

In the third photolithography step, only part of the oxide semiconductor layer 462 may be etched off, whereby an oxide semiconductor layer having a groove (a depressed portion) might be formed. In addition, the resist mask for forming the source or drain electrode layer 465b and the wiring layer 468 may be formed with an ink-jet method. A photomask is not used when the resist mask is formed with an ink-jet method, which results in reducing manufacturing costs.

Next, the gate insulating layer 452 is formed over the insulating layer 457, the oxide semiconductor layer 462, the source or drain electrode layer 465a1, the source or drain electrode layer 465a2, and the source or drain electrode layer 465b.

The gate insulating layer 452 can be formed with a single-layer structure or a stacked structure using one or more of a silicon oxide layer, a silicon nitride layer, a silicon oxynitride layer, a silicon nitride oxide layer, or an aluminum oxide layer with a plasma CVD method, a sputtering method, or the like. Note that the gate insulating layer 452 is preferably formed with a sputtering method so that the gate insulating layer 452 contains hydrogen as little as possible. In the case where a silicon oxide film is formed with a sputtering method, a silicon target or a quartz target is used as the target, and oxygen or a mixed gas of oxygen and argon is used as the sputtering gas.

In addition, as the gate insulating layer 452, $HfO_x$ (x>0) or the like can also be used, for example. With the use of $HfO_x$ or the like as the gate insulating layer 452, leakage current that flows from the oxide semiconductor layer side toward the gate electrode can be reduced.

Alternatively, the gate insulating layer 452 can have a structure in which a silicon oxide layer and a silicon nitride layer are stacked from the side of the source or drain electrode layers 465a1 and 465a2 and the source or drain electrode layer 465b. In this embodiment, a silicon oxide layer having a thickness of 100 nm is formed with an RF sputtering method, in which the pressure is 0.4 Pa, the high-frequency power source is 1.5 kW, and an oxygen and argon atmosphere (the flow ratio of oxygen to argon is 1:1 (each flow rate is 25 sccm)) is used.

Next, a resist mask is formed through a fourth photolithography step. The resist mask is formed and selective etching is performed to remove part of the gate insulating layer 452, so that an opening 423 reaching the wiring layer 468 is formed (see FIG. 8D). Although not illustrated, at the time of forming the opening 423, an opening reaching the source or drain electrode layer 465b may be formed. In this embodiment, the opening reaching the source or drain electrode layer 465b is formed after an interlayer insulating layer is further stacked, and a wiring layer for electrical connection is formed in the opening.

Next, after a conductive film is formed over the gate insulating layer 452 and the opening 423, the gate electrode layers 461 (461a and 461b) and the wiring layer 464 are formed through a fifth photolithography step. Note that a resist mask may be formed with an ink-jet method. A photomask is not used when the resist mask is formed with an ink-jet method, which results in reducing manufacturing costs.

A conductive film for forming the gate electrode layers 461 (461a and 461b) and the wiring layer 464 can be formed to have a single-layer or a stacked structure using a metal material such as molybdenum, titanium, chromium, tantalum, tungsten, aluminum, copper, neodymium, or scandium, or an alloy material including any of these materials as its main component.

In this embodiment, as a conductive film for forming the gate electrode layers 461 (461a and 461b) and the wiring layer 464, a titanium film having a thickness of 150 nm is formed with a sputtering method.

Next, second heat treatment (preferably, at 200° C. to 400° C. inclusive, e.g., 250° C. to 350° C. inclusive) is performed under an inert gas atmosphere or an oxygen gas atmosphere. In this embodiment, the second heat treatment is performed at 250° C. for one hour under a nitrogen atmosphere. The second heat treatment may be performed after a protective insulating layer or a planarization insulating layer is formed over the transistor 460.

Furthermore, heat treatment may be performed at 100° C. to 200° C. inclusive for one hour to 30 hours inclusive in an air atmosphere. This heat treatment may be performed at a fixed heating temperature. Alternatively, the following change in the heating temperature may be performed plural times repeatedly: the heating temperature is increased from room temperature to a temperature of 100° C. to 200° C. inclusive and then decreased to room temperature. This heat treatment may be performed before the formation of the oxide insulating layer under a reduced pressure. Under the reduced pressure, the heat treatment time can be shortened.

Figure 8E:
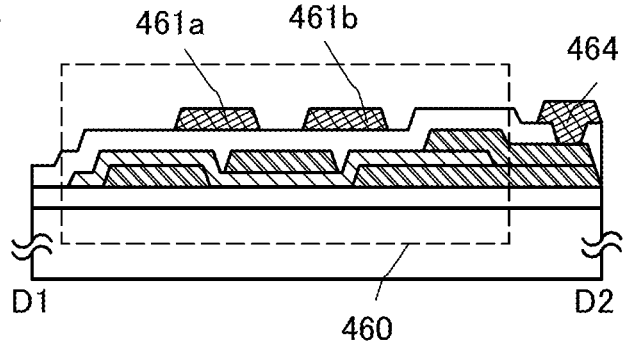

Through the above-described process, the transistor 460 including the oxide semiconductor layer 462 in which the concentration of hydrogen, moisture, hydride, or hydroxide is reduced can be formed (see FIG. 8E).

In addition, a protective insulating layer or a planarizing insulating layer for planarization may be provided over the transistor 460. Although not illustrated, an opening reaching the source or drain electrode layer 465b is formed in the gate insulating layer 452 and the protective insulating layer and/or the planarization insulating layer, and a wiring layer which is electrically connected to the source or drain electrode layer 465b is formed in the opening.

When residual moisture in the atmosphere is removed as described above at the time of the formation of the oxide semiconductor film, the concentration of hydrogen or hydride in the oxide semiconductor film can be reduced. Thus, the oxide semiconductor film can be stabilized.

The capacitor in the voltage regulator circuit according to an embodiment of the present invention can be formed through the same steps as the transistor in this embodiment. When the transistor and the capacitor are formed through the same steps, the number of steps can be reduced.

With the above structure, the transistor can have stable electric characteristics and high reliability. Since leakage current is small in the transistor, by forming the voltage regulator circuit according to an embodiment of the present invention with the use of the transistor, a desired voltage can be achieved more rapidly than before. Further, when the voltage regulator circuit according to an embodiment of the present invention is formed with the use of the transistor, the voltage regulator circuit can have stable electric characteristics and high reliability.

Note that this embodiment can be combined as appropriate with any of the other embodiments.

Embodiment 6

In this embodiment, another example of a thin film transistor which can be used as a transistor included in the voltage regulator circuit disclosed in this specification will be described. The same portions as those in Embodiment 4 or 5 and portions having functions similar to those of the portions in 4 or 5 and steps similar to those in Embodiment 4 or 5 may be handled as in Embodiment 4 or 5, and repeated description is omitted. In addition, detailed description of the same portions is also omitted. Each of transistors 425 and 426 described in this embodiment can be used as the thin film transistor included in the voltage regulator circuit in any of Embodiments 1 to 3.

The thin film transistor of this embodiment will be described with reference to FIGS. 9A and 9B.

Figure 9A:
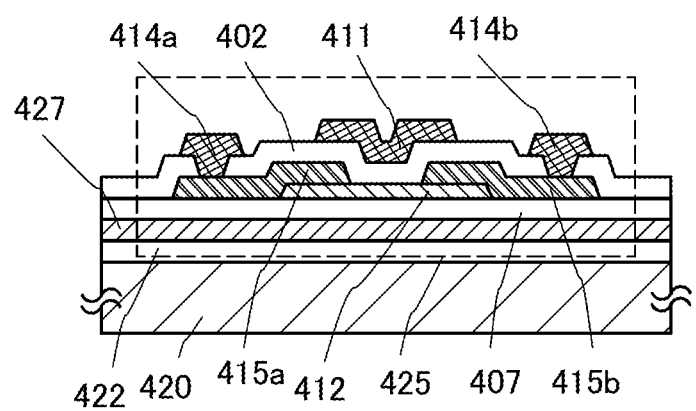
FIGS. 9A and 9B are cross-sectional views each illustrating a transistor.
Figure 9B:
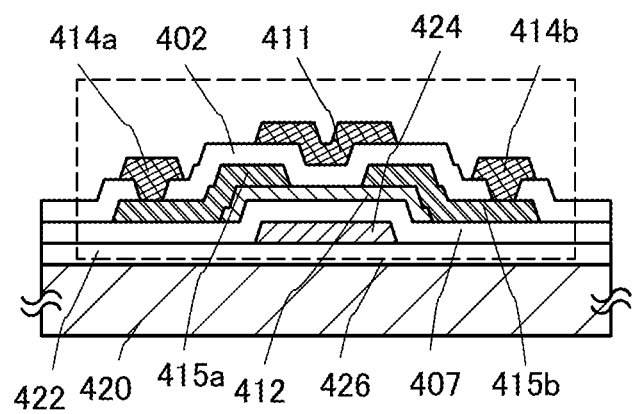

FIGS. 9A and 9B illustrate examples of cross-sectional structures of the thin film transistors. The transistors 425 and 426 in FIGS. 9A and 9B are each one of thin film transistors where an oxide semiconductor layer is sandwiched between a conductive layer and a gate electrode layer.

In addition, in FIGS. 9A and 9B, a silicon substrate is used as a substrate and each of the transistors 425 and 426 is provided over an insulating layer 422 which is formed over a silicon substrate 420.

In FIG. 9A, a conductive layer 427 is formed between the insulating layer 422 and an insulating layer 407 over the silicon substrate 420 so as to overlap with at least the whole oxide semiconductor layer 412.

Note that FIG. 9B illustrates an example where the conductive layer between the insulating layer 422 and the insulating layer 407 is processed like a conductive layer 424 by etching and overlaps with part of the oxide semiconductor layer 412, which includes at least a channel formation region.

The conductive layers 427 and 424 may be metal materials which can withstand a temperature of heat treatment performed in a subsequent step, and can be formed using an element selected from titanium (Ti), tantalum (Ta), tungsten (W), molybdenum (Mo), chromium (Cr), neodymium (Nd), and scandium (Sc), an alloy including any of the above elements as its component, an alloy film including a combination of any of the above elements, a nitride including any of the above elements as its component, or the like. Further, the conductive layers 427 and 424 may each have either a single-layer structure or a stacked structure, and for example, a single layer of a tungsten layer or a stack of a tungsten nitride layer and a tungsten layer can be used.

The conductive layers 427 and 424 may have the same potential as or have potential different from that of gate electrode layers 411 of the transistors 425 and 426 and can each function as a second gate electrode layer. The potential of the conductive layers 427 and 424 may be a fixed potential such as GND or 0 V.

Electric characteristics of the transistors 425 and 426 can be controlled by the conductive layers 427 and 424.

This embodiment is not limited to the structure in which the second gate electrode layer is formed by providing the conductive layer. For example, when a semiconductor substrate is used as the substrate, the substrate is subjected to thermal oxidation to form a region in the substrate, and the region can also function as the second gate electrode layer.

The capacitor in the voltage regulator circuit according to an embodiment of the present invention can be formed through the same steps as the transistor in this embodiment. When the transistor and the capacitor are formed through the same steps, the number of steps can be reduced.

With the above structure, the transistor can have stable electric characteristics and high reliability. Since leakage current is small in the transistor, by forming the voltage regulator circuit according to an embodiment of the present invention with the use of the transistor, a desired voltage can be achieved more rapidly than before. Further, when the voltage regulator circuit according to an embodiment of the present invention is formed with the use of the transistor, the voltage regulator circuit can have stable electric characteristics and high reliability.

Note that this embodiment can be combined as appropriate with any of the other embodiments.

Embodiment 7

In this embodiment, another example of a thin film transistor which can be used as a transistor included in the voltage regulator circuit disclosed in this specification will be described.

In this embodiment, an embodiment of a thin film transistor and a manufacturing method of the thin film transistor will be described with reference to FIGS. 10A to 10E.

FIGS. 10A to 10E illustrate an example of a manufacturing method of a thin film transistor. A transistor 390 illustrated in FIGS. 10A to 10E is one of bottom-gate structures and is also referred to as an inverted staggered thin film transistor.

Although the transistor 390 is a single-gate transistor, a multi-gate transistor including a plurality of channel formation regions may be formed as the transistor of this embodiment.

A manufacturing process of the transistor 390 over a substrate 394 having an insulating surface is described below with reference to FIGS. 10A to 10E.

First, after a conductive film is formed over the substrate 394 having an insulating surface, a gate electrode layer 391 is formed through a first photolithography step. It is preferable that an end portion of the formed gate electrode layer be tapered because coverage with the gate insulating layer stacked thereover is improved. Note that a resist mask may be formed with an ink-jet method. A photomask is not used when the resist mask is formed with an ink-jet method, which results in reducing manufacturing costs.

Although there is no particular limitation on a substrate which can be used for the substrate 394 having an insulating surface, it is necessary that the substrate have at least enough heat resistance to heat treatment in a subsequent step. For example, as the substrate 394, a glass substrate of barium borosilicate glass, aluminoborosilicate glass, or the like can be used.

As the glass substrate, a substrate having a strain point of 730° C. or higher may be used when the temperature of the heat treatment in a subsequent step is high. As a material of the glass substrate, a glass material such as aluminosilicate glass, aluminoborosilicate glass, or barium borosilicate glass is used, for example. Note that by containing a larger amount of barium oxide (BaO) than boron oxide ($B_2O_3$), a glass substrate is heat-resistant and of more practical use. Therefore, a glass substrate containing a larger amount of BaO than $B_2O_3$ is preferably used.

Note that a substrate formed using an insulator, such as a ceramic substrate, a quartz substrate, or a sapphire substrate, may be used as the substrate 394 instead of the glass substrate. Crystallized glass or the like may be used as well. Alternatively, a plastic substrate or the like can be used as appropriate. Further alternatively, as the substrate, a semiconductor substrate of silicon or the like can be used.

Further, an insulating film serving as a base film may be provided between the substrate 394 and the gate electrode layer 391. The base film has a function of preventing diffusion of an impurity element from the substrate 394, and can be formed with a single-layer structure or a stacked structure using one or more of a silicon nitride film, a silicon oxide film, a silicon nitride oxide film, and a silicon oxynitride film.

A conductive film for forming the gate electrode layer 391 can be formed to have a single-layer or a stacked structure using a metal material such as molybdenum, titanium, chromium, tantalum, tungsten, aluminum, copper, neodymium, or scandium, or an alloy material including any of these materials as its main component.

For example, as a two-layer structure of the gate electrode layer 391, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, a two-layer structure of a titanium nitride layer and a molybdenum layer, and a two-layer structure of a tungsten nitride layer and a tungsten layer. As a three-layer structure, a stacked structure of a tungsten layer or a tungsten nitride layer, a layer of an alloy of aluminum and silicon or an alloy of aluminum and titanium, and a titanium nitride layer or a titanium layer is preferable. Note that the gate electrode layer can also be formed using a light-transmitting conductive film. As an example of a material of the light-transmitting conductive film, a light-transmitting conductive oxide or the like can be given.

Next, a gate insulating layer 397 is formed over the gate electrode layer 391.

An oxide semiconductor (a highly purified oxide semiconductor) which is made to be i-type or substantially i-type by removal of an impurity is highly sensitive to an interface state and interface electric charge; thus, an interface between the oxide semiconductor and a gate insulating layer is important. Therefore, the gate insulating layer (GI) which is in contact with the highly purified oxide semiconductor layer needs high quality.

For example, high-density plasma CVD using microwaves (2.45 GHz) is preferable because a dense high-quality insulating film having high breakdown voltage can be formed. This is because when the highly purified oxide semiconductor layer is closely in contact with the high-quality gate insulating layer, the interface state can be reduced and interface properties can be favorable. Here, as a high-density plasma apparatus, an apparatus which can realize a plasma density of greater than or equal to $1 \times 10^{11}/cm^3$ can be used.

For example, plasma is generated by applying a microwave power of 3 kW to 6 kW so that the insulating film is formed. A monosilane gas ($SiH_4$), nitrous oxide ($N_2O$), and a rare gas are introduced into a chamber as a source gas to generate high-density plasma at a pressure of 10 Pa to 30 Pa so that the insulating film is formed over a substrate having an insulating surface, such as a glass substrate. After that, the supply of a monosilane gas is stopped, and nitrous oxide ($N_2O$) and a rare gas are introduced without exposure to the air, so that a surface of the insulating film is subjected to plasma treatment. The plasma treatment performed on the surface of the insulating film by introducing nitrous oxide ($N_2O$) and a rare gas is performed at least after the insulating film is formed. The flow ratio of a monosilane gas ($SiH_4$) to nitrous oxide ($N_2O$) which are introduced into the chamber is in the range of 1:10 to 1:200. In addition, as a rare gas which is introduced into the chamber, helium, argon, krypton, xenon, or the like can be used. In particular, argon, which is inexpensive, is preferably used.

Needless to say, a different film formation method such as a sputtering method or a plasma CVD method can be used as long as a high-quality insulating film can be formed as the gate insulating layer 397. In addition, any insulating film can be used as long as film quality and properties of an interface with an oxide semiconductor of the gate insulating film are modified by heat treatment performed after film formation. In any case, any insulating film can be used as long as film quality as a gate insulating film is high, interface state density with an oxide semiconductor is reduced, and a favorable interface can be formed.

In a gate-bias thermal stress test (BT test) at 85° C. and $2 \times 10^6$ V/cm for 12 hours, if an impurity has been added to an oxide semiconductor, the bond between the impurity and the main component of the oxide semiconductor is broken by a high electric field (B: bias) and high temperature (T: temperature), so that a generated dangling bond induces a drift in the threshold voltage ($V_{th}$). As a countermeasure against this, in the transistor which is an embodiment of the present invention, the impurity in the oxide semiconductor, especially, hydrogen, water, or the like is removed as much as possible so that the properties of an interface with the gate insulating layer are favorable as described above. Accordingly, it is possible to obtain a thin film transistor which is stable with respect to the BT test.

In addition, the gate insulating layer 397 can be formed with a single-layer structure or a stacked structure using one or more of a silicon oxide layer, a silicon nitride layer, a silicon oxynitride layer, a silicon nitride oxide layer, or an aluminum oxide layer.

In addition, as the gate insulating layer 397, $HfO_x$ (x>0) or the like can also be used, for example. With the use of $HfO_x$ or the like as the gate insulating layer 397, leakage current that flows from the oxide semiconductor layer side toward the gate electrode can be reduced.

The gate insulating layer 397 can have a structure in which a silicon oxide layer and a silicon nitride layer are stacked. In this embodiment, a silicon oxynitride layer having a thickness of 100 nm is formed with a high-density plasma CVD method with a pressure of 30 Pa and a microwave power of 6 kW, for example. At this time, the flow ratio of a monosilane gas ($SiH_4$) to nitrous oxide ($N_2O$) which are introduced into the chamber is 1:10.

Further, in order that hydrogen, a hydroxyl group, and moisture might be contained in the gate insulating layer 397 and an oxide semiconductor film 393 as little as possible, it is preferable that the substrate 394 over which the gate electrode layer 391 is formed or the substrate 394 over which layers up to the gate insulating layer 397 are formed be preheated in a preheating chamber of a sputtering apparatus as pretreatment for film formation so that impurities such as hydrogen and moisture adsorbed to the substrate 394 are eliminated and exhaustion is performed. The temperature for the preheating is 100° C. to 400° C. inclusive, preferably, 150° C. to 300° C. inclusive. Note that a cryopump is preferable as an evacuation unit provided in the preheating chamber. Note that this preheating treatment may be omitted. Further, this preheating may be similarly performed on the substrate 394 over which layers up to a source or drain electrode layer 395a and a source or drain electrode layer 395b have been formed, before formation of the oxide insulating layer 396.

Figure 10A:
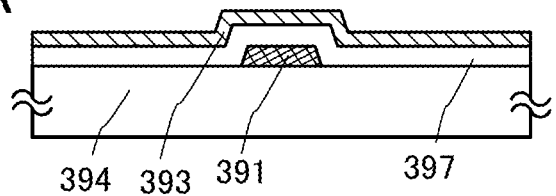
FIGS. 10A to 10E are cross-sectional views illustrating a method for manufacturing a transistor.

Next, the oxide semiconductor film 393 with a thickness of 2 nm to 200 nm inclusive is formed over the gate insulating layer 397 (see FIG. 10A).

Note that before the oxide semiconductor film 393 is formed with a sputtering method, dust on a surface of the gate insulating layer 397 is preferably removed by reverse sputtering in which an argon gas is introduced and plasma is generated.

The oxide semiconductor film 393 is formed with a sputtering method. As the oxide semiconductor film, any of the following oxide semiconductor films can be applied: an In—Ga—Zn—O-based oxide semiconductor film; an In—Sn—Zn—O-based oxide semiconductor film; an In—Al—Zn—O-based oxide semiconductor film; a Sn—Ga—Zn—O-based oxide semiconductor film; an Al—Ga—Zn—O-based oxide semiconductor film; an Sn—Al—Zn—O-based oxide semiconductor film; an In—Zn—O-based oxide semiconductor film; a Sn—Zn—O-based oxide semiconductor film; an Al—Zn—O-based oxide semiconductor film; an In—O-based oxide semiconductor film; an In—Sn—O-based oxide semiconductor film; a Sn—O-based oxide semiconductor film; and a Zn—O-based oxide semiconductor film. In this embodiment, the oxide semiconductor film 393 is formed with a sputtering method with the use of an In—Ga—Zn—O based metal oxide target. Alternatively, the oxide semiconductor film 393 can be formed with a sputtering method under a rare gas (typically, argon) atmosphere, an oxygen atmosphere, or an atmosphere of a rare gas (typically, argon) and oxygen. In the case where a sputtering method is employed, a film may be formed with a target including $SiO_2$ at 2 wt % to 10 wt % inclusive.

As a target for forming the oxide semiconductor film 393 with a sputtering method, a metal oxide target containing zinc oxide as its main component can be used. As another example of the metal oxide target, for example, a metal oxide target with a composition ratio of $In_2O_3:Ga_2O_3:ZnO=1:1:1$ (molar ratio) can be used. Without limitation to the above target, for example, a metal oxide target with a composition ratio of $In_2O_3:Ga_2O_3:ZnO=1:1:2$ (molar ratio) may be used. The filling factor of the metal oxide target to be manufactured is 90% to 100% inclusive, preferably, 95% to 99.9% inclusive. With the use of a metal oxide target with high filling factor, the formed oxide semiconductor film has high density.

The substrate is held in a treatment chamber kept under reduced pressure, and the substrate is heated to room temperature or a temperature of less than 400° C. Then, a sputtering gas from which hydrogen and moisture are removed is introduced into the treatment chamber from which remaining moisture is being removed, and the oxide semiconductor film 393 is formed over the substrate 394 with the use of a metal oxide as a target. In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the film formation chamber which is evacuated with the cryopump, for example, a hydrogen atom, a compound containing a hydrogen atom, such as water ($H_2O$), (more preferably, also a compound containing a carbon atom), and the like are removed, whereby the concentration of an impurity contained in the oxide semiconductor film formed in the film formation chamber can be reduced. By performing film formation by sputtering while removing moisture remaining in the treatment chamber using a cryopump, a substrate temperature when the oxide semiconductor film 393 is formed can be greater than or equal to room temperature and less than 400° C.

As an example of film formation conditions, the following conditions are employed: the distance between the substrate and the target is 60 mm, the pressure is 0.6 Pa, the direct current (DC) power source is 0.5 kW, and an oxygen atmosphere (the proportion of the oxygen flow is 100%) is used. It is preferable that a pulsed direct-current (DC) power source be used because powder substances generated in film formation can be reduced and the film thickness can be uniform. The oxide semiconductor film preferably has a thickness of 5 nm to 30 nm inclusive. Note that there is a difference in an appropriate thickness, which depends on an oxide semiconductor material, and the thickness may be set as appropriate in a manner which depends on the material.

Figure 10B:
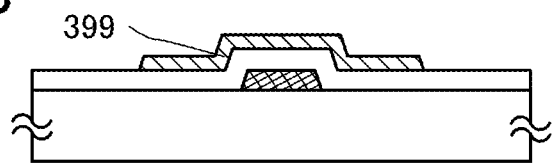
Figure 10C:
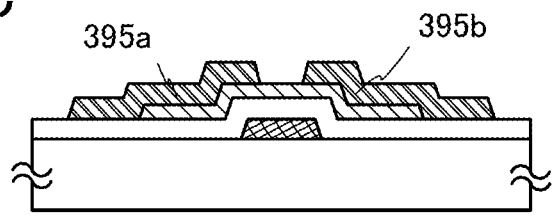

Next, the oxide semiconductor film is processed into an island-shaped oxide semiconductor layer 399 through a second photolithography step (see FIG. 10B). Further, a resist mask for forming the island-shaped oxide semiconductor layer 399 may be formed with an ink-jet method. A photomask is not used when the resist mask is formed with an ink-jet method, which results in reducing manufacturing costs.

In the case where a contact hole is formed in the gate insulating layer 397, the step can be performed at the time of formation of the oxide semiconductor layer 399.

For the etching of the oxide semiconductor film 393, wet etching, dry etching, or both of them may be employed.

As the etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the film into a desired shape, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a mixed solution of phosphoric acid, acetic acid, and nitric acid, or the like can be used. In addition, ITO07N (produced by Kanto Chemical Co., Inc.) may also be used.

Furthermore, the etchant after the wet etching is removed together with the etched material by cleaning. The waste liquid of the etchant including the material etched off may be purified and the material may be reused. When a material such as indium included in the oxide semiconductor layer is collected from the waste liquid after the etching and reused, the resources can be efficiently used and the cost can be reduced.

The etching conditions (such as an etchant, etching time, and temperature), which depend on the material, are adjusted as appropriate so that the material can be etched into a desired shape.

Note that reverse sputtering is preferably performed before formation of a conductive film in a subsequent step, so that a resist residue attached to surfaces of the oxide semiconductor layer 399 and the gate insulating layer 397 is removed.

Next, a conductive film is formed over the gate insulating layer 397 and the oxide semiconductor layer 399. The conductive film may be formed with a sputtering method or a vacuum evaporation method. As a material of the conductive film, there are an element selected from Al, Cr, Cu, Ta, Ti, Mo, and W, an alloy including any of the above elements as its component, an alloy film including a combination of any of the above elements, and the like. Alternatively, one or more materials selected from manganese, magnesium, zirconium, beryllium, and yttrium may be used. The conductive film may have a single-layer structure or a stacked structure of two or more layers. For example, a single-layer structure of an aluminum film including silicon, a two-layer structure in which a titanium film is stacked over an aluminum film, a three-layer structure in which a titanium film, an aluminum film, and a titanium film are stacked in this order, and the like can be given. Alternatively, a film, an alloy film, or a nitride film which contains aluminum (Al) and one or a plurality of elements selected from titanium (Ti), tantalum (Ta), tungsten (W), molybdenum (Mo), chromium (Cr), neodymium (Nd), and scandium (Sc) may be used.

A resist mask is formed over the conductive film through a third photolithography step. The conductive film is selectively etched, so that the source or drain electrode layer 395a and the source or drain electrode layer 395b are formed. Then, the resist mask is removed (see FIG. 10C).

Ultraviolet, a KrF laser beam, or an ArF laser beam is used for light exposure for forming the resist mask in the third photolithography step. A channel length L of the thin film transistor to be formed later depends on a width of a distance between a bottom portion of the source electrode layer and a bottom portion of the drain electrode layer which are adjacent to each other over the oxide semiconductor layer 399. Note that when light exposure is performed in the case where the channel length L is shorter than 25 nm, extreme ultraviolet with extremely short wavelengths of several nanometers to several tens of nanometers is used for light exposure for forming the resist mask in the third photolithography step. Light exposure with extreme ultraviolet leads to a high resolution and a large depth of focus. Accordingly, the channel length L of the thin film transistor to be formed later can be set to 10 nm to 1000 nm inclusive. Thus, the operation speed of a circuit can be increased, and further, an off-state current is significantly small, so that low power consumption can be achieved.

Note that each material and etching conditions of the conductive film and the oxide semiconductor film are adjusted as appropriate so that the oxide semiconductor layer 399 is not removed at the time of etching the conductive film.

In this embodiment, a titanium film is used as the conductive film, an In—Ga—Zn—O-based oxide semiconductor is used as the oxide semiconductor layer 399, and an ammonia hydrogen peroxide solution (a mixture of ammonia, water, and a hydrogen peroxide solution) is used as an etchant.

In the third photolithography step, only part of the oxide semiconductor layer 399 may be etched off, whereby an oxide semiconductor layer having a groove (a depressed portion) might be formed. In addition, the resist mask for forming the source or drain electrode layer 395a and the source or drain electrode layer 395b may be formed with an ink-jet method. A photomask is not used when the resist mask is formed with an ink-jet method, which results in reducing manufacturing costs.

In order to reduce the number of photomasks and steps in a photolithography step, etching may be performed with the use of a resist mask formed using a multi-tone mask which is a light-exposure mask through which light is transmitted so as to have a plurality of intensities. Since a resist mask formed using a multi-tone mask has a plurality of thicknesses and can be further changed in shape by performing etching, the resist mask can be used in a plurality of etching steps to provide different patterns. Therefore, a resist mask corresponding to at least two kinds of different pattern can be formed by using one multi-tone mask. Thus, the number of light-exposure masks can be reduced and the number of corresponding photolithography steps can also be reduced, whereby simplification of a process can be realized.

Plasma treatment using a gas such as $N_2O$, $N_2$, or Ar may be performed to remove water or the like adsorbed on a surface of the oxide semiconductor layer which is exposed. In addition, plasma treatment may be performed using a mixed gas of oxygen and argon.

Figure 10D:
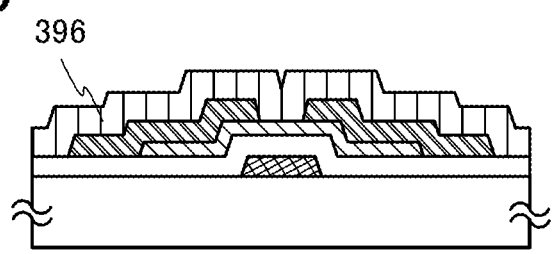

After the plasma treatment, the oxide insulating layer 396 is formed as an oxide insulating layer which serves as a protective insulating film in contact with part of the oxide semiconductor layer (see FIG. 10D). In this embodiment, the oxide semiconductor layer 399 and the oxide insulating layer 396 are formed in contact with each other in a region where the oxide semiconductor layer 399 is overlapped with neither the source or drain electrode layer 395a nor the source or drain electrode layer 395b.

In this embodiment, as the oxide insulating layer 396, a silicon oxide layer including defects is formed in the following manner: the substrate 394 over which the island-shaped oxide semiconductor layer 399, the source or drain electrode layer 395a, and the source or drain electrode layer 395b are formed is heated at room temperature or a temperature lower than 100° C.; a sputtering gas containing high-purity oxygen from which hydrogen and moisture are removed is introduced; and a silicon semiconductor target is used.

For example, a silicon oxide film is formed with a pulsed DC sputtering method, in which a silicon target doped with boron and having a purity of 6N (resistivity: 0.01 Ωm) is used, the distance between the target and the substrate (T-S distance) is 89 mm, the pressure is 0.4 Pa, the direct current (DC) power source is 6 kW, and an oxygen atmosphere (the proportion of the oxygen flow is 100%) is used. The film thickness thereof is 300 nm Note that instead of the silicon target, quartz (preferably, synthetic quartz) can be used as the target for forming the silicon oxide film. As the sputtering gas, oxygen or a mixed gas of oxygen and argon is used.

In that case, the oxide insulating layer 396 is preferably formed removing moisture remaining in the treatment chamber. This is for preventing hydrogen, a hydroxyl group, or moisture from being contained in the oxide semiconductor layer 399 and the oxide insulating layer 396.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In a film formation chamber which is evacuated with the cryopump, for example, a hydrogen atom, a compound containing a hydrogen atom, such as water ($H_2O$), or the like is removed, whereby the concentration of an impurity contained in the oxide insulating layer 396 formed in the film formation chamber can be reduced.

As the oxide insulating layer 396, instead of the silicon oxide layer, a silicon oxynitride layer, an aluminum oxide layer, an aluminum oxynitride layer, or the like can be used as well.

Further, heat treatment may be performed at 100° C. to 400° C. while the oxide insulating layer 396 and the oxide semiconductor layer 399 are in contact with each other. Since the oxide insulating layer 396 in this embodiment has a lot of defects, with this heat treatment, an impurity such as hydrogen, moisture, a hydroxyl group, or hydride contained in the oxide semiconductor layer 399 can be diffused to the oxide insulating layer 396 so that the impurity contained in the oxide semiconductor layer 399 can be further reduced.

Figure 10E:
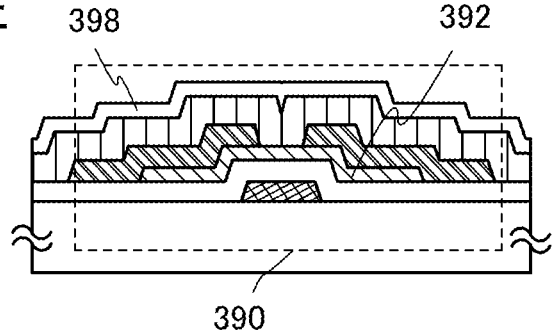

Through the above-described process, the transistor 390 including an oxide semiconductor layer 392 in which the concentration of hydrogen, moisture, hydride, or hydroxide is reduced can be formed (see FIG. 10E).

When residual moisture in the atmosphere is removed as described above at the time of the formation of the oxide semiconductor film, the concentration of hydrogen or hydride in the oxide semiconductor film can be reduced. Thus, the oxide semiconductor film can be stabilized.

A protective insulating layer may be provided over the oxide insulating layer. In this embodiment, a protective insulating layer 398 is formed over the oxide insulating layer 396. As the protective insulating layer 398, a silicon nitride film, a silicon nitride oxide film, an aluminum nitride film, an aluminum nitride oxide film, or the like is used.

As the protective insulating layer 398, a silicon nitride film is formed in the following manner: the substrate 394 over which layers up to the oxide insulating layer 396 are formed is heated at a temperature of 100° C. to 400° C.; a sputtering gas containing high-purity nitrogen from which hydrogen and moisture are removed is introduced; and a silicon semiconductor target is used. In this case also, it is preferable that residual moisture be removed from the treatment chamber in the formation of the protective insulating layer 398 in a manner similar to that of the oxide insulating layer 396.

In the case where the protective insulating layer 398 is formed, the substrate 394 is heated at a temperature of 100° C.

to 400° C. at the time of formation of the protective insulating layer 398, whereby hydrogen or moisture included in the oxide semiconductor layer 399 can be diffused into the oxide insulating layer 396. In such a case, heat treatment heat treatment is not necessarily performed after formation of the oxide insulating layer 396.

In the case where the silicon oxide layer as the oxide insulating layer 396 and a silicon nitride layer as the protective insulating layer 398 are stacked, the silicon oxide layer and the silicon nitride layer can be formed in the same treatment chamber using a common silicon target. First, a sputtering gas containing oxygen is introduced and a silicon oxide layer is formed using a silicon target placed inside the treatment chamber, and then the sputtering gas is switched to a sputtering gas containing nitrogen and a silicon nitride layer is formed using the same silicon target. Since the silicon oxide layer and the silicon nitride layer can be formed in succession without exposure to the air, an impurity such as hydrogen or moisture can be prevented from being adsorbed on a surface of the silicon oxide layer. In this case, after the silicon oxide layer as the oxide insulating layer 396 and the silicon nitride layer as the protective insulating layer 398 are stacked, heat treatment (at a temperature of 100° C. to 400° C.) for diffusing hydrogen or moisture included in the oxide semiconductor layer into the oxide insulating layer 396 may be performed.

After the protective insulating layer 398 is formed, heat treatment at 100° C. to 200° C. inclusive for one hour to 30 hours inclusive in an air atmosphere may be further performed. This heat treatment may be performed at a fixed heating temperature. Alternatively, the following change in the heating temperature may be performed plural times repeatedly: the heating temperature is increased from room temperature to a temperature of 100° C. to 200° C. inclusive and then decreased to room temperature. This heat treatment may be performed before the formation of the oxide insulating layer 396 under a reduced pressure. Under the reduced pressure, the heat treatment time can be shortened. With this heat treatment, a normally-off thin film transistor can be obtained. Thus, reliability of the thin film transistor can be improved.

When residual moisture in the atmosphere is removed at the time of the formation of the oxide semiconductor layer, in which a channel formation region is to be formed, over the gate insulating layer, the concentration of hydrogen or hydride in the oxide semiconductor layer can be reduced.

The above steps are performed at 400° C. or lower; therefore, the above steps can also be applied to a manufacturing process in which a glass substrate having a thickness of 1 mm or less and having a side that is longer than 1 m is used. Moreover, the whole process can be performed at a treatment temperature of 400° C. or lower.

Figure 11:
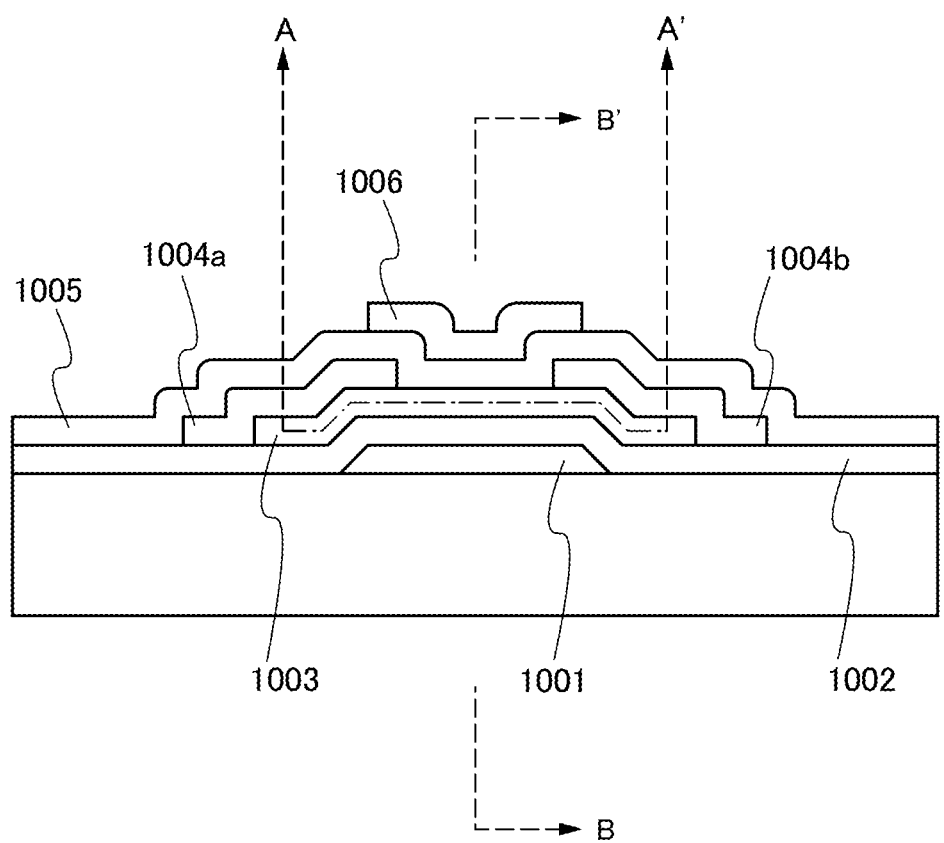
FIG. 11 is a longitudinal cross-sectional view of an inverted staggered thin film transistor including an oxide semiconductor.

FIG. 11 is a longitudinal cross-sectional view of an inverted staggered thin film transistor including an oxide semiconductor. An oxide semiconductor layer 1003 is provided over a gate electrode 1001 with a gate insulating film 1002 interposed therebetween, a source electrode 1004a and a drain electrode 1004b are provided thereover, an oxide insulating layer 1005 is provided over the source electrode 1004a and the drain electrode 1004b, and a conductive layer 1006 is provided over the oxide semiconductor layer 1003 with the oxide insulating layer 1005 interposed therebetween.

Figure 12A:
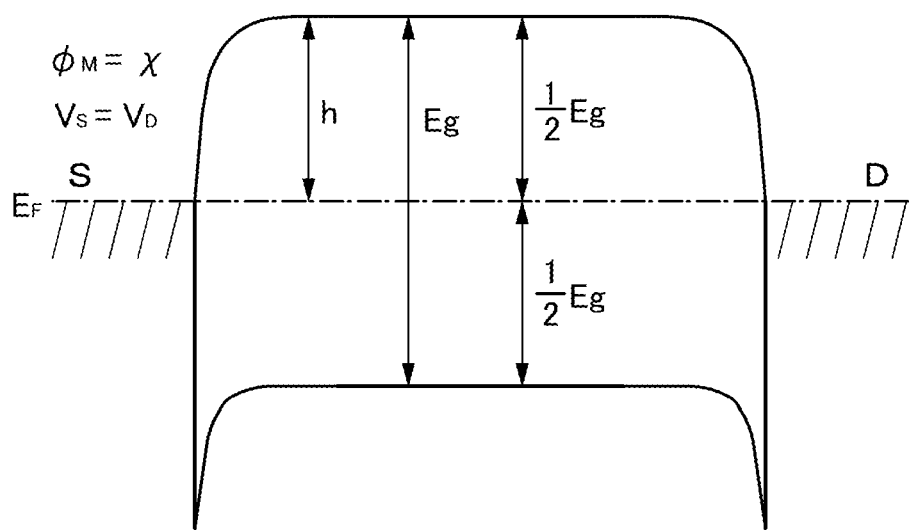
FIGS. 12A and 12B are each an energy band diagram (schematic diagram) of a cross section along A-A' in FIG. 11.
Figure 12B:
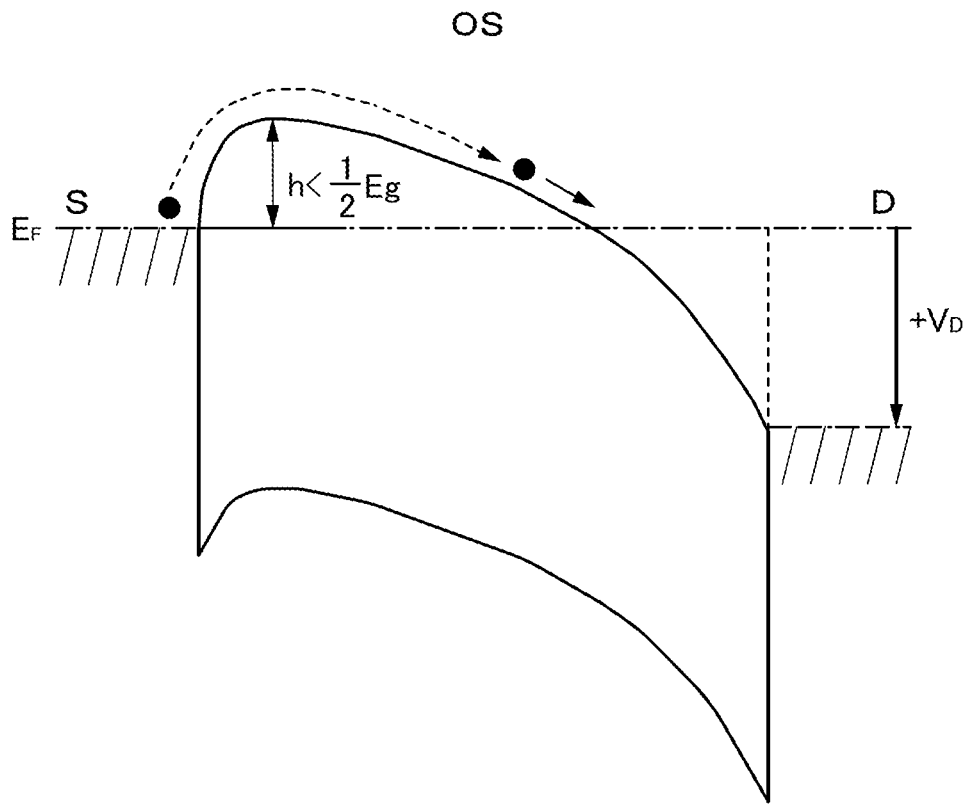

FIGS. 12A and 12B are energy band diagrams (schematic diagrams) of a cross section along A-A' in FIG. 11. FIG. 12A illustrates the case where the potential of a voltage applied to the source is equal to the potential of a voltage applied to the drain ($V_D$=0 V), and FIG. 12B illustrates the case where a positive potential with respect to the source is applied to the drain ($V_D$>0).

Figure 13A:
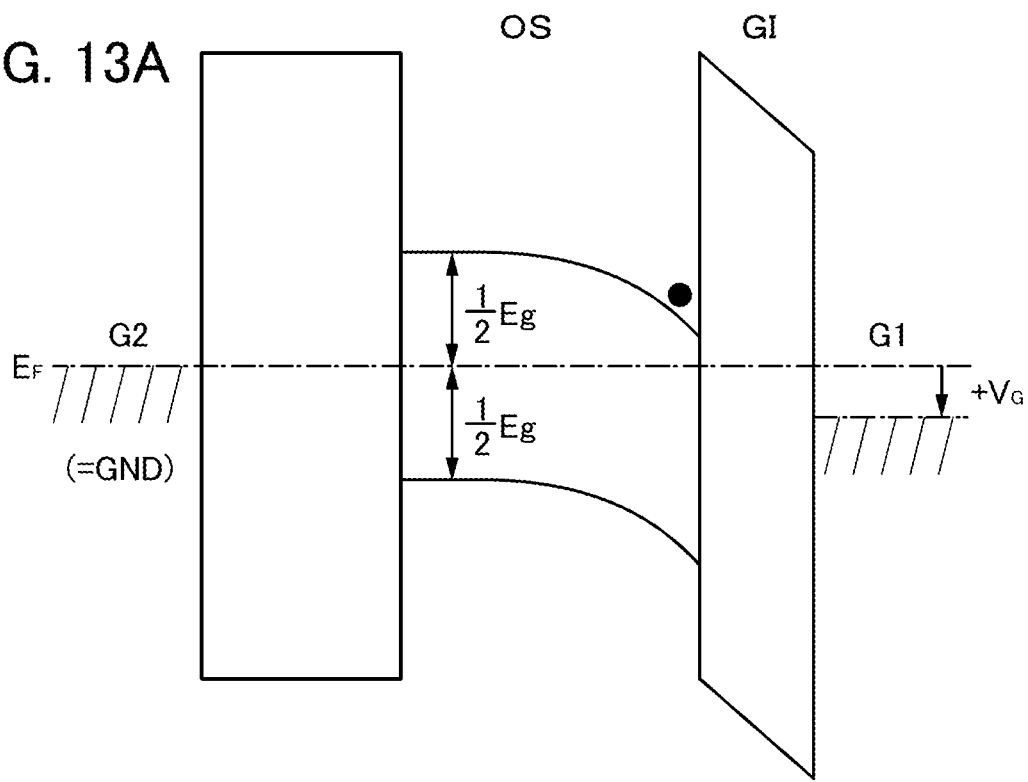
FIG. 13A is an energy band diagram illustrating a state in which positive potential (+VG) is applied to a gate electrode 1001.
Figure 13B:
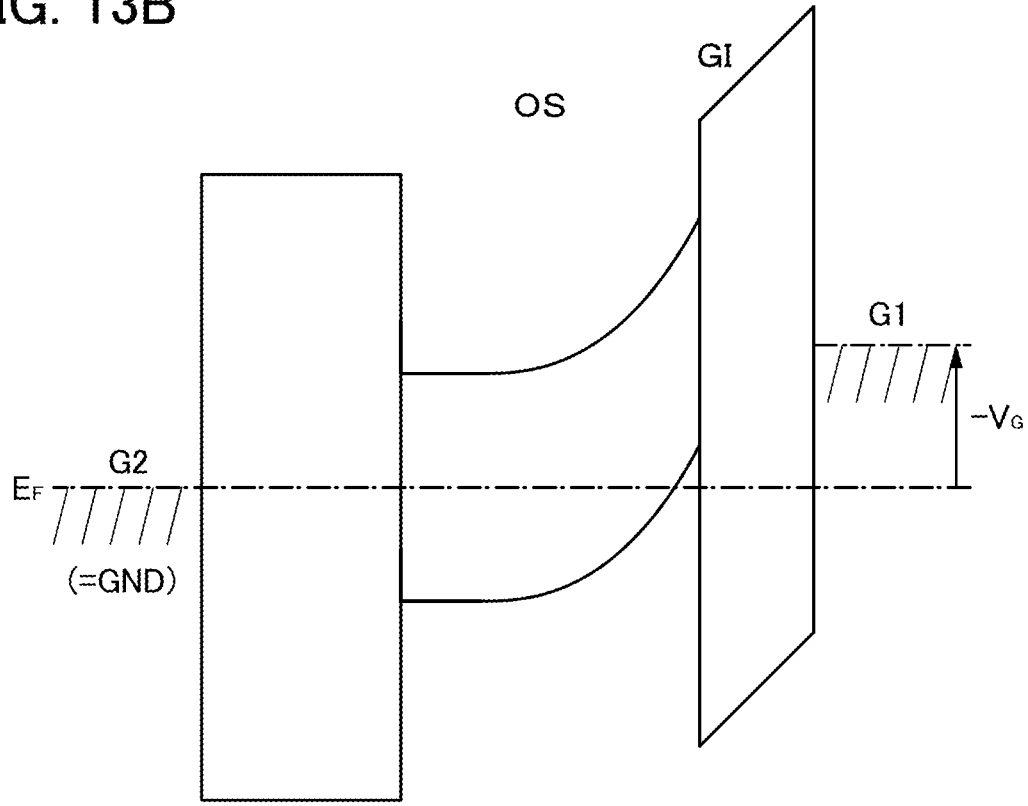
FIG. 13B is an energy band diagram illustrating a state in which negative potential (−VG) is applied to a gate electrode 1001.

FIGS. 13A and 13B are energy band diagrams (schematic diagrams) of a cross section along B-B' in FIG. 11. FIG. 13A illustrates an on state in which a positive potential (+$V_G$) is applied to the gate (G1) and carriers (electrons) flow between the source and the drain. FIG. 13B illustrates an off state in which a negative potential (−$V_G$) is applied to the gate (G1) and minority carriers do not flow.

Figure 14:
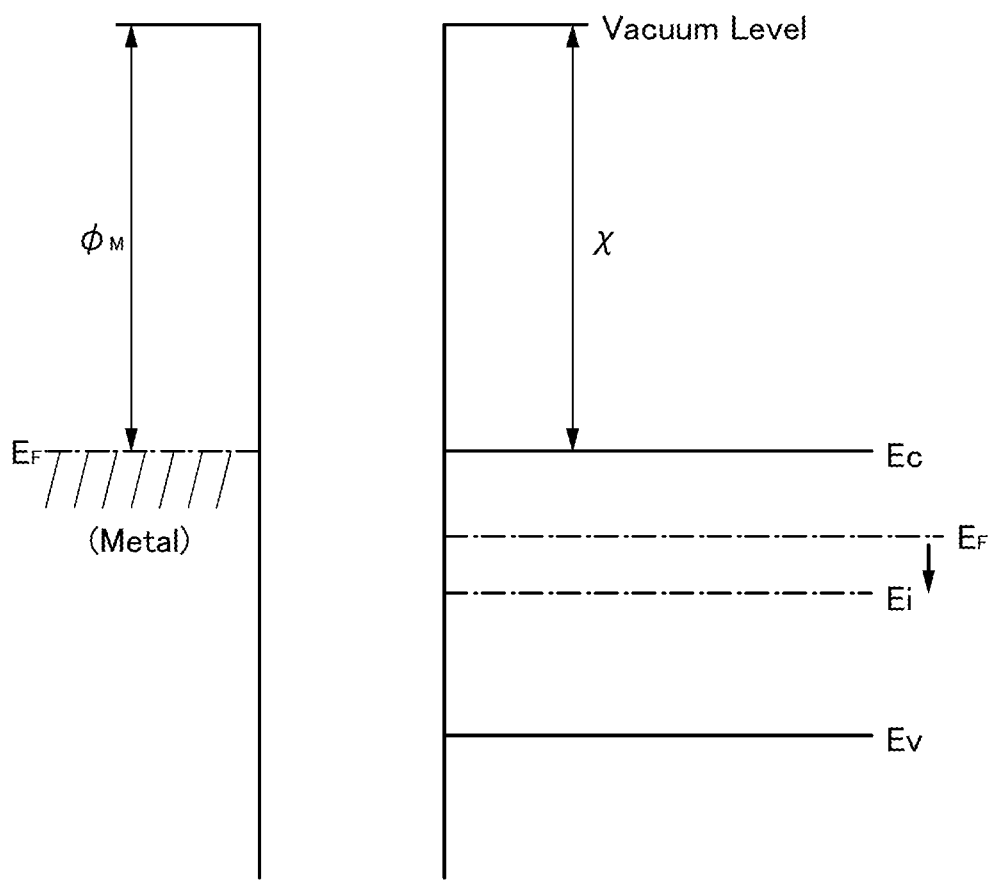
FIG. 14 is an energy band diagram illustrating relationships between a vacuum level and a work function of a metal ($\phi_M$) and between the vacuum level and electron affinity ($\chi$) of an oxide semiconductor.

FIG. 14 illustrates the relationships between the vacuum level and the work function of a metal ($\phi_M$) and between the vacuum level and the electron affinity ($\chi$) of an oxide semiconductor.

Since a metal degenerates, a Fermi level exists in the conduction band. On the other hand, a conventional oxide semiconductor is typically an n-type semiconductor, in which case the Fermi level ($E_F$) is away from the intrinsic Fermi level ($E_i$) located in the middle of a band gap and is located closer to the conduction band. Although it depends on the film formation method, the oxide semiconductor layer contains a certain amount of hydrogen or water, and part of hydrogen or water serves as a donor which supplies electrons, which is known as a factor to make the oxide semiconductor layer n-type.

On the other hand, an oxide semiconductor which is applied to a transistor of the voltage regulator circuit which is an embodiment of the present invention is an intrinsic (i-type) or a substantially intrinsic oxide semiconductor which is obtained by removing hydrogen that is an n-type impurity from an oxide semiconductor and highly purifying the oxide semiconductor such that an impurity other than a main component of the oxide semiconductor is prevented from being contained therein as much as possible. In other words, a feature is that a highly purified i-type (intrinsic) semiconductor or a semiconductor close thereto is obtained not by adding an impurity but by removing an impurity such as hydrogen or water as much as possible. This enables the Fermi level to be at the same level as the intrinsic Fermi level.

In the case where the band gap ($E_g$) of an oxide semiconductor is 3.15 eV, the electron affinity ($\chi$) is said to be 4.3 eV. The work function of titanium (Ti) included in the source electrode and the drain electrode is substantially equal to the electron affinity ($\chi$) of the oxide semiconductor. In that case, a Schottky barrier to electrons is not formed at an interface between the metal and the oxide semiconductor.

In other words, in the case where the work function of the metal and the electron affinity of the oxide semiconductor are equal to each other and the metal and the oxide semiconductor are in contact with each other, an energy band diagram (a schematic diagram) as illustrated in FIG. 12A is obtained.

In FIG. 12B, a black circle (●) represents an electron, and when a positive potential is applied to the drain, the electron is injected into the oxide semiconductor over the barrier (h) and flows toward the drain. In that case, the height of the barrier (h) changes depends on the gate voltage and the drain voltage; in the case where a positive drain voltage is applied, the height of the barrier (h) is smaller than the height of the barrier in FIG. 12A where no voltage is applied, i.e., ½ of the band gap ($E_g$).

At this time, the electron moves at the bottom, which is stable in terms of energy, on the oxide semiconductor side at the interface between the gate insulating film and the highly purified oxide semiconductor as illustrated in FIG. 13A.

In addition, in FIG. 13B, when a negative potential (reverse bias) is applied to the gate electrode 1001, the value of current is extremely close to zero because holes that are minority carriers are substantially zero.

For example, even when a thin film transistor has a channel width W of $1\times10^4$ μm and a channel length of 3 μm, the off-state current is less than or equal to $10^{-13}$ A and a sub-threshold swing (S value) is 0.1 V/dec. (the thickness of the gate insulating film: 100 nm).

Further, the off-state current of a transistor including a highly purified oxide semiconductor is calculated with higher accuracy. The result thereof is described below.

The off-state current of the transistor including a highly purified oxide semiconductor is less than or equal to $1\times10^{-13}$ A that is the detection limit of a measurement device. An element for evaluating the characteristics is manufactured and a value of the off-state current (a value of less than or equal to the detection limit of the measurement device as described above) is obtained with higher accuracy. The result thereof is described below.

First, the element for evaluating the characteristics which is used in a method for measuring current is described with reference to FIG. 15.

Figure 15:
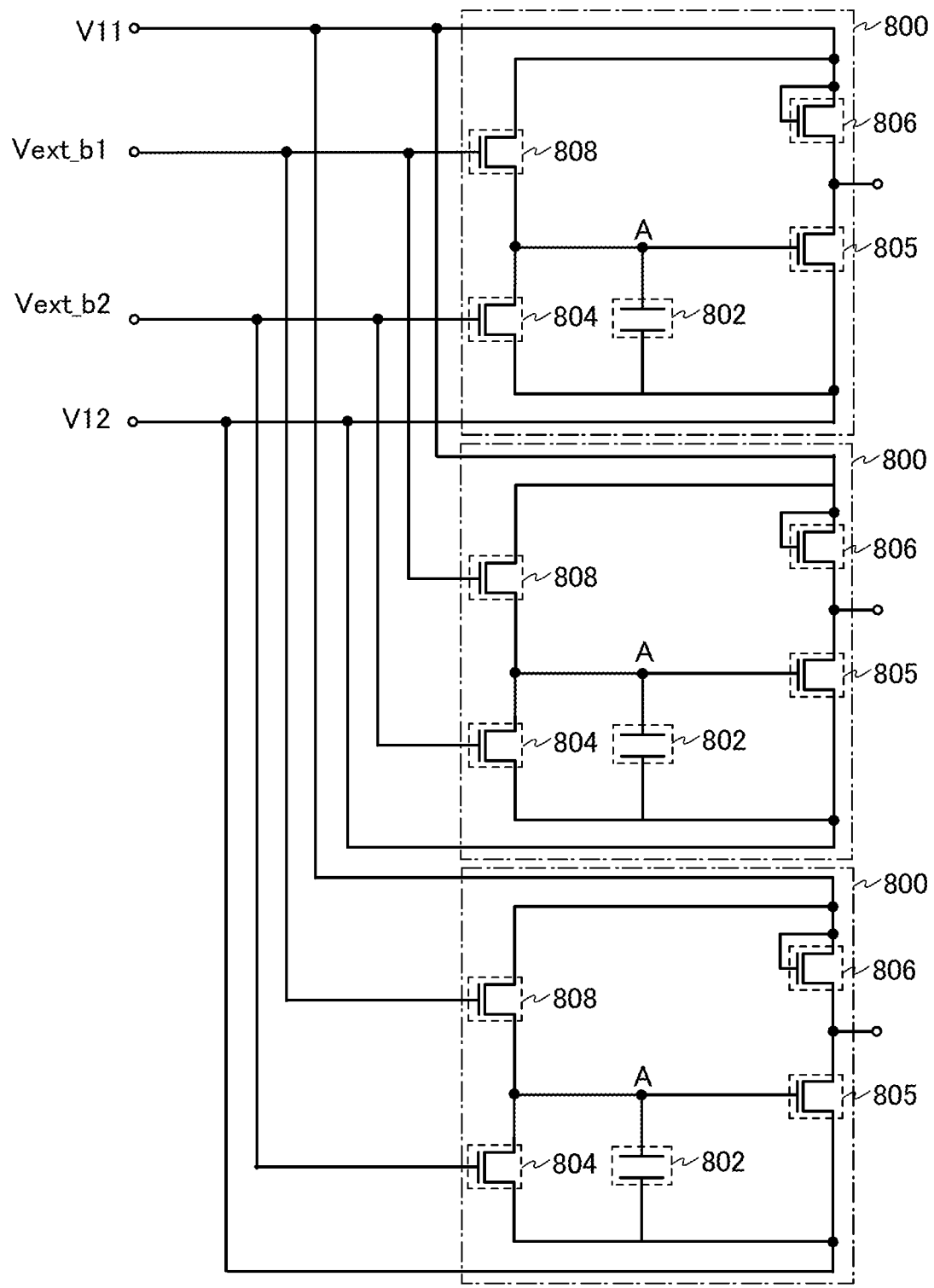
FIG. 15 is a circuit diagram for evaluating the characteristics of a transistor including an oxide semiconductor.

In the element for evaluating the characteristics illustrated in FIG. 15, three measurement systems 800 are electrically connected in parallel. The measurement system 800 includes a capacitor 802, a transistor 804, a transistor 805, a transistor 806, and a transistor 808. For example, a transistor which is manufactured in accordance with Embodiment 4 is used as each of the transistor 804 and the transistor 808.

A voltage V11 is inputted to one of a source and a drain of the transistor 808, and a potential Vext_b1 is inputted to a gate of the transistor 808. The potential Vext_b1 controls the transistor 808 to be turned on or off.

One of a source and a drain of the transistor 804 is electrically connected to the other of the source and the drain of the transistor 808, a voltage V12 is inputted to the other of the source and the drain of the transistor 804, and a potential Vext_b2 is inputted to a gate of the transistor 804. The potential Vext_b2 controls the transistor 804 to be turned on or off.

The capacitor 802 has a first terminal and a second terminal. The first terminal is electrically connected to one of the source and the drain of the transistor 804, and the second terminal is electrically connected to the other of the source and the drain of the transistor 804. A portion where the first terminal of the capacitor 802, the other of the source and the drain of the transistor 808, one of the source and the drain of the transistor 804, and a gate of the transistor 805 are connected to each other is also referred to as a node A.

The voltage V11 is inputted to one of a source and a drain of the transistor 806, and a gate of the transistor 806 is electrically connected to one of the source and the drain thereof.

One of a source and a drain of the transistor 805 is electrically connected to the other of the source and the drain of the transistor 806, and the voltage V12 is inputted to the other of the source and the drain of the transistor 805.

In the measurement system 800, a portion where the other of the source and the drain of the transistor 806 and one of the source and the drain of the transistor 805 are connected to each other is an output terminal. The measurement system 800 outputs a potential Vout through the output terminal.

Next, a method for measuring a current with the use of the measurement system illustrated in FIG. 15 is described.

First, an initializing period in which a potential difference is generated to measure the off-current is briefly described. In the initializing period, the value of the potential Vext_b1 is set to a value with which the transistor 808 is turned on, so that the voltage V11 is applied to the node A. Here, the voltage V11 is a high potential, for example. In addition, the transistor 804 is turned off.

After that, the potential Vext_b1 is set to a value with which the transistor 808 is turned off, and the transistor 808 is turned off. Further, after the transistor 808 is turned off, the potential V11 is set to a low potential. The transistor 804 is kept in an off state. The potential V12 is equal to the potential V11. Through the above, the initializing period is finished. When the initializing period is finished, a potential difference is generated between the node A and the other of the source and the drain of the transistor 804. In addition, a potential difference is generated between the node A and one of the source and the drain of the transistor 808. Accordingly, a small amount of electric charge flows through the transistor 804 and the transistor 808. That is, the off-state current flows.

Next, a measurement period of the off-state current is briefly described. In the measurement period, a potential of one of the source and the drain of the transistor 804 (that is, the potential V12) and a potential of the other of the source and the drain of the transistor 808 (that is, the potential V11) are fixed to be low. On the other hand, in the measurement period, the potential of the node A is not fixed (in a floating state). Accordingly, electric charge flows through the transistor 804, and the amount of electric charge stored in the node A is changed as time passes. The potential of the node A is changed depending on the change in the amount of electric charge stored in the node A. That is, the potential Vout that is an output potential of the output terminal is changed.

Figure 16:
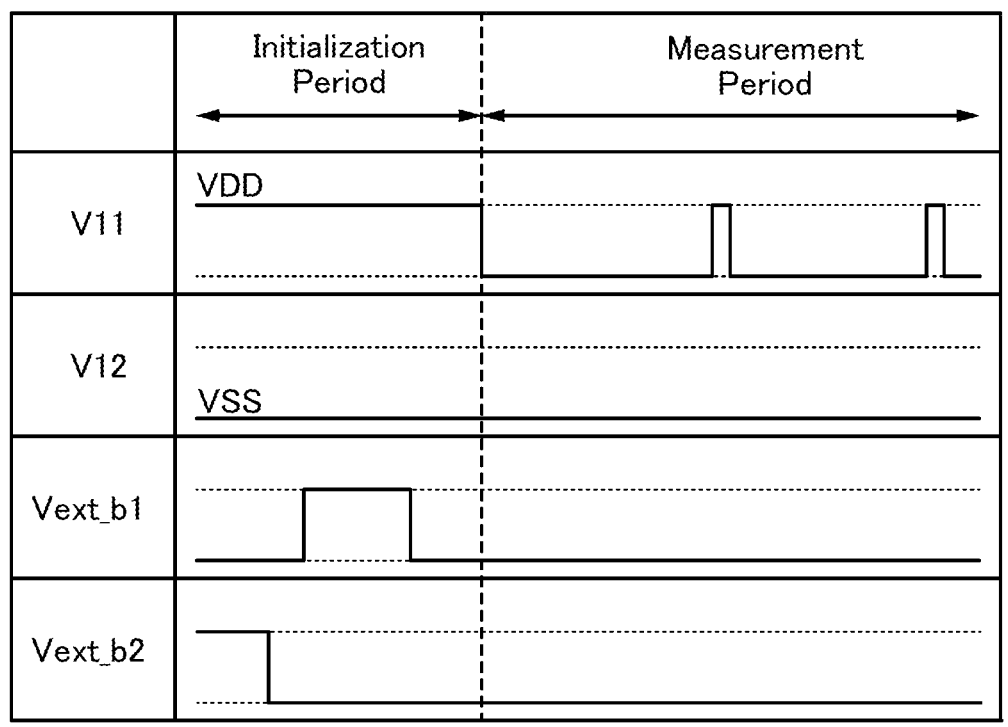
FIG. 16 is a timing chart for evaluating the characteristics of a transistor including an oxide semiconductor.

FIG. 16 illustrates details (a timing chart) of the relationship between the potentials in the initializing period in which the potential difference is generated and the measurement period after the initializing period.

In the initializing period, first, the potential Vext_b2 is set to a potential (a high potential) with which the transistor 804 is turned on. Therefore, the potential of the node A becomes V12, that is, a low potential (such as VSS). After that, the potential Vext_b2 is set to a potential (a low potential) with which the transistor 804 is turned off, so that the transistor 804 is turned off. Next, the potential Vext_b1 is set to a potential (a high potential) with which the transistor 808 is turned on. Accordingly, the potential of the node A becomes V11, that is, a high potential (such as VDD). Then, Vext_b1 is set to a potential with which the transistor 808 is turned off, which places the node A in a floating state and finishes the initializing period.

In the measurement period after the initializing period, the potential V11 and the potential V12 are set such that electric charge flows to the node A or electric charge flows out of the node A. Here, the potential V11 and the potential V12 are low potentials (VSS). Note that at the timing at which the output potential Vout is measured, it is necessary to operate an output circuit and thus temporarily make V11 a high potential (VDD) in some cases. The period in which V11 is a high potential (VDD) is made short such that the measurement is not influenced.

When the potential difference is generated and the measurement period is started as described above, the amount of electric charge stored in the node A is changed as time passes, which changes the potential of the node A. This means that the potential of the gate of the transistor 805 is changed; thus, the output potential Vout of the output terminal is also changed as time passes.

A method for calculating the off-state current on the basis of the obtained output potential Vout is described below.

The relationship between a potential $V_A$ of the node A and the output potential Vout is obtained before calculation of the off-state current. With this, the potential $V_A$ of the node A can be obtained using the output potential Vout. In accordance with the above relationship, the potential $V_A$ of the node A can be expressed as a function of the output potential Vout by the following equation.

$$V_A = F(Vout) \quad \text{[FORMULA 1]}$$

Electric charge QA of the node A can be expressed by the following equation with the use of the potential $V_A$ of the node A, capacitance $C_A$ connected to the node A, and a constant (const). Here, the capacitance $C_A$ connected to the node A is the sum of the capacitance of the capacitor 802 and other capacitance.

$$Q_A = C_A V_A + \text{const} \quad \text{[FORMULA 2]}$$

Current $I_A$ of the node A is a temporal differential of electric charge which flows to the node A (or electric charge which flows out of the node A) and thus is expressed by the following equation.

$$I_A \equiv \frac{\Delta Q_A}{\Delta t} = \frac{C_A \Delta F(Vout)}{\Delta t} \quad \text{[FORMULA 3]}$$

In this manner, the current $I_A$ of the node A can be obtained from the capacitance $C_A$ connected to the node A and the output potential Vout of the output terminal.

In accordance with the above method, it is possible to measure leakage current (off-state current) which flows between a source and a drain of a transistor in an off state.

In this embodiment, the transistor 804 and the transistor 808 were manufactured with the use of a highly purified oxide semiconductor. The ratio of the channel length (L) to the channel width (W) of the transistors was L/W=1:5. In addition, in the measurement systems 800 which are arranged in parallel, values of the capacitance of the capacitors 802 were 100 ff, 1 pF, and 3 pF.

Note that VDD was 5 V and VSS was 0 V in the measurement of this embodiment. In the measurement period, Vout was measured while the potential V11 was basically set to VSS and changed to VDD for 100 msec at intervals of 10 sec to 300 sec. At which was used in calculation of current I which flows through the element was about 30000 sec.

Figure 17:
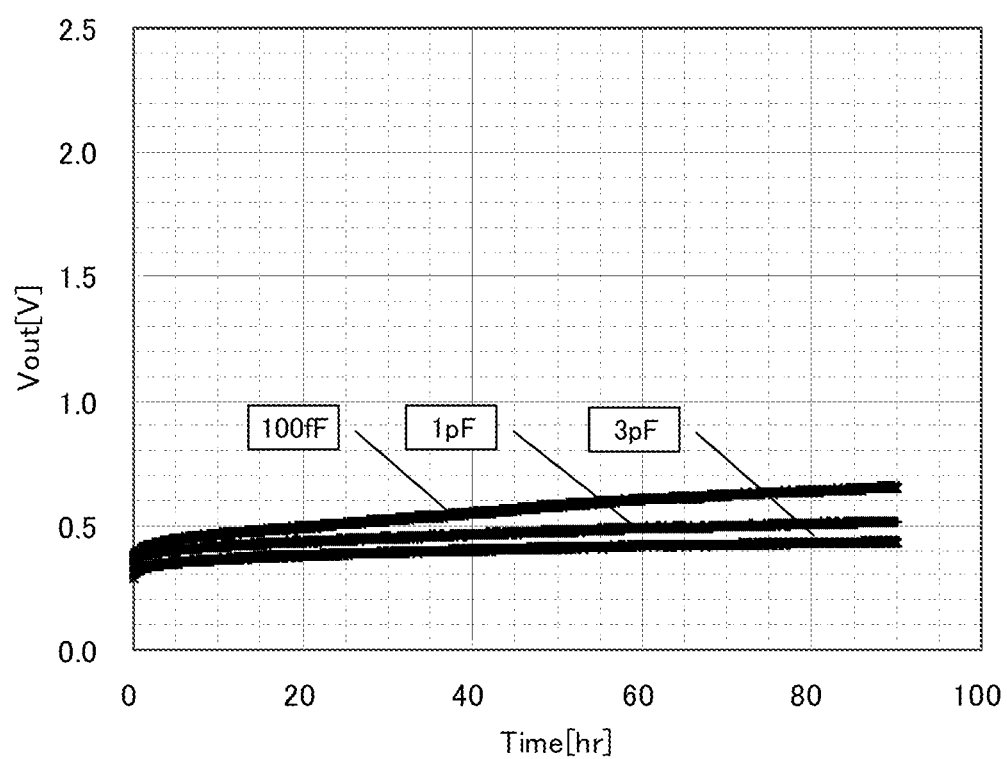
FIG. 17 is a graph showing the characteristics of a transistor including an oxide semiconductor.

FIG. 17 shows the relationship between elapsed time Time in measuring the current and the output potential Vout. The potential change can be observed after about 90 hours.

Figure 18:
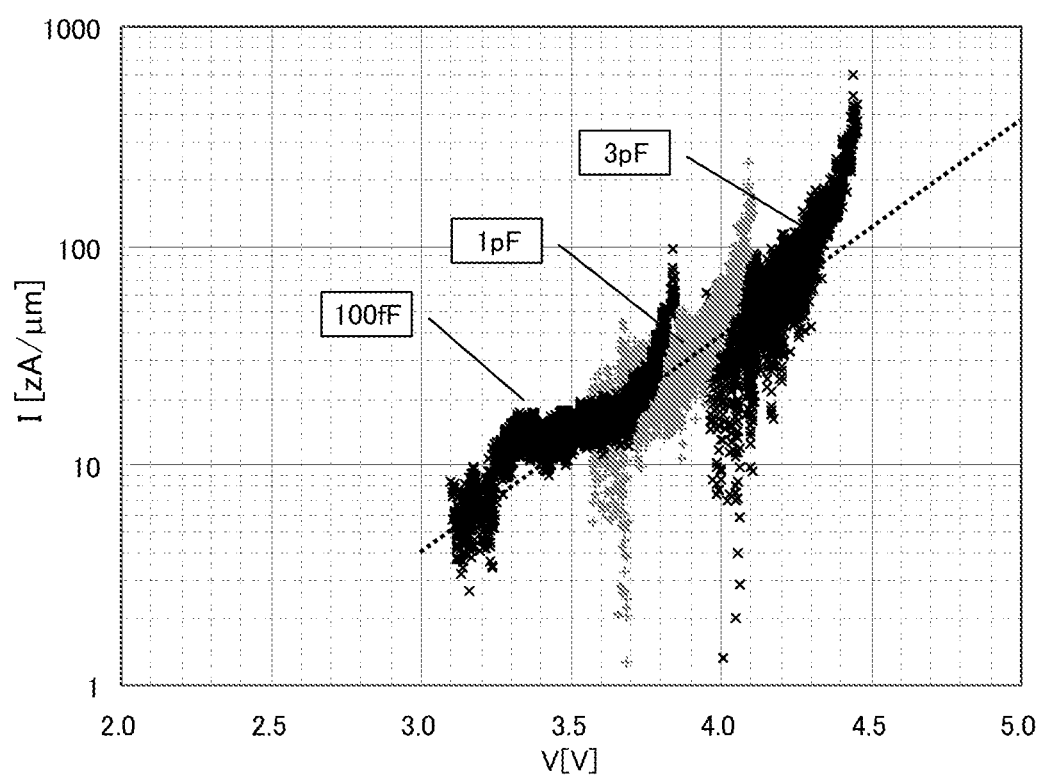
FIG. 18 is a graph showing the characteristics of a transistor including an oxide semiconductor.

FIG. 18 shows the off-state current which is calculated in the above measurement of the current. In FIG. 18, the relationship between source-drain voltage V and off current I is shown. According to FIG. 18, the off-state current was about 40 zA/μm under the condition where the source-drain voltage was 4 V. In addition, the off-state current was less than or equal to 10 zA/μm under the condition where the source-drain voltage was 3.1 V. Note that 1 zA represents $10^{-21}$ A.

Figure 19:
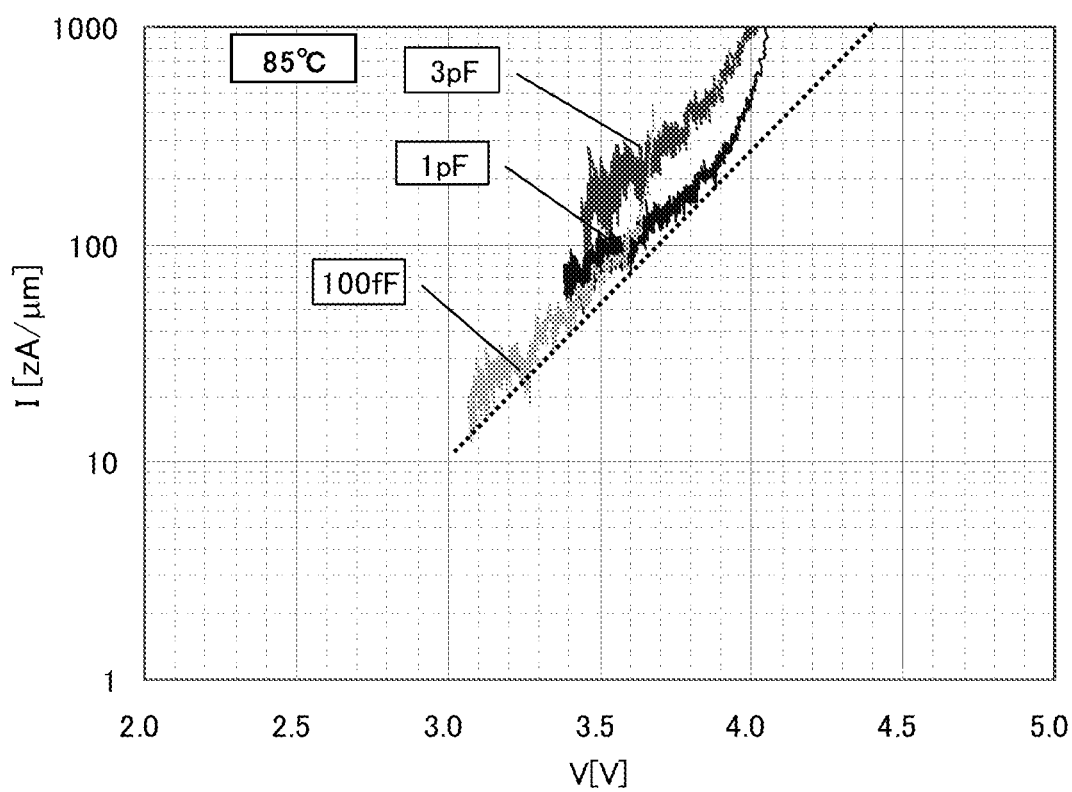
FIG. 19 is a graph showing the characteristics of a transistor including an oxide semiconductor.

FIG. 19 shows the off-state current which is calculated in the above measurement of the current when the temperature of the transistor is 85° C. In FIG. 19, the relationship between source-drain voltage V and off-state current I at 85° C. is shown. According to FIG. 19, the off-state current was less than or equal to 100 zA/μm under the condition where the source-drain voltage was 3.1 V.

As described above, it was confirmed that the off-state current is low enough in a transistor including a highly purified oxide semiconductor.

In this manner, when the oxide semiconductor is highly purified so that impurities except a main component of the oxide semiconductor are contained as little as possible, the operation of the thin film transistor can be favorable.

The capacitor in the voltage regulator circuit according to an embodiment of the present invention can be formed through the same steps as the transistor in this embodiment. When the transistor and the capacitor are formed through the same steps, the number of steps can be reduced.

With the above structure, the transistor can have stable electric characteristics and high reliability. Since leakage current is small in the transistor, by forming the voltage regulator circuit according to an embodiment of the present invention with the use of the transistor, a desired voltage can be achieved more rapidly than before. Further, when the voltage regulator circuit according to an embodiment of the present invention is formed with the use of the transistor, the voltage regulator circuit can have stable electric characteristics and high reliability.

Note that this embodiment can be combined as appropriate with any of the other embodiments.

Embodiment 8

In this embodiment, another example of a thin film transistor which can be used as a transistor included in the voltage regulator circuit disclosed in this specification will be described.

In this embodiment, an embodiment of a thin film transistor and a manufacturing method of the thin film transistor will be described with reference to FIGS. 20A to 20E.

FIGS. 20A to 20E illustrate an example of a cross-sectional structure of a thin film transistor. A transistor 310 illustrated in FIGS. 20A to 20E is one of bottom-gate structures and is also referred to as an inverted staggered thin film transistor.

Although the transistor 310 is a single-gate transistor, a multi-gate transistor including a plurality of channel formation regions may be formed as the transistor of this embodiment.

A manufacturing process of the transistor 310 over a substrate 300 having an insulating surface is described below with reference to FIGS. 20A to 20E.

First, after a conductive film is formed over the substrate 300 having an insulating surface, a gate electrode layer 311 is formed through a first photolithography step. Note that a resist mask may be formed with an ink-jet method. A photomask is not used when the resist mask is formed with an ink-jet method, which results in reducing manufacturing costs.

Although there is no particular limitation on a substrate which can be used for the substrate 300 having an insulating surface, it is necessary that the substrate have at least enough heat resistance to heat treatment in a subsequent step. For example, as the substrate 300, a glass substrate of barium borosilicate glass, aluminoborosilicate glass, or the like can be used.

As the glass substrate, a substrate having a strain point of 730° C. or higher may be used when the temperature of the heat treatment in a subsequent step is high. As a material of the glass substrate, a glass material such as aluminosilicate glass, aluminoborosilicate glass, or barium borosilicate glass is used, for example. Note that by containing a larger amount of barium oxide (BaO) than boron oxide ($B_2O_3$), a glass substrate is heat-resistant and of more practical use. Therefore, a glass substrate containing a larger amount of BaO than $B_2O_3$ is preferably used.

Note that a substrate formed using an insulator, such as a ceramic substrate, a quartz substrate, or a sapphire substrate, may be used as the substrate 300 instead of the glass substrate. Crystallized glass or the like may be used as well. Alternatively, a plastic substrate or the like can be used as appropriate. Further alternatively, as the substrate, a semiconductor substrate of silicon or the like can be used.

Further, an insulating film serving as a base film may be provided between the substrate 300 and the gate electrode layer 311. The base film has a function of preventing diffusion of an impurity element from the substrate 300, and can be formed with a single-layer structure or a stacked structure using one or more of a silicon nitride film, a silicon oxide film, a silicon nitride oxide film, and a silicon oxynitride film.

A conductive film for forming the gate electrode layer 311 can be formed to have a single-layer or a stacked structure using a metal material such as molybdenum, titanium, chromium, tantalum, tungsten, aluminum, copper, neodymium, or scandium, or an alloy material including any of these materials as its main component.

For example, as a two-layer structure of the gate electrode layer 311, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, a two-layer structure of a titanium nitride layer and a molybdenum layer, and a two-layer structure of a tungsten nitride layer and a tungsten layer. As a three-layer structure, a stacked structure of a tungsten layer or a tungsten nitride layer, a layer of an alloy of aluminum and silicon or an alloy of aluminum and titanium, and a titanium nitride layer or a titanium layer is preferable.

Next, a gate insulating layer 302 is formed over the gate electrode layer 311.

An oxide semiconductor (a highly purified oxide semiconductor) which is made to be i-type or substantially i-type by removal of an impurity is highly sensitive to an interface state and interface electric charge; thus, an interface between the oxide semiconductor and a gate insulating layer is important. Therefore, the gate insulating layer (GI) which is in contact with the highly purified oxide semiconductor layer needs high quality.

For example, high-density plasma CVD using microwaves (2.45 GHz) is preferable because a dense high-quality insulating film having high breakdown voltage can be formed. This is because when the highly purified oxide semiconductor layer is closely in contact with the high-quality gate insulating layer, the interface state can be reduced and interface properties can be favorable. Here, as a high-density plasma apparatus, an apparatus which can realize a plasma density of greater than or equal to $1 \times 10^{11}/cm^3$ can be used.

For example, plasma is generated by applying a microwave power of 3 kW to 6 kW so that the insulating film is formed. A monosilane gas ($SiH_4$), nitrous oxide ($N_2O$), and a rare gas are introduced into a chamber as a source gas to generate high-density plasma at a pressure of 10 Pa to 30 Pa so that the insulating film is formed over a substrate having an insulating surface, such as a glass substrate. After that, the supply of a monosilane gas is stopped, and nitrous oxide ($N_2O$) and a rare gas are introduced without exposure to the air, so that a surface of the insulating film is subjected to plasma treatment. The plasma treatment performed on the surface of the insulating film by introducing nitrous oxide ($N_2O$) and a rare gas is performed at least after the insulating film is formed. The flow ratio of a monosilane gas ($SiH_4$) to nitrous oxide ($N_2O$) which are introduced into the chamber is in the range of 1:10 to 1:200. In addition, as a rare gas which is introduced into the chamber, helium, argon, krypton, xenon, or the like can be used. In particular, argon, which is inexpensive, is preferably used.

Needless to say, a different film formation method such as a sputtering method or a plasma CVD method can be used as long as a high-quality insulating film can be formed as the gate insulating layer 302. In addition, any insulating film can be used as long as film quality and properties of an interface with an oxide semiconductor of the gate insulating film are modified by heat treatment performed after film formation. In any case, any insulating film can be used as long as film quality as a gate insulating film is high, interface state density with an oxide semiconductor is reduced, and a favorable interface can be formed.

In a gate-bias thermal stress test (BT test) at 85° C. and $2 \times 10^6$ V/cm for 12 hours, if an impurity has been added to an oxide semiconductor, the bond between the impurity and the main component of the oxide semiconductor is broken by a high electric field (B: bias) and high temperature (T: temperature), so that a generated dangling bond induces a drift in the threshold voltage ($V_{th}$). As a countermeasure against this, in the transistor which is an embodiment of the present invention, the impurity in the oxide semiconductor, especially, hydrogen, water, or the like is removed as much as possible so that the properties of an interface with the gate insulating layer are favorable as described above. Accordingly, it is possible to obtain a thin film transistor which is stable with respect to the BT test.

In addition, the gate insulating layer 302 can be formed with a single-layer structure or a stacked structure using one or more of a silicon oxide layer, a silicon nitride layer, a silicon oxynitride layer, a silicon nitride oxide layer, or an aluminum oxide layer.

In addition, as the gate insulating layer 302, $HfO_x$ or the like can also be used, for example. With the use of $HfO_x$ or the like as the gate insulating layer 302, leakage current that flows from the oxide semiconductor layer side toward the gate electrode can be reduced.

The gate insulating layer 302 can have a structure in which a silicon oxide layer and a silicon nitride layer are stacked. In this embodiment, a silicon oxynitride layer having a thickness of 100 nm is formed with a high-density plasma CVD method with a pressure of 30 Pa and a microwave power of 6 kW, for example. At this time, the flow ratio of a monosilane gas ($SiH_4$) to nitrous oxide ($N_2O$) which are introduced into the chamber is 1:10.

Next, an oxide semiconductor film 330 having a thickness of 2 nm to 200 nm inclusive is formed over the gate insulating layer 302.

Note that before the oxide semiconductor film 330 is formed with a sputtering method, dust on a surface of the gate insulating layer 302 is preferably removed by reverse sputtering in which an argon gas is introduced and plasma is generated. Note that instead of an argon atmosphere, a nitrogen atmosphere, a helium atmosphere, an oxygen atmosphere, or the like may be used.

Figure 20A:
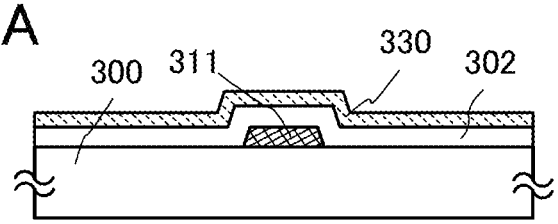
FIGS. 20A to 20E are cross-sectional views illustrating a method for manufacturing a transistor.
Figure 20B:
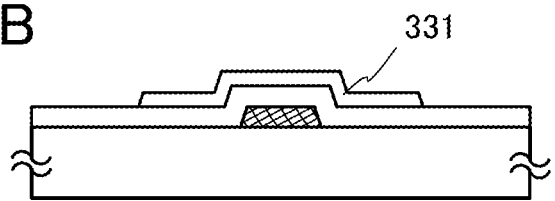
Figure 20C:
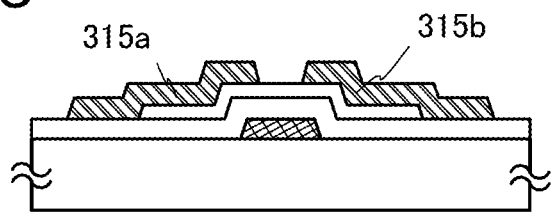
Figure 20D:
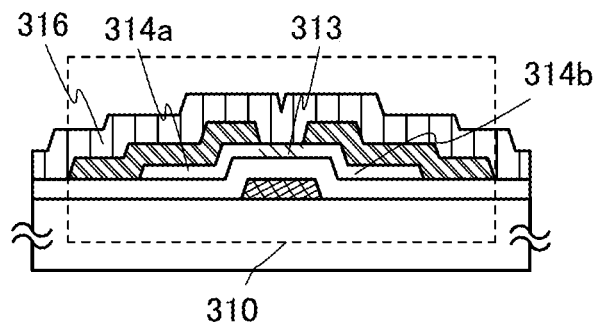
Figure 20E:
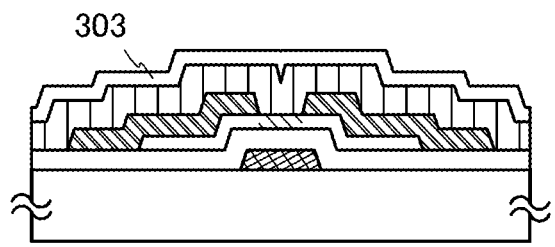
Figure 21A:
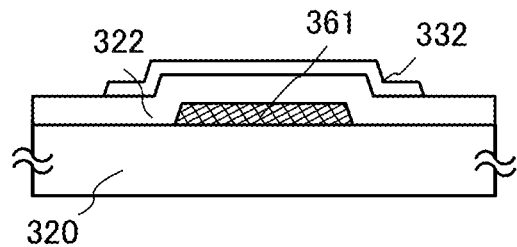
FIGS. 21A to 21D are cross-sectional views illustrating a method for manufacturing a transistor.
Figure 21B:
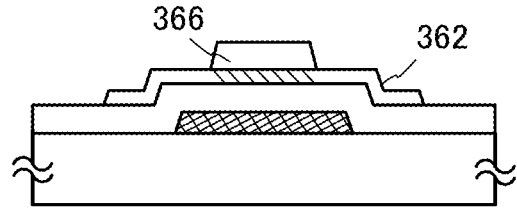
Figure 21C:
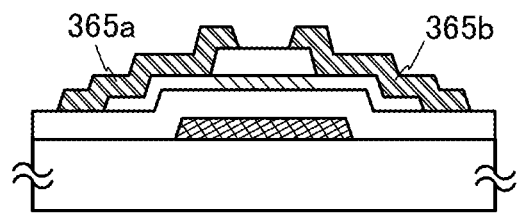
Figure 21D:
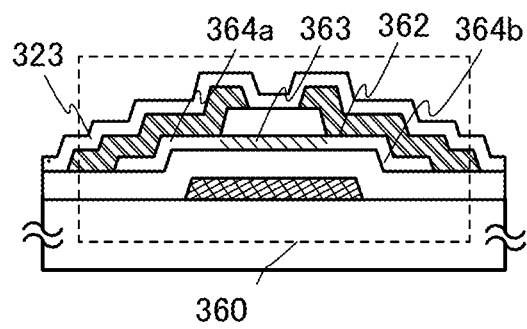

As the oxide semiconductor film 330, any of the following oxide semiconductor films is applied: an In—Ga—Zn—O-based oxide semiconductor film; an In—Sn—Zn—O-based oxide semiconductor film; an In—Al—Zn—O-based oxide semiconductor film; a Sn—Ga—Zn—O-based oxide semiconductor film; an Al—Ga—Zn—O-based oxide semiconductor film; an Sn—Al—Zn—O-based oxide semiconductor film; an In—Zn—O-based oxide semiconductor film; a Sn—Zn—O-based oxide semiconductor film; an Al—Zn—O-based oxide semiconductor film; an In—O-based oxide semiconductor film; an In—Sn—O-based oxide semiconductor film; a Sn—O-based oxide semiconductor film; and a Zn—O-based oxide semiconductor film. In this embodiment, the oxide semiconductor film 330 is formed with a sputtering method with the use of an In—Ga—Zn—O based metal oxide target. A cross-sectional view of this stage is illustrated in FIG. 20A. Alternatively, the oxide semiconductor film 330 can be formed with a sputtering method under a rare gas (typically, argon) atmosphere, an oxygen atmosphere, or an atmosphere of a rare gas (typically, argon) and oxygen. In the case where a sputtering method is employed, a film may be formed with a target including $SiO_2$ at 2 wt % to 10 wt % inclusive.

As a target for forming the oxide semiconductor film 330 with a sputtering method, a metal oxide target containing zinc oxide as its main component can be used. As another example of the metal oxide target, for example, a metal oxide target with a composition ratio of $In_2O_3:Ga_2O_3:ZnO=1:1:1$ (molar ratio) can be used. Without limitation to the above target, for example, a metal oxide target with a composition ratio of $In_2O_3:Ga_2O_3:ZnO=1:1:2$ (molar ratio) may be used. The filling factor of the metal oxide target to be manufactured is 90% to 100% inclusive, preferably, 95% to 99.9% inclusive. With the use of a metal oxide target with high filling factor, the formed oxide semiconductor film has high density.

It is preferable to use a high-purity gas from which an impurity such as hydrogen, water, a hydroxyl group, or hydride is removed to a concentration of several ppm or a concentration of several ppb, as a sputtering gas when the oxide semiconductor film 330 is formed.

The substrate is held in a treatment chamber kept under reduced pressure, and the substrate temperature is set to 100° C. to 600° C. inclusive, preferably, 200° C. to 400° C. inclusive. Film formation is performed while the substrate is heated, whereby the concentration of an impurity contained in the formed oxide semiconductor layer can be reduced. Further, damages due to sputtering can be reduced. Then, a sputtering gas from which hydrogen and moisture are removed is introduced into the treatment chamber from which remaining moisture is being removed, and the oxide semiconductor film 330 is formed over the substrate 300 with the use of a metal oxide as a target. In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the film formation chamber which is evacuated with the cryopump, for example, a hydrogen atom, a compound containing a hydrogen atom, such as water ($H_2O$), (more preferably, also a compound containing a carbon atom), and the like are removed, whereby the concentration of an impurity in the oxide semiconductor film formed in the film formation chamber can be reduced.

As an example of film formation conditions, the following conditions are employed: the distance between the substrate and the target is 100 mm, the pressure is 0.6 Pa, the direct current (DC) power source is 0.5 kW, and an oxygen atmosphere (the proportion of the oxygen flow is 100%) is used. It is preferable that a pulsed direct-current (DC) power source be used because powder substances generated in film formation can be reduced and the film thickness can be uniform. The oxide semiconductor film preferably has a thickness of 5 nm to 30 nm inclusive. Note that there is a difference in an appropriate thickness, which depends on an oxide semiconductor material, and the thickness may be set as appropriate in a manner which depends on the material.

Next, the oxide semiconductor film 330 is processed into an island-shaped oxide semiconductor layer 331 through a second photolithography step. Further, a resist mask for forming the island-shaped oxide semiconductor layer 331 may be formed with an ink-jet method. A photomask is not used when the resist mask is formed with an ink-jet method, which results in reducing manufacturing costs.

Next, the oxide semiconductor layer is subjected to first heat treatment. With the first heat treatment, dehydration or dehydrogenation of the oxide semiconductor layer can be performed. The temperature of the first heat treatment is higher than or equal to 400° C. and lower than or equal to 750° C., preferably, higher than or equal to 400° C. and lower than the strain point of the substrate. Here, the substrate is introduced in an electric furnace which is a kind of heat treatment apparatus and heat treatment is performed on the oxide semiconductor layer under a nitrogen atmosphere at 450° C. for one hour, and then water and hydrogen are prevented from entering the oxide semiconductor layer. In this manner, an oxide semiconductor layer 331 is obtained (see FIG. 20B).

Note that the heat treatment apparatus is not limited to an electric furnace, and may have a device for heating an object to be processed by heat conduction or heat radiation from a heater such as a resistance heater. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus with which heat treatment is performed using a high-temperature gas. As the gas, an inert gas which does not react with an object to be processed by heat treatment, like nitrogen or a rare gas such as argon is used.

For example, as the first heat treatment, GRTA may be performed as follows. The substrate is transferred and put in an inert gas which has been heated to a high temperature of 650° C. to 700° C., heated for several minutes, and transferred and taken out of the inert gas which has been heated to a high temperature. GRTA enables a high-temperature heat treatment for a short time.

Note that in the first heat treatment, it is preferable that water, hydrogen, and the like be not contained in nitrogen or a rare gas such as helium, neon, or argon. In addition, the purity of nitrogen or a rare gas such as helium, neon, or argon, which is introduced into the heat treatment apparatus, is preferably 6N (99.9999%) or more, more preferably, 7N (99.99999%) or more (i.e., impurity concentration is preferably 1 ppm or lower, more preferably, 0.1 ppm or lower).

The oxide semiconductor layer 331 becomes a microcrystalline layer or a polycrystalline layer by crystallization in some cases in a manner which depends on a condition of the first heat treatment or a material of the oxide semiconductor film. For example, the oxide semiconductor layer may be crystallized to become microcrystalline semiconductor layer having a degree of crystallization of 90% or more, or 80% or more. Further, in accordance with conditions of the first heat treatment or a material of the oxide semiconductor layer, the oxide semiconductor layer may be an amorphous oxide semiconductor layer which does not contain crystalline components. The oxide semiconductor layer may become an oxide semiconductor layer in which a microcrystalline portion (with a grain diameter of 1 nm to 20 nm inclusive, typically 2 nm to 4 nm inclusive) is mixed into an amorphous oxide semiconductor.

In addition, the first heat treatment can also be performed on the oxide semiconductor film 330 before being processed into the island-shaped oxide semiconductor layer. In that case, the substrate is taken out from the heat apparatus after the first heat treatment, and then a photolithography step is performed.

The heat treatment having an effect of dehydration or dehydrogenation with respect to the oxide semiconductor layer may be performed at any of the following timings: after the oxide semiconductor layer is formed; after a source electrode and a drain electrode are formed over the oxide semiconductor layer; and after a protective insulating film is formed over the source electrode and the drain electrode.

Further, in the case where a contact hole is formed in the gate insulating layer 302, the step may be performed before or after the dehydration or dehydrogenation of the oxide semiconductor film 330.

Note that the etching of the oxide semiconductor film may be dry etching, without limitation to wet etching.

The etching conditions (such as an etchant, etching time, and temperature), which depend on the material, are adjusted as appropriate so that the material can be etched into a desired shape.

Next, a conductive film is formed over the gate insulating layer 302 and the oxide semiconductor layer 331. For example, the conductive film may be formed with a sputtering method or a vacuum evaporation method. As a material of the conductive film, there are an element selected from Al, Cr, Cu, Ta, Ti, Mo, and W, an alloy including any of the above elements as its component, an alloy film including a combination of any of the above elements, and the like. Alternatively, one or more materials selected from manganese, magnesium, zirconium, beryllium, and yttrium may be used. The conductive film may have a single-layer structure or a stacked structure of two or more layers. For example, a single-layer structure of an aluminum film including silicon, a two-layer structure in which a titanium film is stacked over an aluminum film, a three-layer structure in which a titanium film, an aluminum film, and a titanium film are stacked in this order, and the like can be given. Alternatively, a film, an alloy film, or a nitride film which contains aluminum (Al) and one or a plurality of elements selected from titanium (Ti), tantalum (Ta), tungsten (W), molybdenum (Mo), chromium (Cr), neodymium (Nd), and scandium (Sc) may be used.

If heat treatment is performed after formation of the conductive film, it is preferable that the conductive film have heat resistance enough to withstand the heat treatment.

A resist mask is formed over the conductive film through a third photolithography step. The conductive film is selectively etched, so that a source electrode layer 315a and a drain electrode layer 315b are formed. Then, the resist mask is removed (see FIG. 20C).

Ultraviolet, a KrF laser beam, or an ArF laser beam is used for light exposure for forming the resist mask in the third photolithography step. A channel length L of the thin film transistor to be formed later depends on a width of a distance between a bottom portion of the source electrode layer and a bottom portion of the drain electrode layer which are adjacent to each other over the oxide semiconductor layer 331. Note that when light exposure is performed in the case where the channel length L is shorter than 25 nm, extreme ultraviolet with extremely short wavelengths of several nanometers to several tens of nanometers is used for light exposure for forming the resist mask in the third photolithography step. Light exposure with extreme ultraviolet leads to a high resolution and a large depth of focus. Accordingly, the channel length L of the thin film transistor to be formed later can be set to 10 nm to 1000 nm inclusive. Thus, the operation speed of a circuit can be increased, and further, an off-state current is significantly small, so that low power consumption can be achieved.

Note that each material and etching conditions of the conductive film and the oxide semiconductor film are adjusted as appropriate so that the oxide semiconductor layer 331 is not removed at the time of etching the conductive film.

In this embodiment, a titanium film is used as the conductive film, an In—Ga—Zn—O-based oxide semiconductor is used as the oxide semiconductor layer 331, and an ammonia hydrogen peroxide solution (a mixture of ammonia, water, and a hydrogen peroxide solution) is used as an etchant.

In the third photolithography step, only part of the oxide semiconductor layer 331 may be etched off, whereby an oxide semiconductor layer having a groove (a depressed portion) might be formed. In addition, the resist mask for forming the source electrode layer 315a and the drain electrode layer 315b may be formed with an ink-jet method. A photomask is not used when the resist mask is formed with an ink-jet method, which results in reducing manufacturing costs.

Further, oxide conductive layers may be formed between the oxide semiconductor layer and the source and drain electrode layers. The oxide conductive layers and a conductive layer for forming the source and drain electrode layers can be formed successively. The oxide conductive layers can function as a source region and a drain region.

When the oxide conductive layers are provided as a source region and a drain region between the oxide semiconductor layer and the source and drain electrode layers, the resistance of the source region and the drain region can be decreased and high-speed operation of the transistor can be realized.

In order to reduce the number of photomasks and steps in a photolithography step, etching may be performed with the use of a resist mask formed using a multi-tone mask which is a light-exposure mask through which light is transmitted so as to have a plurality of intensities. Since a resist mask formed using a multi-tone mask has a plurality of thicknesses and can be further changed in shape by performing etching, the resist mask can be used in a plurality of etching steps to provide different patterns. Therefore, a resist mask corresponding to at least two kinds of different pattern can be formed by using one multi-tone mask. Thus, the number of light-exposure masks can be reduced and the number of corresponding photolithography steps can also be reduced, whereby simplification of a process can be realized.

Next, plasma treatment using a gas such as $N_2O$, $N_2$, or Ar is performed. This plasma treatment removes water or the like adsorbed on a surface of the oxide semiconductor layer which is exposed. In addition, plasma treatment may be performed using a mixed gas of oxygen and argon.

After the plasma treatment, an oxide insulating layer 316 serving as a protective insulating film, which is in contact with part of the oxide semiconductor layer, is formed.

The oxide insulating layer 316 can be formed to a thickness at least 1 nm using a sputtering method or the like as appropriate, which is a method with which an impurity such as water or hydrogen does not enter the oxide insulating layer 316. When hydrogen is contained in the oxide insulating layer 316, there is a concern that entry of the hydrogen to the oxide semiconductor layer or extraction of oxygen in the oxide semiconductor layer by the hydrogen is caused, thereby making the resistance of the back channel of the oxide semiconductor layer low (to have an n-type conductivity), so that a parasitic channel might be formed. Therefore, it is important that a formation method in which hydrogen is not used is employed such that the oxide insulating layer 316 contains as little hydrogen as possible.

In this embodiment, a silicon oxide film having a thickness of 200 nm is formed as the oxide insulating layer 316 with a sputtering method. The substrate temperature in film formation may be room temperature to 300° C. inclusive, and is set at 100° C. in this embodiment. The silicon oxide film can be formed with a sputtering method under a rare gas (typically, argon) atmosphere, an oxygen atmosphere, or an atmosphere of a rare gas (typically, argon) and oxygen. Moreover, a silicon oxide target or a silicon target can be used as a target. For example, the silicon oxide film can be formed using a silicon target with a sputtering method under an atmosphere of oxygen and nitrogen. The oxide insulating layer 316 which is formed in contact with the oxide semiconductor layer in a region which comes to be in an oxygen-deficient state and thus has a lower resistance, that is, comes to be n-type is formed using an inorganic insulating film that does not contain impurities such as moisture, a hydrogen ion, and OH⁻ and blocks entry of such impurities from the outside, typically, a silicon oxide film, a silicon oxynitride film, an aluminum oxide film, or an aluminum oxynitride film.

In that case, the oxide insulating layer 316 is preferably formed removing moisture remaining in the treatment chamber. This is for preventing hydrogen, a hydroxyl group, or moisture from being contained in the oxide semiconductor layer 331 and the oxide insulating layer 316.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the film formation chamber which is evacuated with the cryopump, for example, a hydrogen atom, a compound containing a hydrogen atom, such as water ($H_2O$), and the like are removed, whereby the concentration of an impurity contained in the oxide insulating layer 316 formed in the film formation chamber can be reduced.

It is preferable to use a high-purity gas from which an impurity such as hydrogen, water, a hydroxyl group, or hydride is removed to a concentration of several ppm or a concentration of several ppb, as a sputtering gas when the oxide insulating layer 316 is formed.

Next, second heat treatment (preferably, at 200° C. to 400° C. inclusive, e.g., 250° C. to 350° C. inclusive) is performed under an inert gas atmosphere or an oxygen gas atmosphere. For example, the second heat treatment is performed at 250° C. for one hour under a nitrogen atmosphere. With the second heat treatment, heat is applied while the oxide semiconductor layer is in contact with the oxide insulating layer 316.

Through the above process, heat treatment for dehydration or dehydrogenation is performed on the oxide semiconductor film after film formation to lower resistance, and then, part of the oxide semiconductor film is selectively made into an oxygen-excess state. As a result, a channel formation region 313 which overlaps with the gate electrode layer 311 becomes i-type, and a high-resistance source region 314a which overlaps with the source electrode layer 315a and a high-resistance drain region 314b which overlaps with the drain electrode layer 315b are formed in a self-aligned manner. Through the above-described process, the transistor 310 is formed (see FIG. 20D).

Heat treatment at 100° C. to 200° C. inclusive for one hour to 30 hours inclusive in an air atmosphere may be further performed. In this embodiment, the heat treatment is performed at 150° C. for 10 hours. This heat treatment may be performed at a fixed heating temperature. Alternatively, the following change in the heating temperature may be performed plural times repeatedly: the heating temperature is increased from room temperature to a temperature of 100° C. to 200° C. inclusive and then decreased to room temperature. This heat treatment may be performed before the formation of the oxide insulating film under a reduced pressure. Under the reduced pressure, the heat treatment time can be shortened. With this heat treatment, a normally-off thin film transistor can be obtained. Thus, reliability of the thin film transistor can be improved. Further, when a silicon oxide layer containing a number of defects is used as the oxide insulating layer, the impurity contained in the oxide semiconductor layer can be reduced more effectively by the above heat treatment.

By the formation of the high-resistance drain region 314b (or the high-resistance source region 314a) in part of the oxide semiconductor layer, which overlaps with the drain electrode layer 315b (or the source electrode layer 315a), reliability of the thin film transistor can be improved. Specifically, by forming the high-resistance drain region 314b, a structure can be attained in which conductivity can be varied stepwise from the drain electrode layer 315b to the high-resistance drain region 314b, and the channel formation region 313. Thus, in the case where the transistor operates with the drain electrode layer 315b connected to a wiring for supplying a high power source potential VDD, the high-resistance drain region 314b serves as a buffer and a high electric field is not applied locally even if the high electric field is applied between the gate electrode layer 311 and the drain electrode layer 315b, so that the breakdown voltage of the transistor can be improved.

Further, the high-resistance source region or the high-resistance drain region in the oxide semiconductor layer is formed in the entire thickness direction in the case where the thickness of the oxide semiconductor layer is less than or equal to 15 nm. In the case where the thickness of the oxide semiconductor layer is 30 nm to 50 nm inclusive, in part of the oxide semiconductor layer, that is, in a region in the oxide semiconductor layer which is in contact with the source electrode layer or the drain electrode layer and the vicinity thereof, the resistance is reduced and a region in the oxide semiconductor layer, which is close to the gate insulating film, can be made to be i-type.

A protective insulating layer may be further formed over the oxide insulating layer 316. For example, a silicon nitride film is formed with an RF sputtering method. An RF sputtering method is preferable as a formation method of the protective insulating layer because of high productivity. The protective insulating layer is formed using an inorganic insulating film that does not contain impurities such as moisture, a hydrogen ion, and OH and blocks entry of such impurities from the outside, typically a silicon nitride film, an aluminum nitride film, a silicon nitride oxide film, an aluminum nitride oxide film, or the like is used. In this embodiment, a protective insulating layer 303 is formed using a silicon nitride film as a protective insulating layer (see FIG. 20E).

In this embodiment, as the protective insulating layer 303, a silicon nitride film is formed in the following manner: the substrate 300 over which layers up to the oxide insulating layer 316 are formed is heated at a temperature of 100° C. to 400° C.; a sputtering gas containing high-purity nitrogen from which hydrogen and moisture are removed is introduced; and a silicon semiconductor target is used. In this case also, it is preferable that residual moisture be removed from the treatment chamber in the formation of the protective insulating layer 303 in a manner similar to that of the oxide insulating layer 316.

In addition, a planarizing insulating layer for planarization may be provided over the protective insulating layer 303.

Further, a conductive layer which overlaps with the oxide semiconductor layer may be provided over the protective insulating layer 303 (over the planarizing insulating layer in the case where the planarizing insulating layer is provided). The conductive layer may have the same potential as or have potential different from that of the gate electrode layer 311 of the transistor 310 and can function as a second gate electrode layer. The potential of the conductive layer may be a fixed potential such as GND or 0 V.

Electric characteristics of the thin film transistor 310 can be controlled by the conductive layer.

The capacitor in the voltage regulator circuit according to an embodiment of the present invention can be formed through the same steps as the transistor in this embodiment. When the transistor and the capacitor are formed through the same steps, the number of steps can be reduced.

With the above structure, the transistor can have stable electric characteristics and high reliability. Since leakage current is small in the transistor, by forming the voltage regulator circuit according to an embodiment of the present invention with the use of the transistor, a desired voltage can be achieved more rapidly than before. Further, when the voltage regulator circuit according to an embodiment of the present invention is formed with the use of the transistor, the voltage regulator circuit can have stable electric characteristics and high reliability.

Note that this embodiment can be combined as appropriate with any of the other embodiments.

Embodiment 9

In this embodiment, another example of a thin film transistor which can be used as a transistor included in the voltage regulator circuit disclosed in this specification will be described.

In this embodiment, an embodiment of a thin film transistor and a manufacturing method of the thin film transistor will be described with reference to FIGS. 21A to 21D.

FIGS. 21A to 21D illustrate an example of a cross-sectional structure of a thin film transistor. A transistor 360 illustrated in FIGS. 21A to 21D is one of bottom-gate structures called a channel-protective type (channel-stop type) and is also referred to as an inverted staggered thin film transistor.

Although the transistor 360 is a single-gate transistor, a multi-gate transistor including a plurality of channel formation regions may be formed as the transistor of this embodiment.

A manufacturing process of the transistor 360 over a substrate 320 having an insulating surface is described below with reference to FIGS. 21A to 21D.

First, after a conductive film is formed over the substrate 320 having an insulating surface, a gate electrode layer 361 is formed through a first photolithography step. Note that a resist mask may be formed with an ink-jet method. A photomask is not used when the resist mask is formed with an ink-jet method, which results in reducing manufacturing costs.

A conductive film for forming the gate electrode layer 361 can be formed to have a single-layer or a stacked structure using a metal material such as molybdenum, titanium, chromium, tantalum, tungsten, aluminum, copper, neodymium, or scandium, or an alloy material including any of these materials as its main component.

Next, a gate insulating layer 322 is formed over the gate electrode layer 361.

An oxide semiconductor (a highly purified oxide semiconductor) which is made to be i-type or substantially i-type by removal of an impurity is highly sensitive to an interface state and interface electric charge; thus, an interface between the oxide semiconductor and a gate insulating layer is important. Therefore, the gate insulating layer (GI) which is in contact with the highly purified oxide semiconductor layer needs high quality.

For example, high-density plasma CVD using microwaves (2.45 GHz) is preferable because a dense high-quality insulating film having high breakdown voltage can be formed. This is because when the highly purified oxide semiconductor layer is closely in contact with the high-quality gate insulating layer, the interface state can be reduced and interface properties can be favorable. Here, as a high-density plasma apparatus, an apparatus which can realize a plasma density of greater than or equal to $1 \times 10^{11}/cm^3$ can be used.

For example, plasma is generated by applying a microwave power of 3 kW to 6 kW so that the insulating film is formed. A monosilane gas ($SiH_4$), nitrous oxide ($N_2O$), and a rare gas are introduced into a chamber as a source gas to generate high-density plasma at a pressure of 10 Pa to 30 Pa so that the insulating film is formed over a substrate having an insulating surface, such as a glass substrate. After that, the supply of a monosilane gas is stopped, and nitrous oxide ($N_2O$) and a rare gas are introduced without exposure to the air, so that a surface of the insulating film is subjected to plasma treatment. The plasma treatment performed on the surface of the insulating film by introducing nitrous oxide ($N_2O$) and a rare gas is performed at least after the insulating film is formed. The flow ratio of a monosilane gas ($SiH_4$) to nitrous oxide ($N_2O$) which are introduced into the chamber is in the range of 1:10 to 1:200. In addition, as a rare gas which is introduced into the chamber, helium, argon, krypton, xenon, or the like can be used. In particular, argon, which is inexpensive, is preferably used.

Needless to say, a different film formation method such as a sputtering method or a plasma CVD method can be used as long as a high-quality insulating film can be formed as the gate insulating layer 322. In addition, any insulating film can be used as long as film quality and properties of an interface with an oxide semiconductor of the gate insulating film are modified by heat treatment performed after film formation. In any case, any insulating film can be used as long as film quality as a gate insulating film is high, interface state density with an oxide semiconductor is reduced, and a favorable interface can be formed.

In a gate-bias thermal stress test (BT test) at 85° C. and $2 \times 10^6$ V/cm for 12 hours, if an impurity has been added to an oxide semiconductor, the bond between the impurity and the main component of the oxide semiconductor is broken by a high electric field (B: bias) and high temperature (T: temperature), so that a generated dangling bond induces a drift in the threshold voltage ($V_{th}$). As a countermeasure against this, in the transistor which is an embodiment of the present invention, the impurity in the oxide semiconductor, especially, hydrogen, water, or the like is removed as much as possible so that the properties of an interface with the gate insulating layer are favorable as described above. Accordingly, it is possible to obtain a thin film transistor which is stable with respect to the BT test.

The gate insulating layer 322 can be formed with a single-layer structure or a stacked structure using one or more of a silicon oxide layer, a silicon nitride layer, a silicon oxynitride layer, a silicon nitride oxide layer, or an aluminum oxide layer.

In addition, as the gate insulating layer 322, $HfO_x$ or the like can also be used, for example. With the use of $HfO_x$ or the like as the gate insulating layer 322, leakage current that flows from the oxide semiconductor layer side toward the gate electrode can be reduced.

The gate insulating layer 322 can have a structure in which a silicon oxide layer and a silicon nitride layer are stacked. In this embodiment, a silicon oxynitride layer having a thickness of 100 nm is formed with a high-density plasma CVD method with a pressure of 30 Pa and a microwave power of 6 kW, for example. At this time, the flow ratio of a monosilane gas ($SiH_4$) to nitrous oxide ($N_2O$) which are introduced into the chamber is 1:10.

Next, an oxide semiconductor film having a thickness of 2 nm to 200 nm inclusive is formed over the gate insulating layer 322. Then, the oxide semiconductor film is processed into an island-shaped oxide semiconductor layer through a second photolithography step. In this embodiment, the oxide semiconductor film is formed with a sputtering method with the use of an In—Ga—Zn—O based metal oxide target.

In that case, the oxide semiconductor film is preferably formed removing moisture remaining in the treatment chamber. This is for preventing hydrogen, a hydroxyl group, or moisture from being contained in the oxide semiconductor film.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the film formation chamber which is evacuated with the cryopump, for example, a hydrogen atom, a compound containing a hydrogen atom, such as water ($H_2O$), and the like are removed, whereby the concentration of an impurity contained in the oxide semiconductor film formed in the film formation chamber can be reduced.

It is preferable to use a high-purity gas from which an impurity such as hydrogen, water, a hydroxyl group, or hydride is removed to a concentration of several ppm or a concentration of several ppb, as a sputtering gas when the oxide semiconductor film is formed.

Next, the oxide semiconductor layer is subjected to dehydration or dehydrogenation. The temperature of first heat treatment for performing the dehydration or dehydrogenation is higher than or equal to 400° C. and lower than or equal to 750° C., preferably, higher than or equal to 400° C. and lower than the strain point of the substrate. Here, the substrate is introduced in an electric furnace which is a kind of heat treatment apparatus and heat treatment is performed on the oxide semiconductor layer under a nitrogen atmosphere at 450° C. for one hour, and then water and hydrogen are prevented from entering the oxide semiconductor layer. In this manner, an oxide semiconductor layer 332 is obtained (see FIG. 21A).

Next, plasma treatment using a gas such as $N_2O$, $N_2$, or Ar is performed. This plasma treatment removes water or the like adsorbed on a surface of the oxide semiconductor layer which is exposed. In addition, plasma treatment may be performed using a mixed gas of oxygen and argon.

Next, after an oxide insulating film is formed over the gate insulating layer 322 and the oxide semiconductor layer 332, a resist mask is formed over the oxide insulating film through a third photolithography step. The oxide insulating film is selectively etched, so that an oxide insulating layer 366 is formed. Then, the resist mask is removed.

In this embodiment, a silicon oxide film having a thickness of 200 nm is formed as the oxide insulating layer 366 with a sputtering method. The substrate temperature in film formation may be higher than or equal to room temperature and lower than or equal to 300° C., and is set at 100° C. in this embodiment. The silicon oxide film can be formed with a sputtering method under a rare gas (typically, argon) atmosphere, an oxygen atmosphere, or an atmosphere of a rare gas (typically, argon) and oxygen. Moreover, a silicon oxide target or a silicon target can be used as a target. For example, the silicon oxide film can be formed using a silicon target with a sputtering method under an atmosphere of oxygen and nitrogen. The oxide insulating layer 366 which is formed in contact with the oxide semiconductor layer in a region which comes to be in an oxygen-deficient state and thus has a lower resistance, that is, comes to be n-type is formed using an inorganic insulating film that does not contain impurities such as moisture, a hydrogen ion, and $OH^-$ and blocks entry of such impurities from the outside, typically, a silicon oxide film, a silicon oxynitride film, an aluminum oxide film, or an aluminum oxynitride film.

In that case, the oxide insulating layer 366 is preferably formed removing moisture remaining in the treatment chamber. This is for preventing hydrogen, a hydroxyl group, or moisture from being contained in the oxide semiconductor layer 332 and the oxide insulating layer 366.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the film formation chamber which is evacuated with the cryopump, for example, a hydrogen atom, a compound containing a hydrogen atom, such as water ($H_2O$), and the like are removed, whereby the concentration of an impurity contained in the oxide insulating layer 366 formed in the film formation chamber can be reduced.

It is preferable to use a high-purity gas from which an impurity such as hydrogen, water, a hydroxyl group, or hydride is removed to a concentration of several ppm or a concentration of several ppb, as a sputtering gas when the oxide insulating layer 366 is formed.

Next, second heat treatment (preferably, at 200° C. to 400° C. inclusive, e.g., 250° C. to 350° C. inclusive) is performed under an inert gas atmosphere or an oxygen gas atmosphere. For example, the second heat treatment is performed at 250° C. for one hour under a nitrogen atmosphere. With the second heat treatment, heat is applied while the oxide semiconductor layer is in contact with the oxide insulating layer 366.

In this embodiment, the oxide semiconductor layer 332 which is provided with the oxide insulating layer 366 and is partly exposed is further subjected to heat treatment under a nitrogen atmosphere or an inert gas atmosphere or under a reduced pressure. With the heat treatment under a nitrogen atmosphere or an inert gas atmosphere or under a reduced pressure, the resistance of the exposed region of the oxide semiconductor layer 332, which is not covered by the oxide insulating layer 366, can be reduced. For example, the heat treatment is performed at 250° C. for one hour under a nitrogen atmosphere.

With the heat treatment on the oxide semiconductor layer 332 provided with the oxide insulating layer 366 under a nitrogen atmosphere, the resistance of the exposed region of the oxide semiconductor layer 332 is reduced, so that an oxide semiconductor layer 362 including regions with different resistances (indicated as a shaded region and a white region in FIG. 21B) is formed.

Next, after a conductive film is formed over the gate insulating layer 322, the oxide semiconductor layer 362, and the oxide insulating layer 366, a resist mask is formed over the conductive film through a fourth photolithography step. The conductive film is selectively etched, so that a source electrode layer 365a and a drain electrode layer 365b are formed. Then, the resist mask is removed (see FIG. 21C).

As a material of the source electrode layer 365a and the drain electrode layer 365b, there are an element selected from Al, Cr, Cu, Ta, Ti, Mo, and W, an alloy including any of the above elements as its component, an alloy film including a combination of any of the above elements, and the like. The conductive film may have a single-layer structure or a stacked structure of two or more layers.

Through the above process, the oxide semiconductor layer comes to be in an oxygen-deficient state and thus has a lower resistance, that is, comes to be n-type when heat treatment for dehydration or dehydrogenation is performed on the formed oxide semiconductor film. Then, the oxide insulating layer is formed in contact with the oxide semiconductor layer. Accordingly, part of the oxide semiconductor layer is selectively in an oxygen excess state. As a result, a channel formation region 363 which overlaps with the gate electrode layer 361 becomes i-type. At that time, a high-resistance source region 364a which has higher carrier concentration than at least the channel formation region 363 and overlaps with the source electrode layer 365a and a high-resistance drain region 364b which has higher carrier concentration than at least the channel formation region 363 and overlaps with the drain electrode layer 365b are formed in a self-aligned manner. Through the above-described process, the transistor 360 is formed.

Heat treatment at 100° C. to 200° C. inclusive for one hour to 30 hours inclusive in an air atmosphere may be further performed. In this embodiment, the heat treatment is performed at 150° C. for 10 hours. This heat treatment may be performed at a fixed heating temperature. Alternatively, the following change in the heating temperature may be performed plural times repeatedly: the heating temperature is increased from room temperature to a temperature of 100° C. to 200° C. inclusive and then decreased to room temperature. This heat treatment may be performed before the formation of the oxide insulating film under a reduced pressure. Under the reduced pressure, the heat treatment time can be shortened. With this heat treatment, hydrogen is introduced from the oxide semiconductor layer to the oxide insulating layer; thus, a normally-off thin film transistor can be obtained. Thus, reliability of the thin film transistor can be improved.

By the formation of a high-resistance drain region 364b (or the high-resistance source region 364a) in part of the oxide semiconductor layer, which overlaps with the drain electrode layer 365b (or the source electrode layer 365a), reliability of the thin film transistor can be improved. Specifically, by forming the high-resistance drain region 364b, a structure can be attained in which conductivity can be varied stepwise from the drain electrode layer 365b to the high-resistance drain region 364b, and the channel formation region 363. Thus, in the case where the transistor operates with the drain electrode layer 365b connected to a wiring for supplying a high power source potential VDD, the high-resistance drain region 364b serves as a buffer and thus a high electric field is not applied even if the high electric field is applied between the gate electrode layer 361 and the drain electrode layer 365b, so that the breakdown voltage of the transistor can be improved.

A protective insulating layer 323 is formed over the source electrode layer 365a, the drain electrode layer 365b, and the oxide insulating layer 366. In this embodiment, the protective insulating layer 323 is formed using a silicon nitride film (see FIG. 21D).

An oxide insulating layer may be formed over the source electrode layer 365a, the drain electrode layer 365b, and the oxide insulating layer 366, and the protective insulating layer 323 may be stacked over the oxide insulating layer.

With the above structure, the transistor can have stable electric characteristics and high reliability. Since leakage current is small in the transistor, by forming the voltage regulator circuit according to an embodiment of the present invention with the use of the transistor, a desired voltage can be achieved more rapidly than before. Further, when the voltage regulator circuit according to an embodiment of the present invention is formed with the use of the transistor, the voltage regulator circuit can have stable electric characteristics and high reliability.

The capacitor in the voltage regulator circuit according to an embodiment of the present invention can be formed through the same steps as the transistor in this embodiment. When the transistor and the capacitor are formed through the same steps, the number of steps can be reduced.

Note that this embodiment can be combined as appropriate with any of the other embodiments.

Embodiment 10

In this embodiment, another example of a thin film transistor which can be used as a transistor included in the voltage regulator circuit disclosed in this specification will be described.

In this embodiment, an embodiment of a thin film transistor and a manufacturing method of the thin film transistor will be described with reference to FIGS. 22A to 22D.

Although a thin film transistor 350 is a single-gate transistor, a multi-gate transistor including a plurality of channel formation regions may be formed as the transistor of this embodiment.

A manufacturing process of the transistor 350 over a substrate 340 having an insulating surface is described below with reference to FIGS. 22A to 22D.

First, after a conductive film is formed over the substrate 340 having an insulating surface, a gate electrode layer 351 is formed through a first photolithography step. In this embodiment, as a conductive film for forming the gate electrode layer 351, a tungsten film having a thickness of 150 nm is formed with a sputtering method.

Next, a gate insulating layer 342 is formed over the gate electrode layer 351.

An oxide semiconductor (a highly purified oxide semiconductor) which is made to be i-type or substantially i-type by removal of an impurity is highly sensitive to an interface state and interface electric charge; thus, an interface between the oxide semiconductor and a gate insulating layer is important. Therefore, the gate insulating layer (GI) which is in contact with the highly purified oxide semiconductor layer needs high quality.

For example, high-density plasma CVD using microwaves (2.45 GHz) is preferable because a dense high-quality insulating film having high breakdown voltage can be formed. This is because when the highly purified oxide semiconductor layer is closely in contact with the high-quality gate insulating layer, the interface state can be reduced and interface properties can be favorable. Here, as a high-density plasma apparatus, an apparatus which can realize a plasma density of greater than or equal to $1\times10^{11}/cm^3$ can be used.

For example, plasma is generated by applying a microwave power of 3 kW to 6 kW so that the insulating film is formed. A monosilane gas ($SiH_4$), nitrous oxide ($N_2O$), and a rare gas are introduced into a chamber as a source gas to generate high-density plasma at a pressure of 10 Pa to 30 Pa so that the insulating film is formed over a substrate having an insulating surface, such as a glass substrate. After that, the supply of a monosilane gas is stopped, and nitrous oxide ($N_2O$) and a rare gas are introduced without exposure to the air, so that a surface of the insulating film is subjected to plasma treatment. The plasma treatment performed on the surface of the insulating film by introducing nitrous oxide ($N_2O$) and a rare gas is performed at least after the insulating film is formed. The flow ratio of a monosilane gas ($SiH_4$) to nitrous oxide ($N_2O$) which are introduced into the chamber is in the range of 1:10 to 1:200. In addition, as a rare gas which is introduced into the chamber, helium, argon, krypton, xenon, or the like can be used. In particular, argon, which is inexpensive, is preferably used.

Needless to say, a different film formation method such as a sputtering method or a plasma CVD method can be used as long as a high-quality insulating film can be formed as the gate insulating layer 342. In addition, any insulating film can be used as long as film quality and properties of an interface with an oxide semiconductor of the gate insulating film are modified by heat treatment performed after film formation. In any case, any insulating film can be used as long as film quality as a gate insulating film is high, interface state density with an oxide semiconductor is reduced, and a favorable interface can be formed.

In a gate-bias thermal stress test (BT test) at 85° C. and $2\times10^6$ V/cm for 12 hours, if an impurity has been added to an oxide semiconductor, the bond between the impurity and the main component of the oxide semiconductor is broken by a high electric field (B: bias) and high temperature (T: temperature), so that a generated dangling bond induces a drift in the threshold voltage ($V_{th}$). As a countermeasure against this, in the transistor which is an embodiment of the present invention, the impurity in the oxide semiconductor, especially, hydrogen, water, or the like is removed as much as possible so that the properties of an interface with the gate insulating layer are favorable as described above. Accordingly, it is possible to obtain a thin film transistor which is stable with respect to the BT test.

The gate insulating layer 342 can be formed with a single-layer structure or a stacked structure using one or more of a silicon oxide layer, a silicon nitride layer, a silicon oxynitride layer, a silicon nitride oxide layer, or an aluminum oxide layer.

In addition, as the gate insulating layer 342, $HfO_x$ or the like can also be used, for example. With the use of $HfO_x$ or the like as the gate insulating layer 342, leakage current that flows from the oxide semiconductor layer side toward the gate electrode can be reduced.

The gate insulating layer 342 can have a structure in which a silicon oxide layer and a silicon nitride layer are stacked. In this embodiment, a silicon oxynitride layer having a thickness of 100 nm is formed with a high-density plasma CVD method with a pressure of 30 Pa and a microwave power of 6 kW, for example. At this time, the flow ratio of a monosilane gas ($SiH_4$) to nitrous oxide ($N_2O$) which are introduced into the chamber is 1:10.

Next, a conductive film is formed over the gate insulating layer 342, and a resist mask is formed over the conductive film through a second photolithography step. The conductive film is selectively etched, so that a source electrode layer 355a and a drain electrode layer 355b are formed. Then, the resist mask is removed (see FIG. 22A).

Figure 22A:
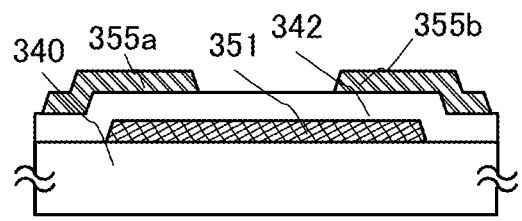
FIGS. 22A to 22D are cross-sectional views illustrating a method for manufacturing a transistor.
Figure 22B:
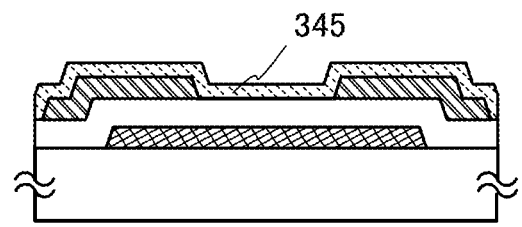
Figure 22C:
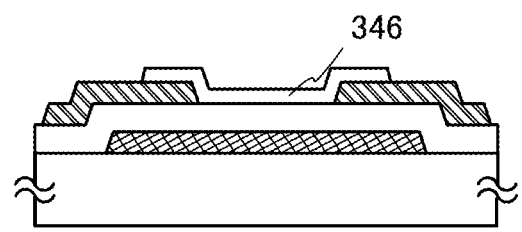
Figure 22D:
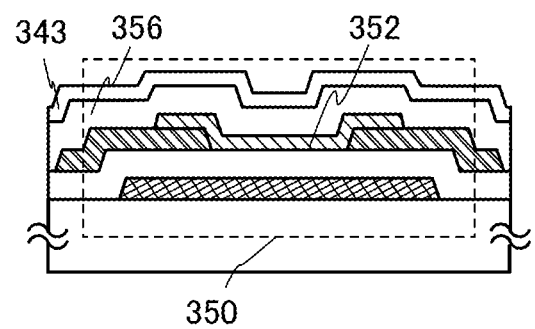

Next, an oxide semiconductor film 345 is formed (see FIG. 22B). In this embodiment, the oxide semiconductor film 345 is formed with a sputtering method with the use of an In—Ga—Zn—O based metal oxide target. The oxide semiconductor film 345 is processed into an island-shaped oxide semiconductor layer through a third photolithography step.

In that case, the oxide semiconductor film 345 is preferably formed removing moisture remaining in the treatment chamber. This is for preventing hydrogen, a hydroxyl group, or moisture from being contained in the oxide semiconductor film 345.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the film formation chamber which is evacuated with the cryopump, for example, a hydrogen atom, a compound containing a hydrogen atom, such as water ($H_2O$), and the like are removed, whereby the concentration of an impurity contained in the oxide semiconductor film 345 formed in the film formation chamber can be reduced.

It is preferable to use a high-purity gas from which an impurity such as hydrogen, water, a hydroxyl group, or hydride is removed to a concentration of several ppm or a concentration of several ppb, as a sputtering gas when the oxide semiconductor film 345 is formed.

Next, the oxide semiconductor layer is subjected to dehydration or dehydrogenation. The temperature of first heat treatment for performing the dehydration or dehydrogenation is higher than or equal to 400° C. and lower than or equal to 750° C., preferably, higher than or equal to 400° C. and lower than the strain point of the substrate. Here, the substrate is introduced in an electric furnace which is a kind of heat treatment apparatus and heat treatment is performed on the oxide semiconductor layer under a nitrogen atmosphere at 450° C. for one hour, and then water and hydrogen are prevented from entering the oxide semiconductor layer. In this manner, an oxide semiconductor layer 346 is obtained (see FIG. 22C).

In addition, as the first heat treatment, GRTA may be performed as follows. The substrate is transferred and put in an inert gas which has been heated to a high temperature of 650° C. to 700° C., heated for several minutes, and transferred and taken out of the inert gas which has been heated to a high temperature. GRTA enables a high-temperature heat treatment for a short time.

Further, an oxide insulating layer 356 serving as a protective insulating film is formed in contact with the oxide semiconductor layer 346.

The oxide insulating layer 356 can be formed to a thickness at least 1 nm using a sputtering method or the like as appropriate, which is a method with which an impurity such as water or hydrogen does not enter the oxide insulating layer 356, such as sputtering method, as appropriate. When hydrogen is contained in the oxide insulating layer 356, there is a concern that entry of the hydrogen to the oxide semiconductor layer or extraction of oxygen in the oxide semiconductor layer by the hydrogen is caused, thereby making the resistance of the back channel of the oxide semiconductor layer low (to have an n-type conductivity), so that a parasitic channel might be formed. Therefore, it is important that a formation method in which hydrogen is not used is employed such that the oxide insulating layer 356 contains as little hydrogen as possible.

In this embodiment, a silicon oxide film having a thickness of 200 nm is formed as the oxide insulating layer 356 with a sputtering method. The substrate temperature in film formation may be room temperature to 300° C. inclusive, and is set at 100° C. in this embodiment. The silicon oxide film can be formed with a sputtering method under a rare gas (typically, argon) atmosphere, an oxygen atmosphere, or an atmosphere of a rare gas (typically, argon) and oxygen. Moreover, a silicon oxide target or a silicon target can be used as a target. For example, the silicon oxide film can be formed using a silicon target with a sputtering method under an atmosphere of oxygen and nitrogen. The oxide insulating layer 356 which is formed in contact with the oxide semiconductor layer in a region which comes to be in an oxygen-deficient state and thus has a lower resistance, that is, comes to be n-type is formed using an inorganic insulating film that does not contain impurities such as moisture, a hydrogen ion, and OH⁻ and blocks entry of such impurities from the outside, typically, a silicon oxide film, a silicon oxynitride film, an aluminum oxide film, or an aluminum oxynitride film.

In that case, the oxide insulating layer 356 is preferably formed removing moisture remaining in the treatment chamber. This is for preventing hydrogen, a hydroxyl group, or moisture from being contained in the oxide semiconductor layer 346 and the oxide insulating layer 356.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the film formation chamber which is evacuated with the cryopump, for example, a hydrogen atom, a compound containing a hydrogen atom, such as water ($H_2O$), and the like are removed, whereby the concentration of an impurity contained in the oxide insulating layer 356 formed in the film formation chamber can be reduced.

It is preferable to use a high-purity gas from which an impurity such as hydrogen, water, a hydroxyl group, or hydride is removed to a concentration of several ppm or a concentration of several ppb, as a sputtering gas when the oxide insulating layer 356 is formed.

Next, second heat treatment (preferably, at 200° C. to 400° C. inclusive, e.g., 250° C. to 350° C. inclusive) is performed under an inert gas atmosphere or an oxygen gas atmosphere. For example, the second heat treatment is performed at 250° C. for one hour under a nitrogen atmosphere. With the second heat treatment, heat is applied while the oxide semiconductor layer is in contact with the oxide insulating layer 356.

Through the above process, the oxide semiconductor layer comes to be in an oxygen-deficient state and thus has a lower resistance, that is, comes to be n-type when heat treatment for dehydration or dehydrogenation is performed. Then, the oxide insulating layer is formed in contact with the oxide semiconductor layer. Accordingly, part of the oxide semiconductor layer is selectively in an oxygen excess state. As a result, a high-resistance i-type oxide semiconductor layer 352 is formed. Through the above-described process, the transistor 350 is formed.

Heat treatment at 100° C. to 200° C. inclusive for one hour to 30 hours inclusive in an air atmosphere may be further performed. In this embodiment, the heat treatment is performed at 150° C. for 10 hours. This heat treatment may be performed at a fixed heating temperature. Alternatively, the following change in the heating temperature may be performed plural times repeatedly: the heating temperature is increased from room temperature to a temperature of 100° C. to 200° C. inclusive and then decreased to room temperature. Under the reduced pressure, the heat treatment time can be shortened. With this heat treatment, hydrogen is introduced from the oxide semiconductor layer to the oxide insulating layer; thus, a normally-off thin film transistor can be obtained. Thus, reliability of the thin film transistor can be improved.

A protective insulating layer may be further formed over the oxide insulating layer 356. For example, a silicon nitride film is formed with an RF sputtering method. In this embodiment, a protective insulating layer 343 is formed using a silicon nitride film as a protective insulating layer (see FIG. 22D).

In addition, a planarizing insulating layer for planarization may be provided over the protective insulating layer 343.

With the above structure, the transistor can have stable electric characteristics and high reliability. Since leakage current is small in the transistor, by forming the voltage regulator circuit according to an embodiment of the present invention with the use of the transistor, a desired voltage can be achieved more rapidly than before. Further, when the voltage regulator circuit according to an embodiment of the present invention is formed with the use of the transistor, the voltage regulator circuit can have stable electric characteristics and high reliability.

The capacitor in the voltage regulator circuit according to an embodiment of the present invention can be formed through the same steps as the transistor in this embodiment. When the transistor and the capacitor are formed through the same steps, the number of steps can be reduced.

Note that this embodiment can be combined as appropriate with any of the other embodiments.

Embodiment 11

In this embodiment, another example of a thin film transistor which can be used as a transistor included in the voltage regulator circuit disclosed in this specification will be described.

Figure 23:
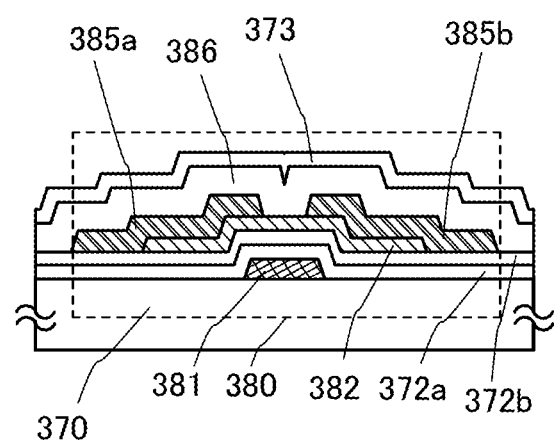
FIG. 23 is a cross-sectional view illustrating a transistor.

In this embodiment, an example which is different from Embodiment 8 in the manufacturing process of a thin film transistor will be described with reference to FIG. 23. Since FIG. 23 is the same as FIGS. 20A to 20E except for part of steps, the same portions are denoted by the same reference numerals and detailed description of the same portions is omitted as appropriate.

First, a gate electrode layer 381 is formed over a substrate 370, and a first gate insulating layer 372a and a second gate insulating layer 372b are stacked thereover. In this embodiment, a gate insulating layer has a two-layer structure in which a nitride insulating layer and an oxide insulating layer are used as the first gate insulating layer 372a and the second gate insulating layer 372b, respectively.

As the oxide insulating layer, a silicon oxide layer, a silicon oxynitride layer, an aluminum oxide layer, an aluminum oxynitride layer, or the like can be used. As the nitride insulating layer, a silicon nitride layer, a silicon nitride oxide layer, an aluminum nitride layer, an aluminum nitride oxide layer, or the like can be used.

In addition, as the first gate insulating layer 372a or the second gate insulating layer 372b, $HfO_x$ or the like can also be used, for example. With the use of $HfO_x$ or the like as the first gate insulating layer 372a or the second gate insulating layer 372b, leakage current that flows from the oxide semiconductor layer side toward the gate electrode can be reduced.

In this embodiment, the gate insulating layer has a structure in which a silicon nitride layer and a silicon oxide layer are stacked from the gate electrode layer 381 side. A gate insulating layer having a thickness of 150 nm is formed in such a manner that a silicon nitride layer ($SiN_y$ (y>0)) having a thickness of 50 nm to 200 nm inclusive (50 nm in this embodiment) is formed with a sputtering method as the first gate insulating layer 372a and then a silicon oxide layer ($SiO_x$ (x>0)) having a thickness of 5 nm to 300 nm inclusive (100 nm in this embodiment) is stacked as the second gate insulating layer 372b over the first gate insulating layer 372a.

Next, an oxide semiconductor film is formed, and the oxide semiconductor film is processed into an island-shaped oxide semiconductor layer through a photolithography step. In this embodiment, the oxide semiconductor film is formed with a sputtering method with the use of an In—Ga—Zn—O based metal oxide target.

In that case, the oxide semiconductor film is preferably formed removing moisture remaining in the treatment chamber. This is for preventing hydrogen, a hydroxyl group, or moisture from being contained in the oxide semiconductor film.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the film formation chamber which is evacuated with the cryopump, for example, a hydrogen atom, a compound containing a hydrogen atom, such as water ($H_2O$), and the like are removed, whereby the concentration of an impurity contained in the oxide semiconductor film formed in the film formation chamber can be reduced.

It is preferable to use a high-purity gas from which an impurity such as hydrogen, water, a hydroxyl group, or hydride is removed to a concentration of several ppm or a concentration of several ppb, as a sputtering gas when the oxide semiconductor film is formed.

Next, the oxide semiconductor layer is subjected to dehydration or dehydrogenation. The temperature of first heat treatment at which dehydration or dehydrogenation is performed is 400° C. to 750° C. inclusive, preferably, 425° C. to 750° C. inclusive. Note that in the case where the temperature is 425° C. or more, the heat treatment time may be one hour or less, whereas in the case where the temperature is less than 425° C., the heat treatment time is longer than one hour. Here, the substrate is put in an electric furnace, which is a kind of heat treatment apparatus, and heat treatment of the oxide semiconductor layer is performed under a nitrogen atmosphere. Then, water or hydrogen is prevented from entering the oxide semiconductor layer. After that, cooling is performed by introduction of a high-purity oxygen gas, a high-purity $N_2O$ gas, or ultra-dry air (having a dew point of less than or equal to −40° C., preferably, less than or equal to −60° C.) into the same furnace. It is preferable that water, hydrogen, or the like be not contained in an oxygen gas or a $N_2O$ gas. Alternatively, the purity of an oxygen gas or a $N_2O$ gas which is introduced into the heat treatment apparatus is greater than or equal to 6 N (99.9999%), preferably, greater than or equal to 7 N (99.99999%) (i.e., the impurity concentration of the oxygen gas or the $N_2O$ gas is less than or equal to 1 ppm, preferably, less than or equal to 0.1 ppm).

Note that the heat treatment apparatus is not limited to an electric furnace. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. In addition, without limitation to an LRTA apparatus and a lamp, a device that heats the product to be processed by thermal conduction or thermal radiation from a heater such as a resistance heater may be used. GRTA is a method for performing heat treatment using a high-temperature gas. As the gas, an inert gas which does not react with an object to be processed by heat treatment, like nitrogen or a rare gas such as argon is used. The heat treatment may be performed at 600° C. to 750° C. for several minutes with an RTA method.

In addition, after the first heat treatment for dehydration or dehydrogenation, heat treatment may be performed at 200° C. to 400° C. inclusive, preferably, 200° C. to 300° C. inclusive under an oxygen gas atmosphere or an $N_2O$ gas atmosphere.

In addition, the first heat treatment of the oxide semiconductor layer can also be performed on the oxide semiconductor film before being processed into the island-shaped oxide semiconductor layer. In that case, the substrate is taken out from the heat apparatus after the first heat treatment, and then a photolithography step is performed.

Through the above process, the entire oxide semiconductor film is made to contain an excess amount of oxygen, whereby the oxide semiconductor film has higher resistance, that is, becomes i-type. Accordingly, an oxide semiconductor layer 382 whose entire region has i-type conductivity is formed.

Next, a conductive film is formed over the oxide semiconductor layer 382, and a resist mask is formed through a photolithography step. The conductive film is selectively etched, so that a source electrode layer 385a and a drain electrode layer 385b are formed. Then, an oxide insulating layer 386 is formed with a sputtering method.

In that case, the oxide insulating layer 386 is preferably formed removing moisture remaining in the treatment chamber. This is for preventing hydrogen, a hydroxyl group, or moisture from being contained in the oxide semiconductor layer 382 and the oxide insulating layer 386.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the film formation chamber which is evacuated with the cryopump, for example, a hydrogen atom, a compound containing a hydrogen atom, such as water ($H_2O$), and the like are removed, whereby the concentration of an impurity contained in the oxide insulating layer 386 formed in the film formation chamber can be reduced.

It is preferable to use a high-purity gas from which an impurity such as hydrogen, water, a hydroxyl group, or hydride is removed to a concentration of several ppm or a concentration of several ppb, as a sputtering gas when the oxide insulating layer 386 is formed.

Through the above-described process, a transistor 380 is formed.

Note that in order to reduce variation in electric characteristics of the thin film transistor, heat treatment (preferably at higher than or equal to 150° C. and lower than 350° C.) may be performed under an inert gas atmosphere or a nitrogen gas atmosphere. For example, the heat treatment is performed at 250° C. for one hour under a nitrogen atmosphere.

Heat treatment at 100° C. to 200° C. inclusive for one hour to 30 hours inclusive in an air atmosphere may be further performed. In this embodiment, the heat treatment is performed at 150° C. for 10 hours. This heat treatment may be performed at a fixed heating temperature. Alternatively, the following change in the heating temperature may be performed plural times repeatedly: the heating temperature is increased from room temperature to a temperature of 100° C. to 200° C. inclusive and then decreased to room temperature. Under the reduced pressure, the heat treatment time can be shortened. With this heat treatment, hydrogen is introduced from the oxide semiconductor layer to the oxide insulating layer; thus, a normally-off thin film transistor can be obtained. Thus, reliability of the thin film transistor can be improved.

A protective insulating layer 373 is formed over the oxide insulating layer 386. In this embodiment, as the protective insulating layer 373, a silicon nitride film having a thickness of 100 nm is formed with a sputtering method.

The protective insulating layer 373 and the first gate insulating layer 372a each formed using a nitride insulating layer do not contain impurities such as moisture, hydrogen, hydride, and hydroxide and have an effect of blocking entry of these from the outside.

Therefore, in a manufacturing process after the formation of the protective insulating layer 373, entry of an impurity such as moisture from the outside can be prevented, so that the long-term reliability of the device can be improved.

Further, part of the insulating layers between the protective insulating layer 373 formed using a nitride insulating layer and the first gate insulating layer 372a may be removed so that the protective insulating layer 373 and the first gate insulating layer 372a may be in contact with each other.

Accordingly, impurities such as moisture, hydrogen, hydride, and hydroxide in the oxide semiconductor layer are reduced as much as possible and entry of such impurities is prevented, so that the concentration of impurities in the oxide semiconductor layer can be maintained to be low.

In addition, a planarizing insulating layer for planarization may be provided over the protective insulating layer 373.

Further, a conductive layer which overlaps with the oxide semiconductor layer may be provided over the protective insulating layer 373. The conductive layer may have the same potential as or have potential different from that of the gate electrode layer 381 of the transistor 380 and can function as a second gate electrode layer. The potential of the conductive layer may be a fixed potential such as GND or 0 V.

Electric characteristics of the transistor 380 can be controlled by the conductive layer.

With the above structure, the transistor can have stable electric characteristics and high reliability. Since leakage current is small in the transistor, by forming the voltage regulator circuit according to an embodiment of the present invention with the use of the transistor, a desired voltage can be achieved more rapidly than before. Further, when the voltage regulator circuit according to an embodiment of the present invention is formed with the use of the transistor, the voltage regulator circuit can have stable electric characteristics and high reliability.

Note that this embodiment can be combined as appropriate with any of the other embodiments.

Embodiment 12

In this embodiment, a structure of a transistor and a capacitor in a voltage regulator circuit which is an embodiment of the present invention will be described.

An example of the structure of the transistor and the capacitor in this embodiment, which can be applied to an embodiment of the present invention, will be described with reference to FIGS. 24A and 24B. FIG. 24B is a cross-sectional view illustrating an example of the structure of the transistor and the capacitor in this embodiment. Note that the transistor illustrated in FIGS. 20A to 20E is applied to the transistor illustrated in FIGS. 24A and 24B as an example, and the description of the transistor illustrated in FIGS. 20A to 20E is applied thereto as the detailed description.

As illustrated in FIG. 24B, the transistor 310 and a capacitor 309 are provided over a substrate 301.

The capacitor 309 includes a conductive layer 304 provided over the substrate 301 and a conductive layer 306 provided over the conductive layer 304 with a gate insulating layer 302 interposed therebetween. At this time, the gate insulating layer functions as a dielectric of the capacitor.

The conductive layer 304 is formed using the same conductive film as a gate electrode layer 311 of the transistor 310, and is electrically connected to a drain electrode layer 315b through an opening provided in the gate insulating layer 302. The conductive layer 304 functions as one of a first electrode and a second electrode of the capacitor 309.

The conductive layer 306 is formed using the same conductive film as a source electrode layer 315a and a drain electrode layer 315b of the transistor 310. The conductive layer 306 functions as the other of the first electrode and the second electrode of the capacitor 309.

As described above, in a voltage regulator circuit which is an embodiment of the present invention, a capacitor can be formed using a conductive layer which is formed using the same conductive film as a gate electrode of a transistor, a gate insulating layer, and a conductive layer which is formed using the same conductive film as a source electrode and a drain electrode of the transistor.

As described above, a transistor and a capacitor can be formed through the same steps, which can suppress an increase in the number of steps.

Figure 24A:
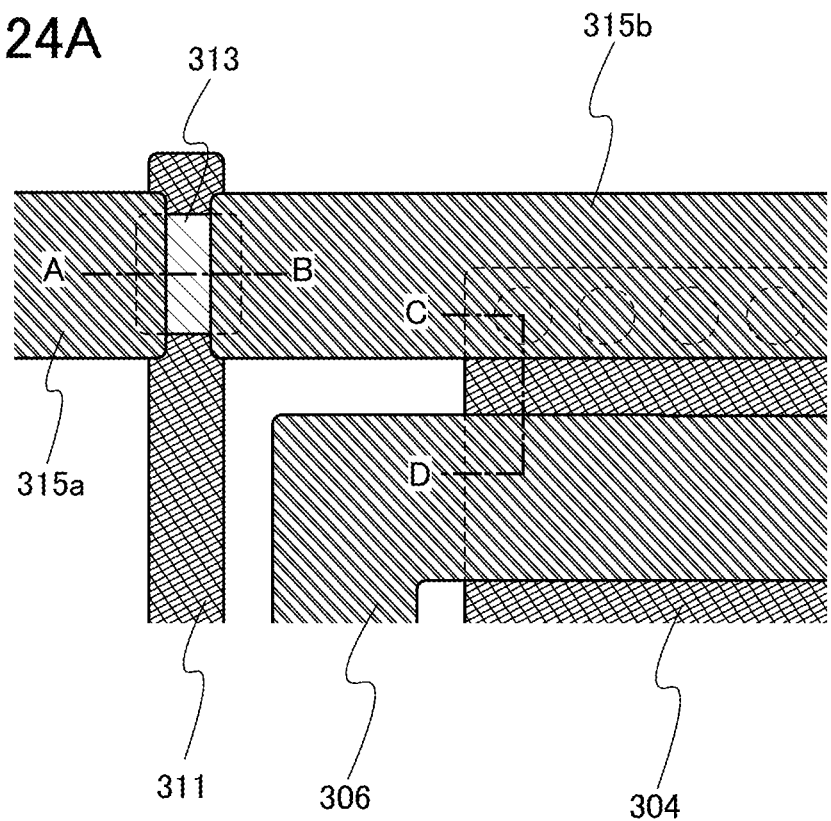
FIGS. 24A and 24B are a top view and a cross-sectional view illustrating a transistor and a capacitor.
Figure 24B:
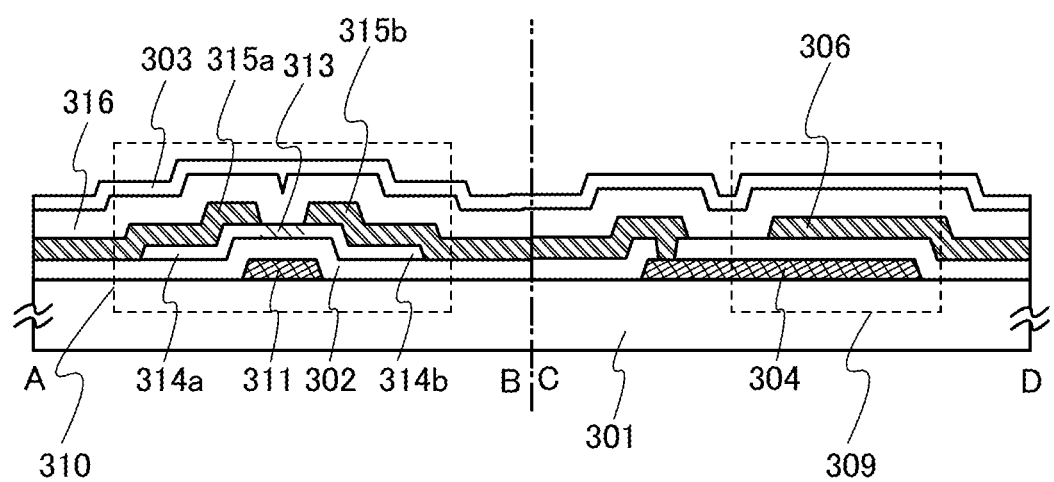

In addition, the drain electrode of the transistor illustrated in FIGS. 24A and 24B is electrically connected to one of the electrodes of the capacitor through the opening provided in the gate insulating layer. Accordingly, favorable contact can be obtained, which leads to a reduction in contact resistance. Accordingly, the number of openings can be reduced, which results in reducing the area occupied by the openings.

Note that this embodiment can be combined as appropriate with any of the other embodiments.

Embodiment 13

In this embodiment, examples of an electronic device to which the voltage regulator circuit according to an embodiment of the present invention can be applied will be described with reference to FIGS. 25A and 25B.

Figure 25A:
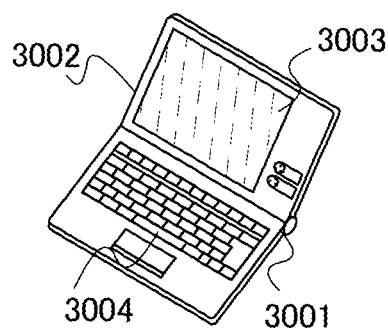
FIGS. 25A and 25B are external views each illustrating an electronic device.

FIG. 25A illustrates a laptop personal computer, which includes a main body 3001, a housing 3002, a display portion 3003, a keyboard 3004, and the like. The voltage regulator circuit described in any of Embodiments 1 to 3 can be used to generate a power source voltage which is supplied to the laptop personal computer illustrated in FIG. 25A.

Figure 25B:
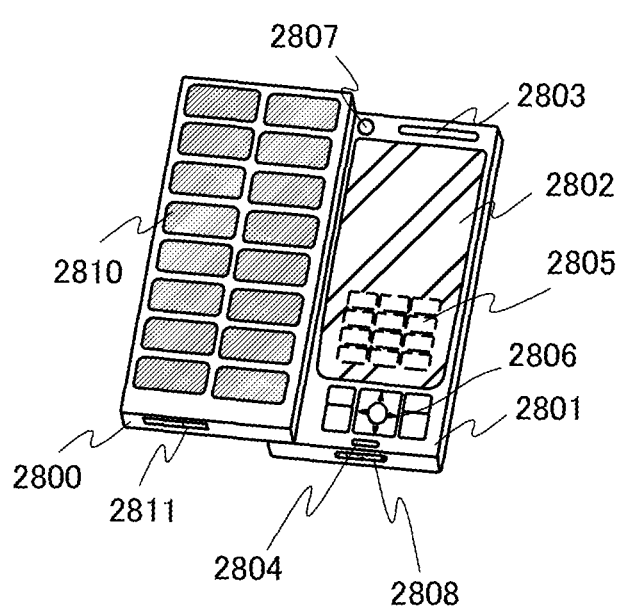

FIG. 25B illustrates a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. The housing 2800 includes a solar cell 2810 for charging of the portable phone, an external memory slot 2811, and the like. Further, an antenna is incorporated in the housing 2801.

Further, the display panel 2802 is provided with a touch panel. A plurality of operation keys 2805 which are displayed as images are illustrated by dashed lines in FIG. 25B. In the mobile phone illustrated in FIG. 25B, the step-up circuit (the voltage regulator circuit described in any of Embodiments 1 to 3) is mounted in order to step up a voltage which is outputted from the solar cell 2810 to a voltage which is necessary for each circuit.

As described above, the voltage regulator circuit which is an embodiment of the present invention can be applied to a variety of electronic devices and can efficiently supply a power source voltage to the electronic device.

Note that this embodiment can be combined as appropriate with any of the other embodiments.

EXAMPLE 1

In this example, a voltage regulator circuit including two-step unit step-up circuits and an output circuit will be described.

Figure 26:
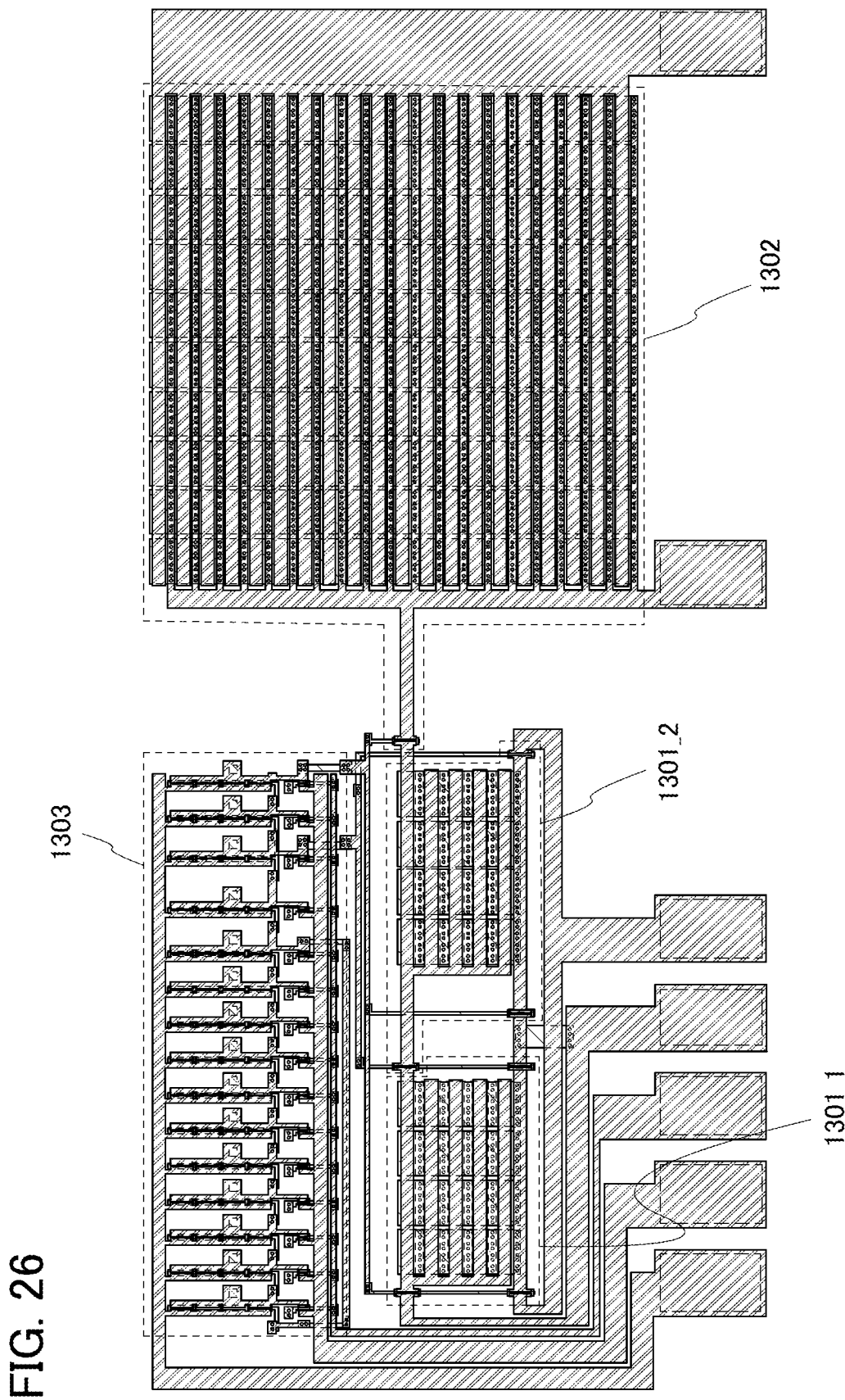
FIG. 26 is a layout of a voltage regulator circuit.

A layout of a voltage regulator circuit of this example is illustrated in FIG. 26.

The voltage regulator circuit illustrated in FIG. 26 includes two-step unit step-up circuits (a unit step-up circuit 1301_1 and a unit step-up circuit 13012), an output circuit 1302, and a ring oscillator 1303.

Figure 27:
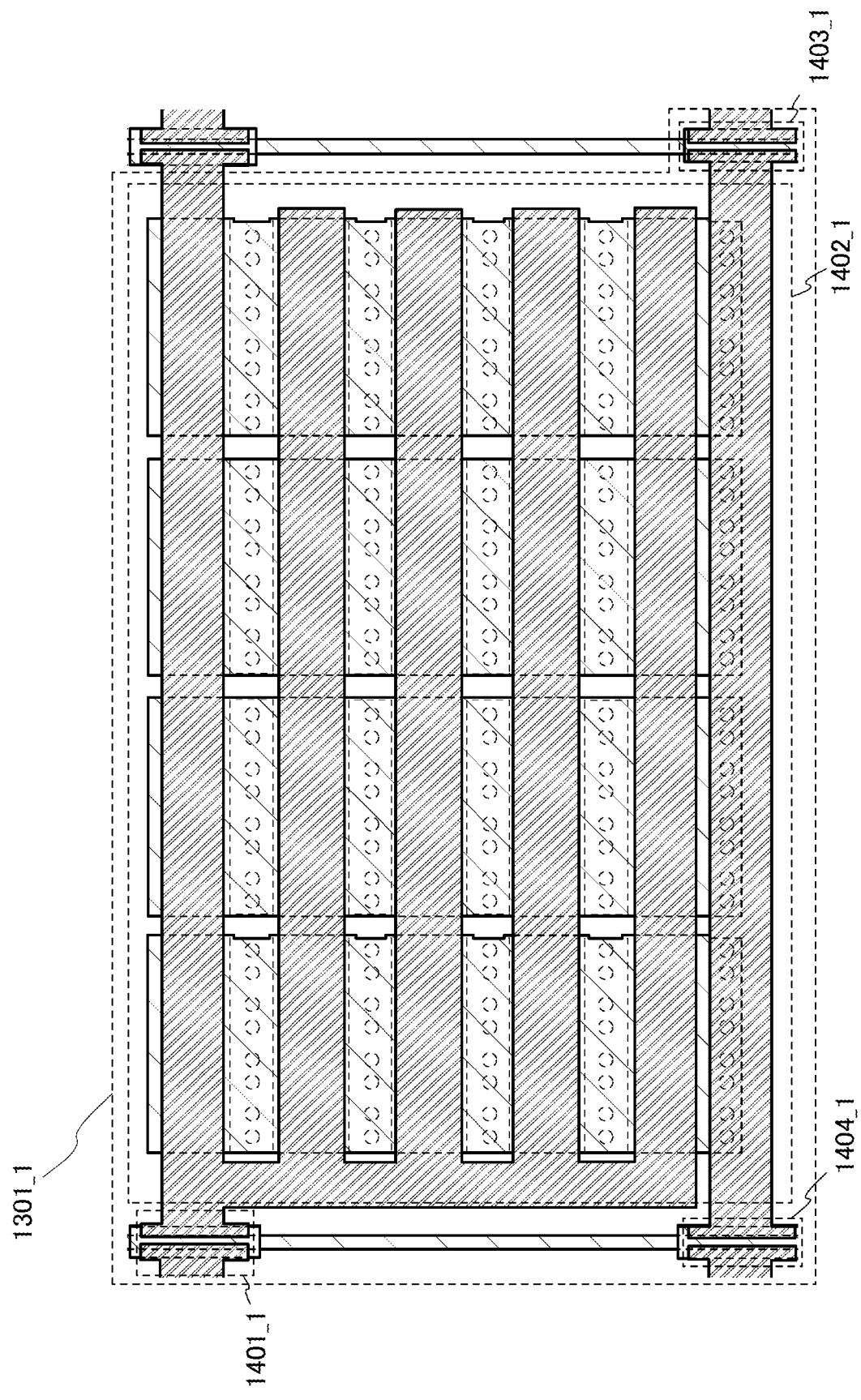
FIG. 27 is an enlarged view of the layout of a voltage regulator circuit.

Further, FIG. 27 is an enlarged view of the unit step-up circuit 1301_1 in FIG. 26.

As illustrated in FIG. 27, the unit step-up circuit 1301_1 includes a transistor 1401_1, a capacitor 1402_1, a transistor 1403_1, and a transistor 1404_1.

The transistor 1401_1 corresponds to the transistor 201_1 in FIG. 3, the capacitor 1402_1 corresponds to a capacitor 202_1 in FIG. 3, the transistor 1403_1 corresponds to a transistor 203_1 in FIG. 3, and the transistor 1404_1 corresponds to a transistor 204_1 in FIG. 3.

In addition, the transistor 1401_1, the transistor 1403_1, and the transistor 1404_1 each have the structure of the transistor illustrated in FIGS. 20A to 20E.

Moreover, the L/W ratio of each of the transistor 1401_1, the transistor 1403_1, and the transistor 1404_1 was set to 3/50, and the capacitance of the capacitor 1402_1 was set to 20 pF. Further, the capacitance of a capacitor in the output circuit 1302 was set to 400 pF.

The output circuit 1302 corresponds to the output circuit 212 in FIG. 3.

The ring oscillator 1303 is an oscillation circuit which outputs a clock signal and an inverted clock signal, and is generated using, for example, a plurality of logic circuits. Note that the ring oscillator 1303 can be formed over the same substrate as the voltage regulator circuit as illustrated in FIG. 26. The ring oscillator 1303 is formed over the same substrate as the voltage regulator circuit, whereby the number of terminals can be reduced or the length of a wiring can be shortened.

Figure 28A:
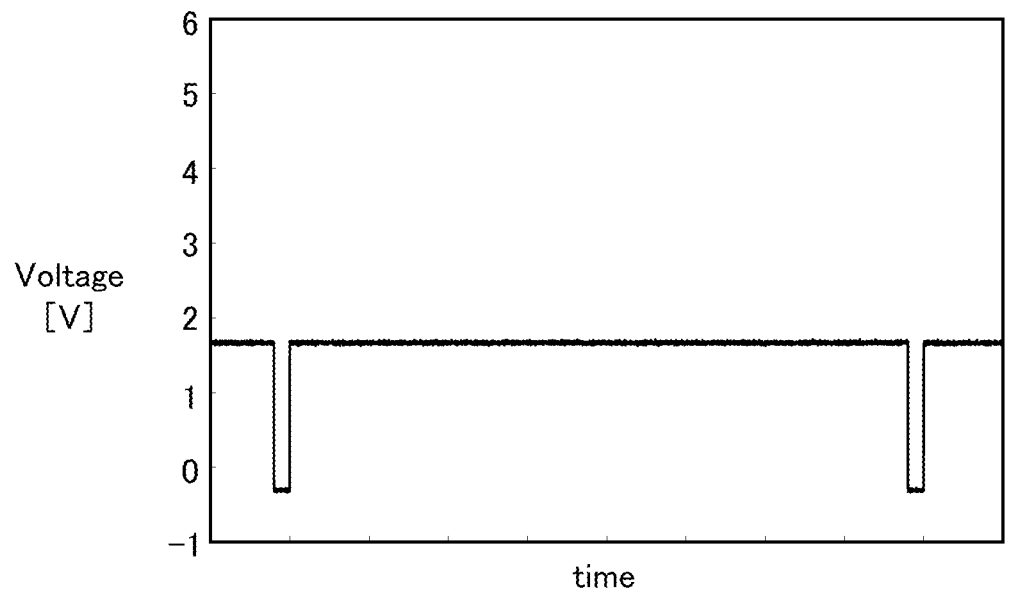
FIGS. 28A and 28B show a waveform of an input signal and a waveform of an output signal of the voltage regulator circuit, respectively.
Figure 28B:
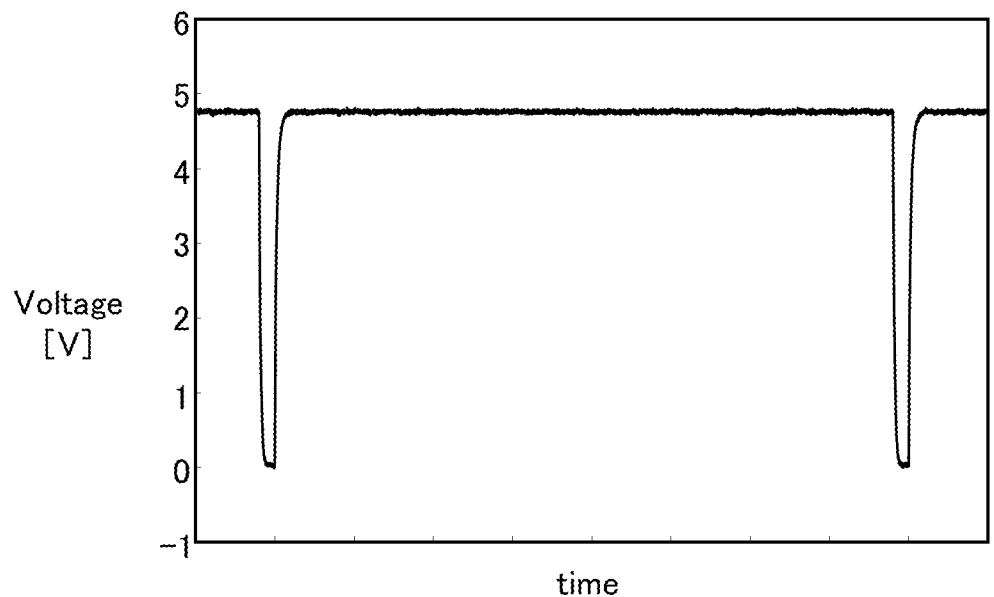

Further, an output voltage of the voltage regulator circuit illustrated in FIG. 26 was measured. The measurement result is described with reference to FIGS. 28A and 28B. FIGS. 28A and 28B are each a graph showing a result of measuring an output voltage of the voltage regulator circuit illustrated in FIG. 26. Note that in the measurement, a high power source voltage was applied as an input signal of the voltage regulator circuit, an amplitude of the high power source voltage was 1.6 V, a pulse cycle of a pulse voltage was 80 msec, and a low power source voltage was 0 V.

FIG. 28A is a graph showing the waveform of the input signal of the voltage regulator circuit, and FIG. 28B is a graph showing the waveform of an output signal of the voltage regulator circuit.

As shown in FIGS. 28A and 28B, when a voltage of the input signal is 1.6 V, a voltage of the output signal is approximately 4.8 V, and the output voltage of the voltage regulator circuit is stepped up approximately three times as high as the input voltage of the voltage regulator circuit. In the voltage regulator circuit illustrated in FIG. 26, a logical value of the voltage of the output signal is 4.8 V when the voltage of the input signal is 1.6 V; therefore, it is found that, with the voltage regulator circuit illustrated in FIG. 26, the voltage of the output signal can be stepped up almost up to the logical value.

As described above, since the voltage after step up is almost equivalent to a logical value in the voltage regulator circuit of this example, it is found that a voltage regulator circuit which is an embodiment of the present invention has a transistor with low leakage current and high conversion efficiency.

The present application is based on Japanese Patent Application serial No. 2009-250396 filed with the Japan Patent Office on Oct. 30, 2009 and Japanese Patent Application serial No. 2010-012618 filed with the Japan Patent Office on Jan. 22, 2010, the entire contents of which are hereby incorporated by reference.

The invention claimed is:

1. A voltage regulator circuit comprising:
a transistor comprising a gate, a source, a drain, an oxide semiconductor layer used for a channel formation layer of the transistor, and a conductor layer; and
a capacitor comprising a first electrode and a second electrode,
wherein a first signal is inputted to one of the source and the drain of the transistor,
wherein a second signal which is a clock signal is inputted to the gate of the transistor,
wherein the oxide semiconductor layer is an intrinsic semiconductor layer or a substantially intrinsic semiconductor layer,
wherein the first electrode of the capacitor is electrically connected to the other of the source and the drain of the transistor,
wherein a high power source voltage and a low power source voltage are alternately applied to the second electrode of the capacitor,
wherein a first voltage of the first signal is stepped up or down to obtain a third signal,
wherein the third signal which has a second voltage obtained by stepping up or down the first voltage of the first signal is outputted as an output signal through the other of the source and the drain of the transistor,
wherein the gate and the oxide semiconductor layer overlap with each other with a first insulating layer therebetween,
wherein the conductor layer and the oxide semiconductor layer overlap with each other with a second insulating layer therebetween, and
wherein the oxide semiconductor layer is between the first insulating layer and the second insulating layer.

2. The voltage regulator circuit according to claim 1, wherein the oxide semiconductor layer comprises indium and zinc.

3. The voltage regulator circuit according to claim 1, wherein an off-state current of the transistor is less than or equal to 10 aA/µm.

4. The voltage regulator circuit according to claim 1, wherein the oxide semiconductor layer is highly purified.

5. A semiconductor device comprising:
a first transistor comprising a first electrode, a second electrode, a third electrode, a first semiconductor layer serving as a first channel formation layer of the first transistor, and a first conductor layer;
a second transistor comprising a fourth electrode, a fifth electrode, a sixth electrode, a second semiconductor layer serving as a second channel formation layer of the second transistor, and a second conductor layer; and a capacitor comprising a seventh electrode and an eighth electrode, wherein the third electrode of the first transistor, the fourth electrode of the second transistor, and the seventh electrode of the capacitor are electrically connected to each other, wherein the second electrode of the first transistor is configured so that a clock signal is applied to the second electrode of the first transistor, wherein the fifth electrode of the second transistor is configured so that an inverted clock signal of the clock signal is applied to the fifth electrode of the second transistor, wherein the eighth electrode is configured so that a first voltage and a second voltage is alternately applied to the eighth electrode, wherein the second voltage is higher than the first voltage, wherein the second electrode and the first semiconductor layer overlap with each other with a first insulating layer therebetween, wherein the first conductor layer and the first semiconductor layer overlap with each other with a second insulating layer therebetween, wherein the first semiconductor layer is between the first insulating layer and the second insulating layer, wherein the fifth electrode and the second semiconductor layer overlap with each other with the first insulating layer therebetween, wherein the second conductor layer and the second semiconductor layer overlap with each other with the second insulating layer therebetween, and wherein the second semiconductor layer is between the first insulating layer and the second insulating layer.

6. The semiconductor device according to claim 5,
wherein the first voltage is a low power source voltage, and
wherein the second voltage is a high power source voltage.

7. The semiconductor device according to claim 5, wherein each of the first transistor and the second transistor has an off-state current of 10 aA/μm or less.

8. The semiconductor device according to claim 5,
wherein the first semiconductor layer is a first oxide semiconductor layer,
wherein the second semiconductor layer is a second oxide semiconductor layer, and
wherein each of the first oxide semiconductor layer and the second oxide semiconductor layer is an intrinsic semiconductor layer or a substantially intrinsic semiconductor layer.

9. The semiconductor device according to claim 8, wherein the first oxide semiconductor layer and the second oxide semiconductor layer comprise indium and zinc.

10. The semiconductor device circuit according to claim 8, wherein the first oxide semiconductor layer and the second oxide semiconductor layer are highly purified.

11. A semiconductor device comprising:
a first transistor comprising a first electrode, a second electrode, a third electrode, a first semiconductor layer serving as a first channel formation layer of the first transistor, and a first conductor layer;
a second transistor comprising a fourth electrode, a fifth electrode, a sixth electrode, a second semiconductor layer serving as a second channel formation layer of the second transistor, and a second conductor layer;
a third transistor comprising a seventh electrode; an eighth electrode, and a ninth electrode;
a fourth transistor comprising a tenth electrode, an eleventh electrode, and a twelfth electrode;

a capacitor comprising a thirteenth electrode and a fourteenth electrode;
a first wiring; and
a second wiring, wherein the third electrode of the first transistor, the fourth electrode of the second transistor, and the thirteenth electrode of the capacitor are electrically connected to each other, wherein the ninth electrode of the third transistor, the tenth electrode of the fourth transistor, and the fourteenth electrode of the capacitor are electrically connected to each other, wherein the first wiring is electrically connected to the second electrode of the first transistor, wherein the second wiring is electrically connected to the fifth electrode of the second transistor, wherein the second electrode and the first semiconductor layer overlap with each other with a first insulating layer therebetween, wherein the first conductor layer and the first semiconductor layer overlap with each other with a second insulating layer therebetween, wherein the first semiconductor layer is between the first insulating layer and the second insulating layer, wherein the fifth electrode and the second semiconductor layer overlap with each other and the first insulating layer therebetween, wherein the second conductor layer and the second semiconductor layer overlap with each other with the second insulating layer therebetween, wherein the second semiconductor layer is between the first insulating layer and the second insulating layer, wherein the third transistor is configured so that a first voltage is applied to the seventh electrode of the third transistor, wherein the fourth transistor is configured so that a second voltage is applied to the twelfth electrode of the fourth transistor, and wherein the second voltage is higher than the first voltage.

12. The semiconductor device according to claim 11, wherein each of the first transistor and the second transistor has an off-state current of 10 aA/μm or less.

13. The semiconductor device according to claim 11,
wherein the eighth electrode of the third transistor is electrically connected to the first wiring, and
wherein the eleventh electrode of the fourth transistor is electrically connected to the second wiring.

14. The semiconductor device according to claim 11,
wherein the eighth electrode of the third transistor is electrically connected to the second wiring, and
wherein the eleventh electrode of the fourth transistor is electrically connected to the first wiring.

15. The semiconductor device according to claim 11,
wherein the first wiring is configured so that a clock signal is input to the first wiring, and
wherein the second wiring is configured so that an inverted clock signal of the clock signal is input to the second wiring.

16. The semiconductor device according to claim 11,
wherein the first voltage is a low power source voltage, and
wherein the second voltage is a high power source voltage.

17. The semiconductor device according to claim 11,
wherein the first semiconductor layer is a first oxide semiconductor layer,
wherein the second semiconductor layer is a second oxide semiconductor layer, and wherein each of the first oxide semiconductor layer and the second oxide semiconductor layer is an intrinsic semiconductor layer or a substantially intrinsic semiconductor layer.

18. The semiconductor device according to claim 17, wherein the first oxide semiconductor layer and the second oxide semiconductor layer comprise indium and zinc.

19. The semiconductor device according to claim 17, wherein the first oxide semiconductor layer and the second oxide semiconductor layer are highly purified.

* * * * *